United States Patent
Ono et al.

(10) Patent No.: US 8,664,662 B2
(45) Date of Patent: *Mar. 4, 2014

(54) THIN-FILM TRANSISTOR ARRAY DEVICE, EL DISPLAY PANEL, EL DISPLAY DEVICE, THIN-FILM TRANSISTOR ARRAY DEVICE MANUFACTURING METHOD, EL DISPLAY PANEL MANUFACTURING METHOD

(75) Inventors: Shinya Ono, Osaka (JP); Arinobu Kanegae, Kyoto (JP); Genshirou Kawachi, Chiba (JP)

(73) Assignees: Panasonic Corporation, Osaka (JP); Panasonic Liquid Crystal Display Co., Ltd., Hyogo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/487,788

(22) Filed: Jun. 4, 2012

(65) Prior Publication Data

US 2013/0082270 A1 Apr. 4, 2013

Related U.S. Application Data

(63) Continuation of application No. PCT/JP2011/005534, filed on Sep. 30, 2011.

(51) Int. Cl.
*H01L 27/14* (2006.01)
(52) U.S. Cl.
USPC ............... 257/72; 257/E21.414; 257/E31.053
(58) Field of Classification Search
USPC ............ 257/72, E27.121, E21.414, E33.053; 438/34, 158
See application file for complete search history.

(56) References Cited

U.S. PATENT DOCUMENTS

| | | |
|---|---|---|
| 5,529,951 A | 6/1996 | Noguchi et al. |
| 5,869,803 A | 2/1999 | Noguchi et al. |
| 6,071,765 A | 6/2000 | Noguchi et al. |
| 6,703,992 B1 * | 3/2004 | Yamada ..................... 345/76 |
| 6,794,675 B1 | 9/2004 | Suzuki et al. |
| 7,126,272 B2 | 10/2006 | Matsumoto |
| 7,847,910 B2 | 12/2010 | Miyakawa et al. |
| 8,093,585 B2 | 1/2012 | Nishimura et al. |
| 2004/0051448 A1 | 3/2004 | Matsumoto |
| 2009/0016001 A1 | 1/2009 | Miyakawa et al. |
| 2009/0146930 A1 | 6/2009 | Nishimura et al. |
| 2010/0194719 A1 | 8/2010 | Saitoh et al. |

(Continued)

FOREIGN PATENT DOCUMENTS

| | | |
|---|---|---|
| JP | 7-235490 | 9/1995 |
| JP | 2000-276078 | 10/2000 |

(Continued)

*Primary Examiner* — Jarrett Stark
*Assistant Examiner* — Shahed Ahmed
(74) *Attorney, Agent, or Firm* — Greenblum & Bernstein, P.L.C.

(57) ABSTRACT

A thin-film transistor array includes first and second bottom-gate transistors, a passivation film, a conductive oxide film below the passivation film, and a relay electrode between a first conductive material in a same layer as a first electrode of the first transistor and a second conductive material in an electroluminescence layer. A first line is in a layer lower than the passivation film and a second line is above the passivation film. A terminal to which an external signal is input is provided in a periphery of the substrate in the same layer as the first electrode. The conductive oxide film covers an upper surface of the terminal and is between the relay electrode and the first conductive material. The relay electrode is formed in a same layer and comprises a same material as the second line.

20 Claims, 41 Drawing Sheets

(56) References Cited

U.S. PATENT DOCUMENTS

| | | |
|---|---|---|
| 2010/0320467 A1 | 12/2010 | Ukeda et al. |
| 2011/0297950 A1 | 12/2011 | Kato et al. |
| 2012/0074421 A1 | 3/2012 | Kanegae et al. |
| 2012/0074422 A1* | 3/2012 | Kanegae et al. ............ 257/72 |
| 2012/0231589 A1* | 9/2012 | Saito ............................ 438/158 |

FOREIGN PATENT DOCUMENTS

| | | |
|---|---|---|
| JP | 2004-111082 | 4/2004 |
| JP | 2006-106110 | 4/2006 |
| JP | 2009-20199 | 1/2009 |
| JP | 2009-69735 | 4/2009 |
| JP | 2009-128577 | 6/2009 |

* cited by examiner

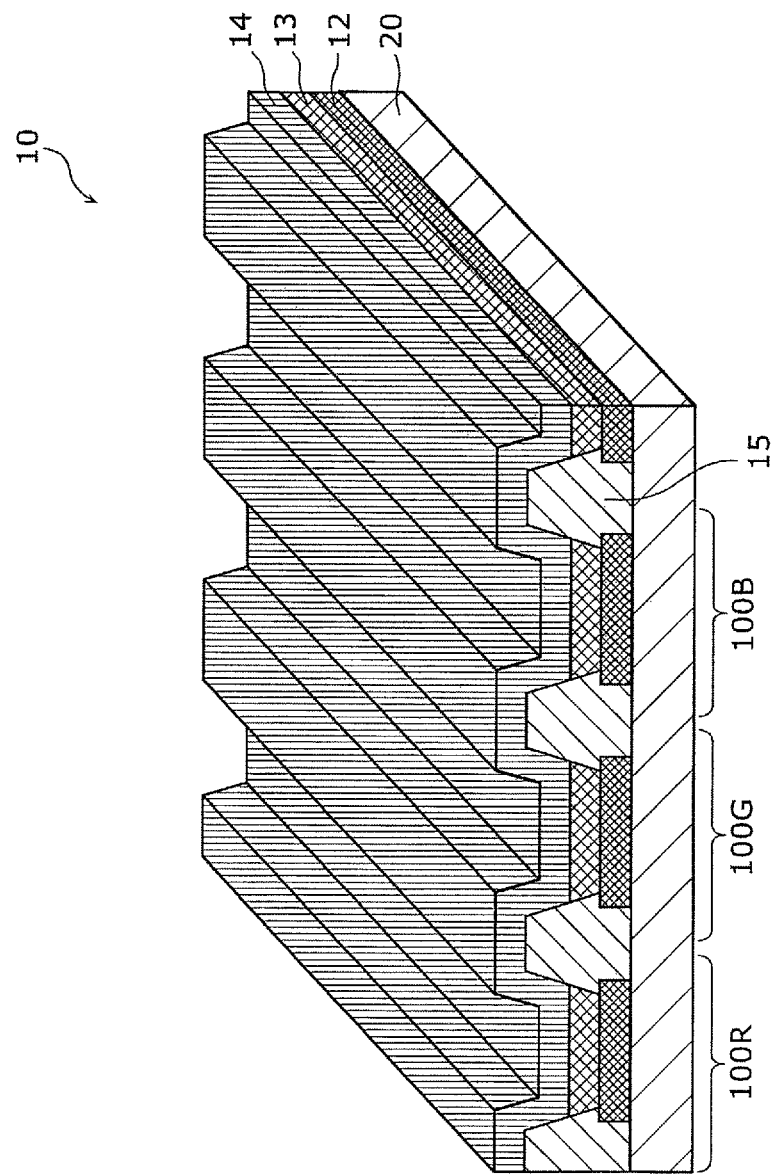

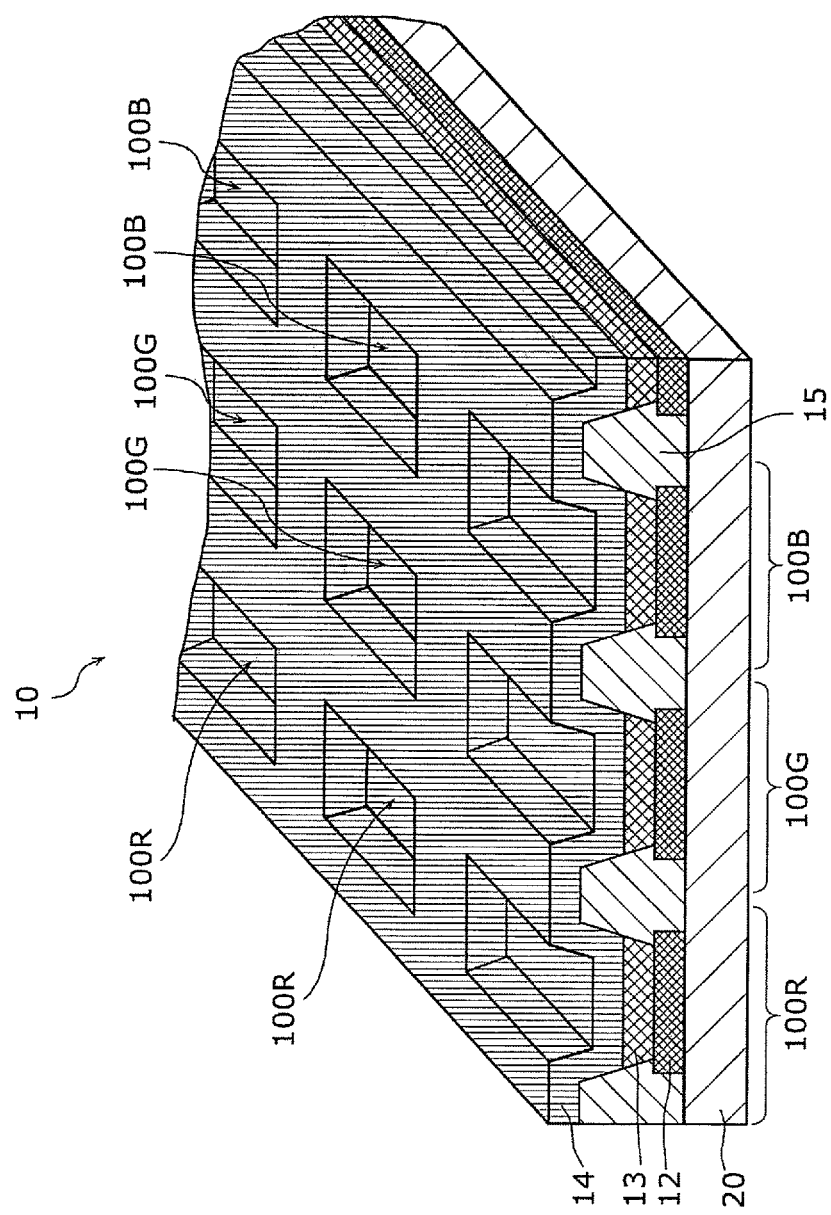

THIN-FILM TRANSISTOR ARRAY DEVICE, EL DISPLAY PANEL, EL DISPLAY DEVICE, THIN-FILM TRANSISTOR ARRAY DEVICE MANUFACTURING METHOD, EL DISPLAY PANEL MANUFACTURING METHOD

CROSS REFERENCE TO RELATED APPLICATION

This is a continuation application of PCT Application No. PCT/JP2011/005534, filed on Sep. 30, 2011, designating the United States of America, the disclosure of which, including the specification, drawings and claims, is incorporated herein by reference in its entirety.

BACKGROUND OF THE INVENTION

1. Field of the Invention

The present invention relates to a thin-film transistor array device for an image display device formed by stacking, on a substrate, a thin film transistor having polycrystalline silicon or microcrystalline silicon as an active layer, to an electroluminescence (EL) display panel and an EL display which use the thin-film transistor array device.

2. Description of the Related Art

Thin-film transistors are used in drive substrates of display devices such as an organic electroluminescence (EL) display and a liquid crystal display and, at present, development towards high-performance is being actively pursued. In particular, amid demands for high current-driven performance in thin-film transistors following the increase in size and change to high-definition of displays, thin-film transistors that use a crystallized semiconductor thin-film (polycrystalline silicon or microcrystalline silicon) in an active layer have been gaining attention.

A low-temperature process using a processing temperature of 600° C. or lower is being developed as a crystallization process of semiconductor thin-films, in place of the already-established high-temperature process technology that uses a processing temperature of 1000° C. or higher. The low-temperature process does not require the use of expensive substrates such as heat-resistant quartz, and thus manufacturing cost can be reduced.

As part of the low-temperature process, laser annealing, which heats by using a laser beam, has been gaining attention. This pertains to irradiating a laser beam onto a non-single crystal semiconductor thin-film of amorphous silicon or polycrystalline silicon formed on a low-heat-resistance insulation substrate such as glass so as to melt the semiconductor thin-film by localized heating, and subsequently crystallizing the semiconductor thin-film in a cooling process thereof. A thin-film transistor is formed by stacking in which the crystallized semiconductor thin-film serves as an active layer (channel region). Since mobility of carriers increases, the crystallized semiconductor thin-film allows for increased performance of the thin-film transistor (For example, Japanese Unexamined Patent Application Publication No. 07-235490).

Meanwhile, a bottom-gate structure in which the gate electrode is disposed below the semiconductor layer is the predominant thin-film transistor structure. A structure of a bottom-gate thin-film transistor 1000 shall be described with reference to FIG. 32 to FIG. 36.

As shown in FIG. 32 to FIG. 36, the thin-film transistor 1000 is a multilayered structure including a substrate 1010, a first metal layer 1020, a gate insulating film 1030, a semiconductor film 1040, a second metal layer 1050, and a passivation film 1060.

A gate line 1021 and a gate electrode 1022 running from the gate line 1021 are formed in the first metal layer 1020 that is stacked on of the substrate 1010. Furthermore, the gate insulating film 1030 is formed above the substrate 1010 and the first metal layer 1020 so as to cover the gate line 1021 and the gate electrode 1022. In addition, the semiconductor film 1040 is stacked on the gate insulating film 1030 so as to overlap with the gate electrode 1022.

A source line 1051, a source electrode 1052 running from the source line 1051, and a drain electrode 1053 are formed in the second metal layer 1050 which is stacked above the gate insulating film 1030 and semiconductor film 1040. It should be noted that the source electrode 1052 and the drain electrode 1053 are disposed at opposing positions, and each overlaps with a part of the semiconductor film 1040. Furthermore, the passivation film 1060 is stacked on the gate insulating film 1030, the semiconductor film 1040, and the second metal layer 1050 so as to cover the source line 1051, the source electrode 1052, and the drain electrode 1053.

In the bottom-gate thin-film transistor 1000 as described above, the gate line 1021 and the gate electrode 1022 are formed in the first metal layer 1020 which is a lower layer than the semiconductor film 1040. In other words, the gate line 1021 and the gate electrode 1022 are already formed during the laser crystallization process of the semiconductor film 1040. More specifically, the gate line 1021 and the gate electrode 1022 need to have high heat resistance capable of resisting the temperature (approximately 600° C.) in the laser crystallization process.

SUMMARY OF THE INVENTION

However, with regard to metals which are typically used as an electrode material, conductivity tends to deteriorate with metals having higher heat-resistance. Therefore, when a material having high heat-resistance is used as the material for the gate electrode 1022, and the gate line 1021 is formed from the same metal material in the same layer as the gate electrode 1022, the line resistance of the gate line 1021 becomes high. High line resistance becomes a cause for signal delay, display unevenness due to a voltage drop, and so on. In particular, the impact of line resistance increases when the panel area and the drive frequency increase.

Furthermore, as shown in FIG. 36, the gate line 1021 formed in the first metal layer 1020 and the source line 1051 formed in the second metal layer 1050 cross each other, with the approximately 200 nm-thick gate insulating film 1030 interposed in between. As such, when the thickness of the gate insulating film 1030 is to be reduced in order to increase the performance of the thin-film transistor 1000, the space between the gate line 1021 and the source line 1051 is further reduced, and thus there is the problem that parasitic capacitance between the lines increases.

In addition, the metal that is used in the electrodes and lines included in the thin-film transistor 1000 oxidizes due to contact with moisture in the air or an oxide film, and the like, included in the thin-film transistor 1000, and thus there is the possibility of causing the performance of the thin-film transistor 1000 to deteriorate.

The present invention is conceived to solve the above-describe problems and has as an object to provide a thin-film transistor array device in which the gate electrode and the gate line are formed using a material that is suitable to each one, and which reduces the parasitic capacitance between the gate line and the source line, and in addition, prevents metal oxidation.

A thin-film transistor array device according to an aspect of the present invention is stacked with an electroluminescence (EL) layer, with an interlayer insulating film interposed in between the electroluminescence layer and the thin-film transistor array device. The thin-film transistor array device includes: a substrate; a first line above the substrate; a second line crossing the first line; a first transistor above the substrate and including a gate electrode, a first electrode, and a second electrode; a second transistor above the substrate; a passivation film between the interlayer insulating film and both the first transistor and the second transistor; a conductive oxide film below the passivation film; and a relay electrode above the passivation film, the relay electrode being a relay between a first conductive material in a same layer as the first electrode and a second conductive material in the electroluminescence layer, the relay electrode being electrically connected to the first conductive material via a first hole in the passivation film. The first transistor and the second transistor are bottom gate transistors. The first line is below the passivation film and electrically connected to one of the gate electrode and the first electrode, the first line being in the same layer as the first electrode. The second line is above the passivation film and electrically connected to an other of the gate electrode and the first electrode, the second line being in a different layer than the first electrode. A terminal to which an external signal is input is in a periphery of the substrate and in the same layer as the first electrode, the external signal being for driving one of the first line and the second line. The conductive oxide film covers an upper surface of the terminal and is between the relay electrode and the first conductive material at least at a bottom of the first hole, the conductive oxide film electrically connecting the relay electrode and the first conductive material. The relay electrode is in a same layer as the second line above the passivation film and comprises a same material as the second line.

According to the present invention, it is possible to realize low resistance for the gate line while maintaining the heat-resistance of the gate electrode. Furthermore, even when the thickness of the gate insulating film is reduced in order to improve thin-film transistor characteristics, parasitic capacitance between the first line and the second line does not increase. In other words, it is possible to control image signal delays, and the like, caused by parasitic capacitance. In addition, by preventing oxidation of metal used in the respective electrodes and the respective lines, functional deterioration of the thin-film transistor array device can be prevented.

It should be noted that the "first electrode" refers to one of the source electrode and the drain electrode, and the "second electrode" refers to the other of the source electrode and the drain electrode. This is determined according to the type (P-type or N-type) of the first transistor and the voltage relationship between the "first electrode" and the "second electrode".

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 2B is a perspective view showing more specifically the multilayered structure in FIG. 2A, and is a diagram showing an example of a line bank;

FIG. 2C is a perspective view showing more specifically the multilayered structure in FIG. 2A, and is a diagram showing an example of a pixel bank;

DESCRIPTION OF THE PREFERRED EMBODIMENT(S)

Figure 1:
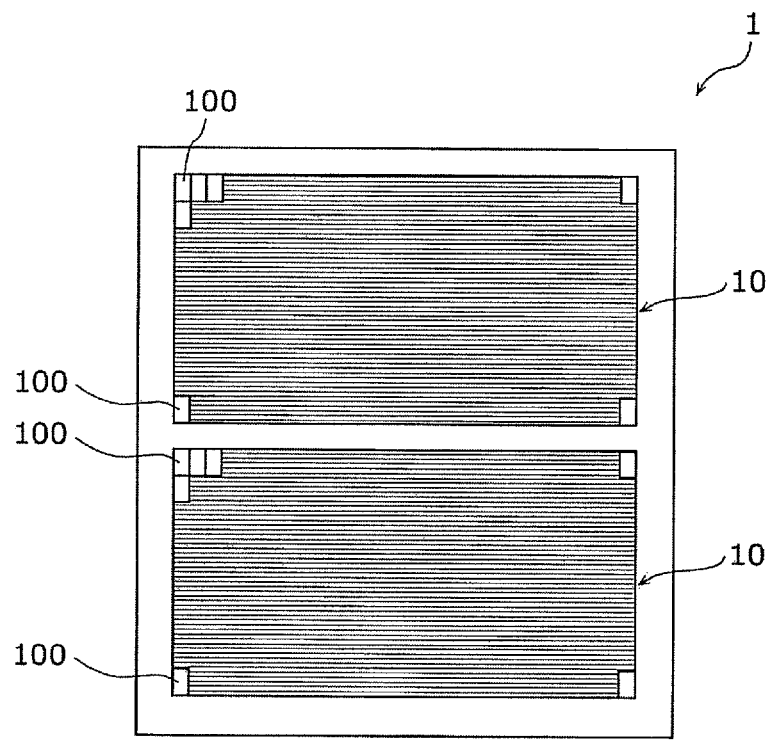
FIG. 1 is a diagram showing a thin-film semiconductor array substrate.

A thin-film transistor array device according to an aspect of the present invention is stacked with an electroluminescence (EL) layer, with an interlayer insulating film interposed between the electroluminescence layer and the thin-film transistor array device. The thin-film transistor array device includes: a substrate; a first line above the substrate; a second line crossing the first line; a first transistor above the substrate and including a gate electrode, a first electrode, and a second electrode; a second transistor above the substrate; a passivation film between the interlayer insulating film and both the first transistor and the second transistor; a conductive oxide film below the passivation film; and a relay electrode above the passivation film, the relay electrode being a relay between a first conductive material in a same layer as the first electrode and a second conductive material in the electroluminescence layer, the relay electrode being electrically connected to the first conductive material via a first hole in the passivation film. The first transistor and the second transistor are bottom gate transistors. The first line is below the passivation film and electrically connected to one of the gate electrode and the first electrode, the first line being in the same layer as the first electrode. The second line is above the passivation film and electrically connected to an other of the gate electrode and the first electrode, the second line being in a different layer than the first electrode. A terminal to which an external signal is input is in a periphery of the substrate and in the same layer as the first electrode, the external signal being for driving one of the first line and the second line. The conductive oxide film covers an upper surface of the terminal and is between the relay electrode and the first conductive material at least at a bottom of the first hole, the conductive oxide film electrically connecting the relay electrode and the first conductive material. The relay electrode is in a same layer as the second line above the passivation film and comprises a same material as the second line.

As an example, the first line may be electrically connected to the gate electrode, and the second line may be electrically connected to the first electrode.

As another example, the first line may be electrically connected to the first electrode, and the second line may be electrically connected to the gate electrode.

In the above-described thin-film transistor array device, one of the line electrically connected to the gate electrode and the line electrically connected to the first electrode is disposed in a layer that is lower than the passivation film, and the other of the line electrically connected to the gate electrode and the line electrically connected to the first electrode is disposed on the passivation film which is a different layer from the first electrode formed on the substrate. As such, the space between the first line and the second line corresponds to the thickness of the passivation film formed on the first electrode, and not to the space between the gate electrode and the first electrode. Here, since the passivation film protects the surface of the thin-film transistor array device, increasing the thickness of the passivation film does not affect the performance of the thin-film transistor device. As a result, by adjusting the thickness of the passivation film to ensure a distance between the first line and the second line, parasitic capacitance between the first line and the second line can be reduced.

Furthermore, a periphery of the substrate which is in the same layer as the first electrode can be exposed from an opening provided in the passivation film, and used as a terminal which is a connection with a gate driving circuit or a source driving circuit (or a drain driving circuit) outside the device. In this case, the exposed terminal comes into contact with air or moisture in air and easily becomes oxidized. When oxidized, the oxidized terminal and the outside driver circuit become electrically connected via an oxidized layer having high electrical resistance, and thus there is the problem that the connection resistance between the terminal and the outside driver circuit becomes high.

Thus, in the thin-film transistor array device having the above-described configuration, the conductive oxide film is stacked on the passivation film, and the region (upper surface) of the terminal that is exposed is covered by the conductive oxide film. With this, the conductive oxide film can prevent the oxidation of the exposed terminal. As a result, the connection resistance between the terminal and the outside driver circuit can be kept low over a long period of time.

As described above, when the conductive oxide film (Indium Tin Oxide: ITO) is stacked on the passivation film, the conductive oxide film becomes interposed between the first conductive material, which is in the same layer as the first electrode, and the second conductive material included in the EL layer, and thus causing the problem of the second conductive material oxidizing due to the conductive oxide film. In response to this, according to the above described configuration, a relay electrode is formed at a region on the passivation film, which overlaps with the first conductive material, and the relay electrode is made to act as a relay between the first and second conductive materials. Furthermore, the conductive oxide film is interposed between the relay electrode and the first conductive material. With this, the relay electrode is present between the second conductive material and the conductive oxide film, and thus oxidation of the second conductive material due to the conductive oxide film can be prevented.

In addition, the relay electrode is formed in the same layer as the second line on the passivation film, and comprises the same material as the second line. In this manner, by disposing the second line on the passivation film, the relay electrode can be formed in the same layer as the second line, and using the same material as the second line. As such, the formation of the second line and the formation of the relay electrode can be performed in the same process. As a result, a simple configuration can prevent the oxidation of the second conductive material due to the conductive oxide film, while reducing the parasitic capacitance between the first and second lines.

Furthermore, the second conductive material may be a metal primarily comprising aluminum. With this, the relay electrode is present between the second conductive material and the conductive oxide film, and thus oxidation of the second conductive material due to the conductive oxide film can be prevented even when a metal primarily comprising aluminum is adopted for the second conductive material.

Furthermore, the relay electrode may include a surface that is in contact with the conductive oxide film and comprises a metal that includes at least one of copper, molybdenum, titanium, and tungsten.

Furthermore, the relay electrode may include a multilayered structure.

Furthermore, the interlayer insulating film may include an organic film layer and an inorganic film layer. In addition, the inorganic film layer may cover the second line and the relay electrode.

Furthermore, the first transistor and the second transistor may each include a crystalline semiconductor layer. In addition, the gate electrode of the first transistor and a second gate electrode of the second transistor may comprise a first metal having higher heat-resistance than a second metal of the one of the first line and the second line (that is, the gate line) that is electrically connected to the gate electrode.

According to the above-described configuration, a semiconductor layer included in each of the first transistor and the second transistor may be a crystalline semiconductor layer. In this case, in order to form the semiconductor layer as a crystalline semiconductor layer, it is necessary to crystallize the amorphous semiconductor layer by raising the temperature of the amorphous semiconductor layer to within a range of between 1100° C. and 1414° C., inclusive, by irradiating a laser onto the amorphous semiconductor layer. In the bottom-gate thin-film transistor array device, first, the gate electrode is formed on the substrate, after which the semiconductor layer is formed. Therefore, when the amorphous semiconductor layer is to be crystallized using such a high-heat processing as described above, the heat-resistance of the metal making up the gate electrode needs to be high. Meanwhile, since a metal having high heat-resistance also has high resistance, forming the gate electrode and the gate line using the same material means that the gate line is also formed from a metal having high resistance, and thus there is the problem that the resistance of the gate line becomes high.

However, according to the thin-film transistor array device having the above-described configuration, forming the gate electrode and the gate line in different layers allows for the selection of different materials for the gate electrode and the gate line. With this, it is possible to lower the resistance of the gate line by selecting a low-resistance metal for the metal making up the gate line, while increasing the heat-resistance of the metal making up the gate electrode.

Furthermore, the metal (the first metal) having higher heat-resistance than the metal used for the line that is electrically connected to the gate electrode may be a metal which includes one of molybdenum, tungsten, titanium, tantalum, and nickel.

Furthermore, the conductive oxide film may comprise indium and one of tin and zinc.

An electroluminescence (EL) display panel according to an aspect of the present invention includes: an upper electrode; a lower electrode; an electroluminescence layer including an electroluminescence light-emitting element that includes a light-emitting function layer between the upper electrode and the lower electrode; a thin-film transistor array device for controlling the electroluminescence light-emitting element; and an interlayer insulating film between the electroluminescence layer and the thin-film transistor array device. The thin-film transistor array device includes: a substrate; a first line above the substrate; a second line crossing the first line; a first transistor above the substrate and including a gate electrode, a first electrode, and a second electrode; a second transistor above the substrate; a passivation film between the interlayer insulating film and both the first transistor and the second transistor; a conductive oxide film below the passivation film; and a relay electrode above the passivation film, the relay electrode being a relay between a first conductive material in a same layer as the first electrode and a second conductive material in the electroluminescence layer, the relay electrode being electrically connected to the first conductive material via a first hole in the passivation film. The first transistor and the second transistor are bottom gate transistors. The first line is below the passivation film and electrically connected to one of the gate electrode and the first electrode, the first line being in the same layer as the first electrode. The second line is above the passivation film and electrically connected to an other of the gate electrode and the first electrode, the second line being in a different layer than the first electrode. A terminal to which an external signal is input is in a periphery of the substrate and in the same layer as the first electrode, the external signal being for driving one of the first line and the second line. The conductive oxide film covers an end part of an upper surface of the terminal and is between the relay electrode and the first conductive material at least at a bottom of the first hole, the conductive oxide film electrically connecting the relay electrode and the first conductive material. The relay electrode is in a same layer as the second line above the passivation film and comprises a same material as the second line.

In an EL display panel, the margin for driving the display panel decreases as the size of the display panel increases to 20 inches, 30 inches, 40 inches, and so on, because of the delay in gate signals caused by the thin-film transistor array device which controls the light-emission of the EL element unit of the display panel.

Under these circumstances, using the thin-film transistor array device having the above-described configuration allows for the reduction of the parasitic capacitance between the first and second lines even in a large-screen EL display panel, and thus making it possible to realize an EL display panel with reduced gate signal delay and gate signal waveform dulling, and therefore making it possible to realize an EL display panel having excellent video resolution by causing high frame frequency operation. Furthermore, since the electrical connection between the thin-film transistor array device and the EL element can have low resistance over a long period of time, it is possible to realize an EL panel having a long operating life and high light-emission luminance with low power consumption without reducing the light-emission current of the EL element. As a result, a simple configuration can prevent the oxidation of the second conductive material due to the conductive oxide film, while reducing the parasitic capacitance between the first and second lines.

Furthermore, the second conductive material may be a metal primarily comprising aluminum.

Furthermore, the second conductive material and the relay electrode are connected in a flat region extending along a circumference of an upper part of a second hole in the interlayer insulating film.

An electroluminescence (EL) display device according to an aspect of the present invention includes the above-described electroluminescence (EL) display panel.

By including the above described EL display panel, it is possible to realize an EL display device capable of displaying images with high picture quality, without image signal deterioration.

A method of manufacturing a thin-film transistor array device that is stacked with an electroluminescence (EL) layer, with an interlayer insulating film interposed between the electroluminescence layer and the thin-film transistor array device, according to an aspect of the present invention includes: preparing a substrate; forming a first line above the substrate; forming a first transistor and a second transistor above the substrate, the first transistor including a gate electrode, a first electrode, and a second electrode; forming a conductive oxide film above the first transistor and the second transistor; forming a passivation film above the conductive oxide film; and forming a second line and a relay electrode above the passivation film, the second line crossing the first line, the relay electrode being a relay between a first conductive material in a same layer as the first electrode and a second conductive material in the electroluminescence layer, the relay electrode being electrically connected to the first conductive material via a first hole in the passivation film. The first transistor and the second transistor are bottom gate transistors. The first line is below the passivation film and electrically connected to one of the gate electrode and the first electrode, the first line being in the same layer as the first electrode. The second line is above the passivation film and electrically connected to an other of the gate electrode and the first electrode, the second line being in a different layer than the first electrode. In the forming of a first transistor, a second transistor, and a conductive oxide film, the conductive oxide film is formed to cover an upper surface of a terminal in the same layer as the first electrode, an external signal being input to the terminal, the external signal being for driving one of the first line and the second line. In the forming of a passivation film, the upper surface of the terminal that is covered by the conductive oxide film is exposed from an opening in the passivation film. The conductive oxide film is between the relay electrode and the first conductive material at least at a bottom of the first hole to electrically connect the relay electrode and the first conductive material. In the forming of a second line and a relay electrode, the relay electrode is formed in a same layer as the second line above the passivation film and comprises a same material as the second line.

Furthermore, the second conductive material may be a metal primarily comprising aluminum.

Furthermore, the relay electrode may include a surface that is in contact with the conductive oxide film and comprises a metal that includes at least one of copper, molybdenum, titanium, and tungsten.

Furthermore, the first transistor and the second transistor may each include a crystalline semiconductor layer. In addition, the gate electrode of the first transistor and a second gate electrode of the second transistor may comprise a first metal having higher heat-resistance than a second metal used for the one of the first line and the second line that is electrically connected to the gate electrode of the first transistor.

According to the above-described manufacturing method, forming the gate electrode and the gate line in different layers allows for the selection of different materials for the gate electrode and the gate line. With this, it is possible to lower the resistance of the gate line by selecting a low-resistance metal for the metal making up the gate line, while increasing the heat-resistance of the metal making up the gate electrode. As a result, it becomes possible to form a semiconductor layer having high mobility, and a gate line having low resistance can be formed.

Furthermore, the conductive oxide film may comprise indium and one of tin and zinc.

A method of manufacturing an electroluminescence (EL) display panel according to an aspect of the present invention includes: preparing a substrate; forming a first line above the substrate; forming a first transistor and a second transistor above the substrate, the first transistor including a gate electrode, a first electrode, and a second electrode; forming a conductive oxide film above the first transistor and the second transistor; forming a passivation film above the conductive oxide film; forming a second line and a relay electrode above the passivation film, the second line crossing the first line, the relay electrode being electrically connected to the first conductive material, provided in a same layer as the first electrode, via a first hole in the passivation film; forming an interlayer insulating film above the passivation film; forming a lower electrode above the interlayer insulating film; forming a light-emitting function layer above the lower electrode; and forming an upper electrode above the light-emitting function layer. The relay electrode is a relay between the first conductive material and a second conductive material formed above the interlayer insulation film. The first transistor and the second transistor are bottom gate transistors. The first line is below the passivation film and electrically connected to one of the gate electrode and the first electrode, the first line being in the same layer as the first electrode. The second line is above the passivation film and electrically connected to an other of the gate electrode and the first electrode, the second line being in a different layer than the first electrode. In the forming of a first transistor, a second transistor, and a conductive oxide film, the conductive oxide film is formed to cover an upper surface of a terminal in the same layer as the first electrode, an external signal being input to the terminal, the external signal being for driving the first line or the second line. In the forming of a passivation film, the upper surface of the terminal that is covered by the conductive oxide film is exposed from an opening in the passivation film. The conductive oxide film is between the relay electrode and the first conductive material at least at a bottom of the first hole to electrically connect the relay electrode and the first conductive material. In the forming of a second line and a relay electrode, the relay electrode is formed in a same layer as the second line above the passivation film and comprises a same material as the second line.

Hereinafter, an embodiment of the present invention shall be described in detail with reference to the Drawings.

Embodiment 1

Figure 2A:
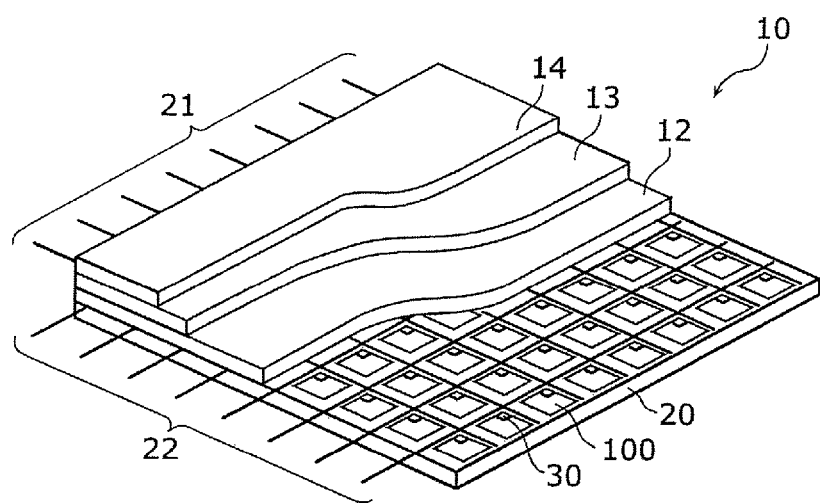
FIG. 2A is a perspective view of an organic EL display according to Embodiment 1.
Figure 3:
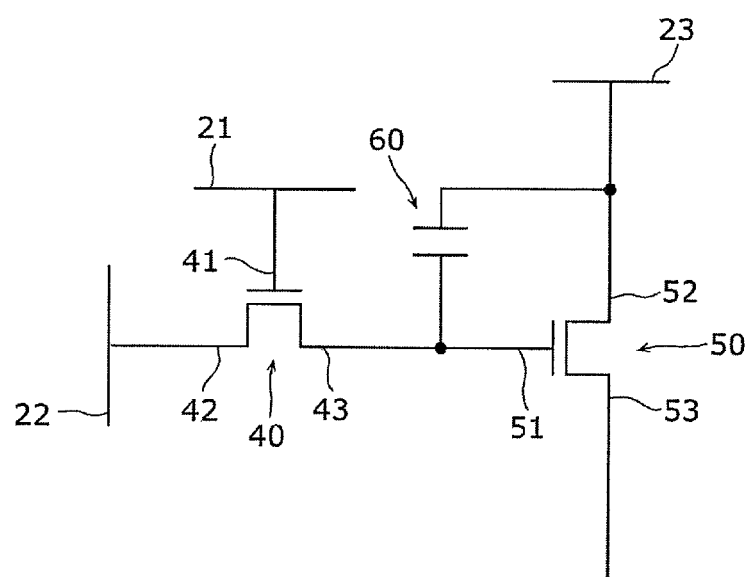
FIG. 3 is a diagram showing a circuit configuration of a pixel circuit.

An organic electroluminescence (EL) display (organic EL display panel) 10 and a thin-film transistor array device for use in an image display device (hereinafter denoted simply as "thin-film transistor array device") 20 shall be described with reference to FIG. 1 to FIG. 3. It should be noted that FIG. 1 is a diagram showing a thin-film semiconductor array substrate 1. FIG. 2A is a perspective view of the organic EL display 10 which is an example of a display device according to Embodiment 1 of the present invention. FIG. 2B is a perspective view showing more specifically the multilayered structure in FIG. 2A, and is a diagram showing an example of a line bank. FIG. 2C is a perspective view showing more specifically the multilayered structure in FIG. 2A, and is a diagram showing an example of a pixel bank. FIG. 3 is a diagram showing a circuit configuration of a pixel circuit 30 which drives a pixel 100.

First, as shown in FIG. 1, the thin-film semiconductor array substrate 1 includes plural (2 in FIG. 1) organic EL displays 10. Furthermore, as shown in FIG. 2A, each of the organic EL displays 10 is a multilayered structure of, from the lowest layer, the thin-film transistor array device 20, an interlayer insulating film (planarizing film) 11 (not illustrated in FIG. 2A), an anode (lower electrode) 12, an organic EL layer (organic light-emitting layer) 13, and a transparent cathode (upper electrode) 14. Furthermore, a hole transport layer (not illustrated) is stacked between the anode 12 and the organic EL layer 13, and an electron transport layer (not illustrated) is stacked between the organic EL layer 13 and the transparent cathode 14.

The pixels 100 are arranged in rows and columns (a matrix) in the thin-film transistor array device 20. Each of the pixels 100 is driven by the pixel circuit 30 that is provided thereto. Furthermore, the thin-film transistor array device 20 includes: plural gate lines 21 which are arranged in rows; plural source lines (signal lines) 22 which are arranged in columns so as to cross the gate lines 21; and plural power lines 23 (not illustrated in FIG. 2A) which run parallel to the source lines 22.

For each row, one of the gate lines 21 is connected to respective gate electrodes 41 (not illustrated in FIG. 2A) of thin-film transistors each of which operates as a switching element included in the respective pixel circuits 30 in that row. For each column, one of the source lines 22 is connected to respective source electrodes 42 (not illustrated in FIG. 2A) of the thin-film transistors each of which operates as a switching element included in the respective pixel circuits 30 in that column. For each column, one of the power lines 23 is connected to respective drain electrodes 52 (not illustrated in FIG. 2A) of the thin-film transistors each of which operates as a switching element included in the respective pixel circuits 30 in that column.

More specifically, as shown in FIG. 2B and FIG. 2C, each of the pixels 100 of the organic EL display 10 includes subpixels 100R, 100G, and 100B of three colors (red color, green color, and blue color). Plural subpixels 100R, subpixels 100G, and subpixels 100B are respectively lined up in the depth direction in FIG. 2B (this is denoted as a "subpixel column").

FIG. 2B is a diagram showing an example of a line bank, and the respective subpixel columns are separated from each other by banks 15. Each of the banks 15 shown in FIG. 2B is a protrusion running in a parallel direction to the source lines 22, between adjacent subpixel columns, and is formed on the thin-film transistor array device 20. Stated differently, each of the subpixel columns is formed in between adjacent protrusions (that is, in the openings formed by the banks 15).

The anode 12 is formed, for each of the subpixels 100R, 100G, and 100B, on the thin-film transistor array device 20 (more specifically, on the interlayer insulating film 11), inside the openings formed by the banks 15. The organic EL layer 13 is formed on the anodes 12 and inside the openings formed by the banks 15, for each subpixel column (that is, so as to cover the anodes 12 in each of the columns). The transparent cathode 14 is formed continuously on the organic EL layers 13 and the banks 15 (protrusions) so as to cover all of the subpixels 100R, 100G, and 100B.

On the other hand, FIG. 2C is a diagram showing an example of a pixel bank, and shows the respective subpixels 100R, 100G, and 100B being separated from each other by the banks 15. The banks 15 shown in FIG. 2C are formed such that protrusions running parallel to the gate lines 21 and protrusions running parallel to the source lines 22 cross each other. In addition, the subpixels 100R, 100G, and 100B are formed in the parts surrounded by these protrusions (that is, in the openings formed by the banks 15).

The anode 12 is formed, for each of the subpixels 100R, 100G, and 100B, on the thin-film transistor array device 20 (more specifically, on the interlayer insulating film 11), inside the openings formed by the banks 15. In the same manner, the organic EL layer 13 is formed on the anodes 12 and inside the openings formed by the banks 15, for each subpixel column. The transparent cathode 14 is formed continuously on the organic EL layers 13 and the banks 15 (protrusions) so as to cover all of the subpixels 100R, 100G, and 100B.

Figure 7:
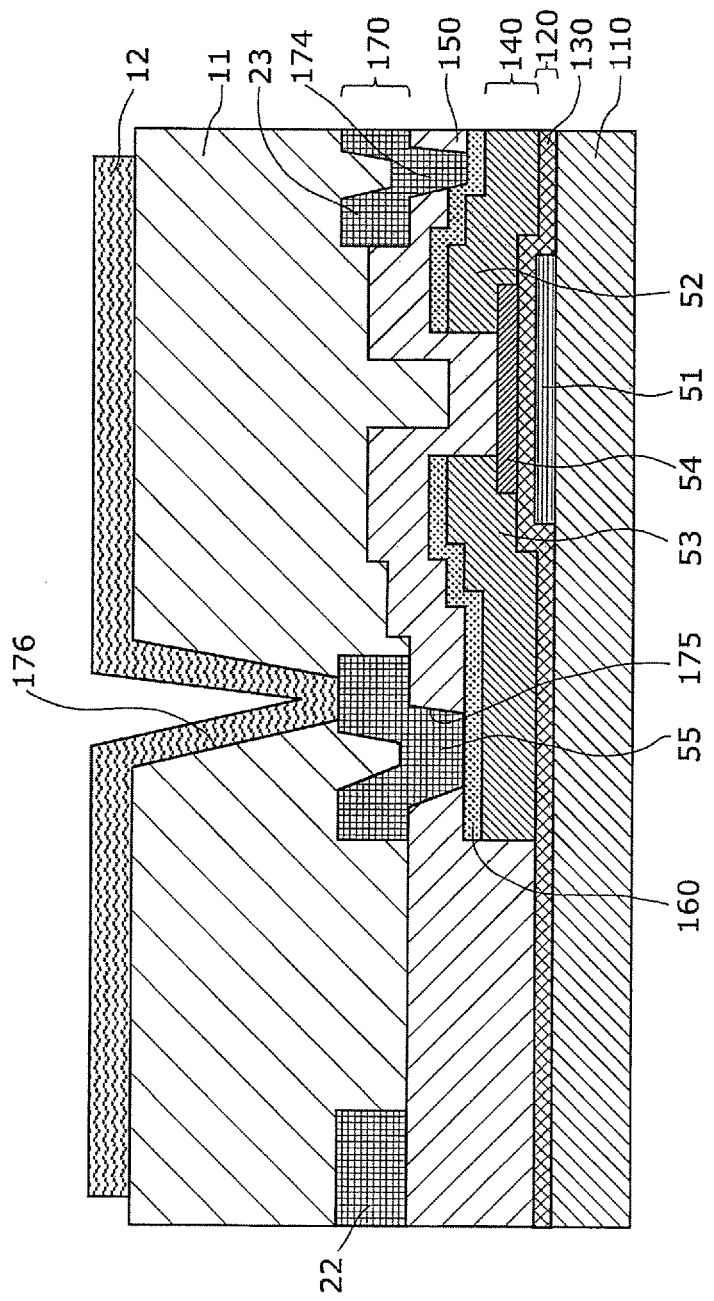
FIG. 7 is a cross-sectional view along VII-VII in FIG. 4.

In addition, although not illustrated in FIG. 2B and FIG. 2C, the pixel circuit 30 is formed, for each of the subpixels 100R, 100G, and 100B, in the thin-film transistor array device 20. In addition, as shown in FIG. 7, each of the subpixels 100R, 100G, and 100B is electrically connected to the corresponding pixel circuit 30 via a relay electrode 55.

It should be noted that, except for the difference in the characteristics (color of emitted light) of the organic EL layers 13, the subpixels 100R, 100G, and 100B have the same configuration. With that, in the subsequent description, the subpixels 100R, 100G, and 100B shall not be differentiated and all will be denoted as the "pixel 100". Furthermore, the present invention can be applied in the same manner in the line bank shown in FIG. 2B and in the pixel bank shown in FIG. 2C.

As shown in FIG. 3, the pixel circuit 30 includes a first transistor 40 which operates as a switch element; a second transistor 50 which operates as a drive element; and a capacitor 60 which stores data to be displayed in the corresponding pixel.

The first transistor 40 includes: a gate electrode 41 connected to the gate line 21; a source electrode 42 connected to the source line 22; a drain electrode 43 connected to the capacitor 60 and the gate electrode 51 of the transistor 50; and a semiconductor film 44 (not illustrated in FIG. 3). When voltage is applied to the gate line 21 and the source line 22 to which the first transistor 40 is connected, the first transistor 40 stores the voltage value applied to the source line 22, as display data, in the capacitor 60.

The second transistor 50 includes: the gate electrode 51 connected to the drain 43 of the first transistor 40; a drain electrode 52 connected to the power line 23 and the capacitor 60; a source electrode 53 connected to the anode 12; and a semiconductor film 54 (not illustrated in FIG. 3). The second transistor 50 supplies a current corresponding to the voltage value held by the capacitor 60, from the power line 23 to the anode 12, through the source electrode 53.

Specifically, the organic EL display 10 having the above-described configuration adopts the active matrix method in which display control is performed for each pixel 100 located at respective crosspoints of the gate lines 21 and source lines 22.

Figure 4:
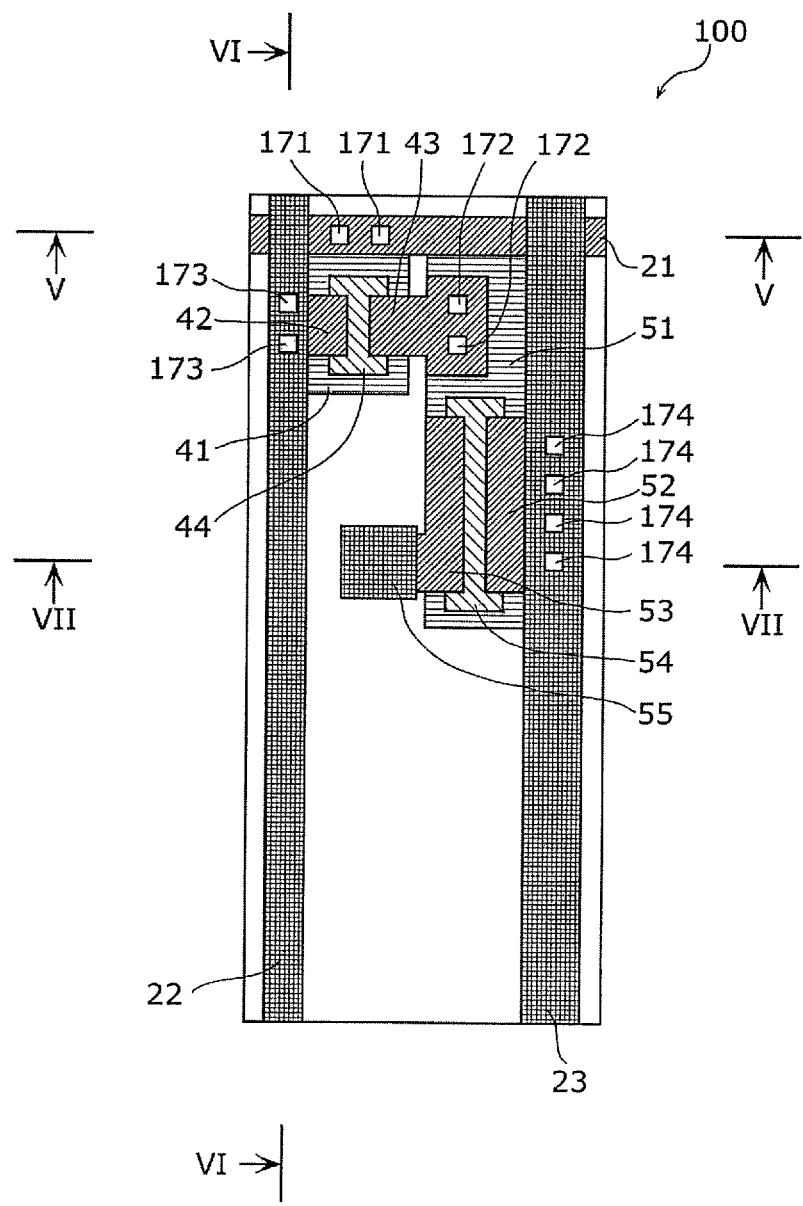
FIG. 4 is a front view showing a configuration of a pixel according to Embodiment 1.
Figure 5:
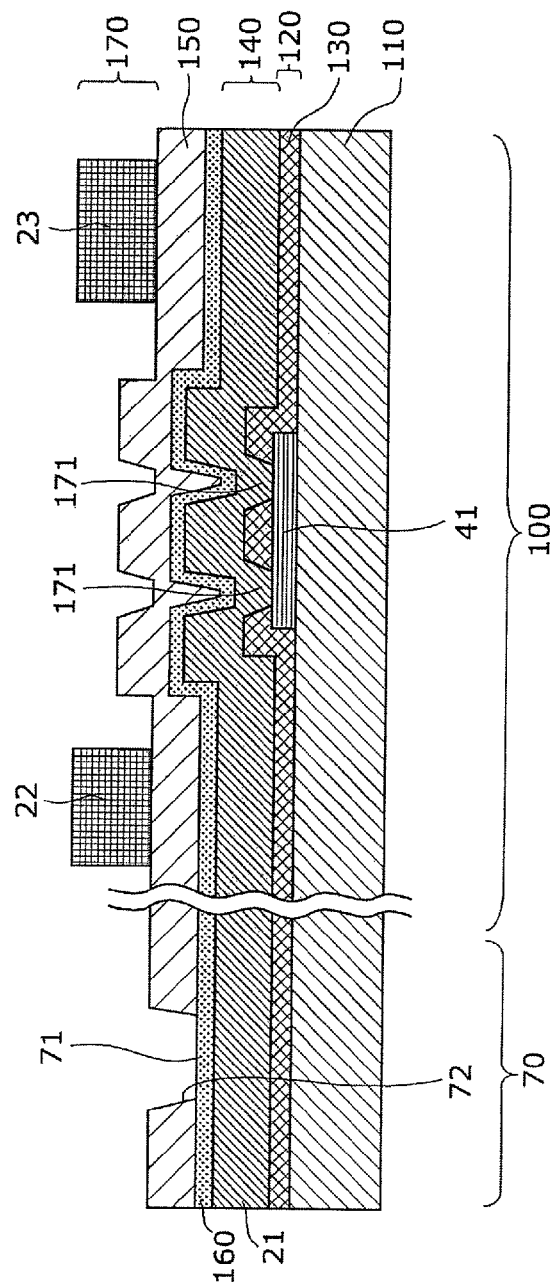
FIG. 5 is a cross-sectional view along V-V in FIG. 4.
Figure 6:
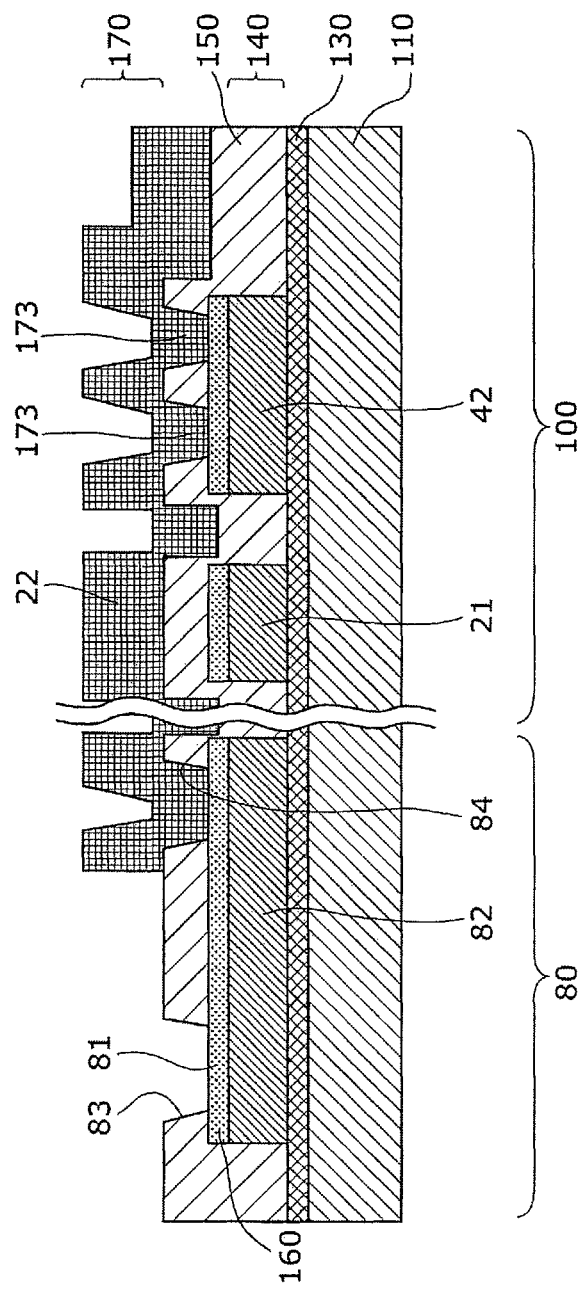
FIG. 6 is a cross-sectional view along VI-VI in FIG. 4.
Figure 8:
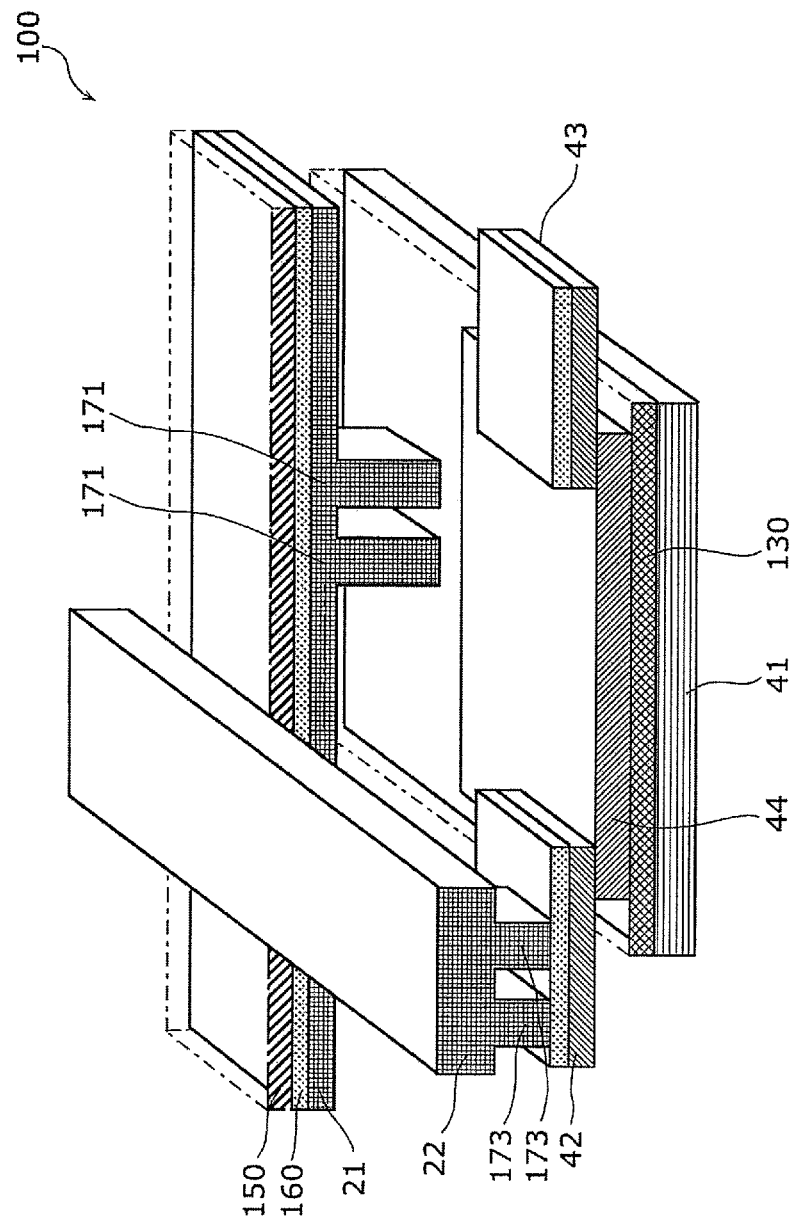
FIG. 8 is a perspective view of main parts as seen from the cross-section along V-V in FIG. 4.

Next, the structure (the structure to the right of the break lines in FIG. 5 and FIG. 6) of the pixels 100 included in the thin-film transistor array device 20 shall be described with reference to FIG. 4 to FIG. 8. It should be noted that FIG. 4 is a front view showing the configuration of a pixel 100. FIG. 5 is a cross-sectional view along V-V in FIG. 4. FIG. 6 is a cross-sectional view along VI-VI in FIG. 4. FIG. 7 is a cross-sectional view along VII-VII in FIG. 4. FIG. 8 is a perspective view of main parts as seen from the cross-section along V-V in FIG. 4. It should be noted that the interlayer insulating film 11 and the anode 12 are also illustrated in FIG. 7.

As shown in FIG. 4 to FIG. 7, the pixel 100 is a multilayered structure including a substrate 110, a first metal layer (conductive layer) 120, a gate insulating film 130, the semiconductor films 44 and 54, a second metal layer (conductive layer) 140, a conductive oxide film (Indium Tin Oxide: ITO) 160, a passivation film 150, and a third metal layer (conductive layer) 170.

The gate electrode 41 of the first transistor 40 and the gate electrode 51 of the second transistor 50 are formed in the first metal layer 120 which is stacked on the substrate 110. Furthermore, the gate insulating film 130 is formed on the substrate 110 and the first metal layer 120 so as to cover the gate electrodes 41 and 51.

The semiconductor film 44 is disposed inside a region which is on the gate insulating film 130 (between the gate insulating film 130 and the second metal layer 140) and overlaps with the gate electrode 41. In the same manner, the semiconductor film 54 is disposed inside a region which is on the gate insulating film 130 (between the gate insulating film 130 and the second metal layer 140) and overlaps with the gate electrode 51. It should be noted that "overlaps" in the present Specification refers to a positional relationship in which one lies on top of the other as seen from the vertical direction.

The gate line 21, the source electrode 42 and drain electrode 43 of the first transistor 40, and the drain electrode 52 and source electrode 53 of the second transistor 50 are formed in the second metal layer 140 stacked on the gate insulating film 130 and the semiconductor films 44 and 54. Specifically, the first transistor 40 and the second transistor 50 are bottom-gate transistors in which the gate electrodes 41 and 51 are formed in a layer lower than that of the source electrodes 42 and 53 and the drain electrodes 43 and 52, respectively.

More specifically, the source electrode 42 and the drain electrode 43 are formed at opposing positions, and each overlaps with a part of the semiconductor film 44. In the same manner, the drain electrode 52 and the source electrode 53 are formed at opposing positions, and each overlaps with a part of the semiconductor film 54.

Furthermore, first contact holes (holes) 171 are formed in the gate insulating film 130, penetrating in the thickness direction at positions that overlap with the gate line 21 and the gate electrode 41. In addition, the gate line 21 is electrically connected to the gate electrode 41 formed in the first metal layer 120, via the first contact holes 171.

Furthermore, second contact holes (holes) 172 are formed in the gate insulating film 130, penetrating in the thickness direction at positions that overlap with the drain electrode 43 and the gate electrode 51. In addition, the drain electrode 43 is electrically connected to the gate electrode 51 formed in the first metal layer 120, via the second contact holes 172.

Furthermore, the conductive oxide film 160 is formed on the gate insulating film 130 and the second metal layer 140 so as to cover the source electrodes 42 and 53 and the drain electrodes 43 and 52. In other words, the conductive oxide film 160 is formed to interpose between (i) the passivation film 150 and (ii) the first transistor 40 and second transistor 50. Furthermore, the conductive oxide film 160 is selectively formed at positions overlapping with the source electrodes 42 and 53, the drain electrodes 43 and 52, and so on (that is, the respective constituent elements of the second metal layer 140).

The passivation film 150 is stacked on the conductive oxide film 160. In addition, the third metal layer 170 is stacked on the passivation film 150. The source line 22, the power line 23, and the relay electrode 55 are formed in the third metal layer 170 which is stacked on the passivation film 150.

Furthermore, a third contact hole (hole) 173 is formed in the passivation film 150, penetrating in the thickness direction at a position that overlaps with the source line 22 and the source electrode 42. In addition, the source line 22 is electrically connected to the source electrode 42 formed in the second metal layer 140, via the third contact hole 173. It should be noted that the source line 22 and the source electrode 42 are not in direct contact, and that the conductive oxide film 160 is interposed in between.

Furthermore, a fourth contact hole (hole) 174 is formed in the passivation film 150, penetrating in the thickness direction at a position that overlaps with the power line 23 and the drain electrode 52. In addition, the power line 23 is electrically connected to the drain electrode 52 formed in the second metal layer 140, via the fourth contact hole 174. It should be noted that the power line 23 and the drain electrode 52 are not in direct contact, and that the conductive oxide film 160 is interposed in between.

In addition, a fifth contact hole (hole) 175 is formed in the passivation film 150, penetrating in the thickness direction at a position that overlaps with the drain electrode 52 of the second transistor 50 and the relay electrode 55. In addition, the relay electrode 55 is electrically connected to the source electrode 53 formed in the second metal layer 140, via the fifth contact hole 175. It should be noted that the source electrode 53 and the relay electrode 55 are not in direct contact, and that the conductive oxide film 160 is interposed in between.

In addition, the interlayer insulating film 11 is formed on the passivation film 150 and the third metal layer 170 so as to cover the source line 22, the power line 23, and the relay electrode 55. The banks 15 are formed on the interlayer insulating film 11 in the boundaries with the adjacent pixels 100. Moreover, the anode 12 which is formed on a per pixel 100 basis and the organic EL layer 13 which is formed on a per color (sub pixel column) basis or subpixel basis are formed in the opening formed by the banks 15. In addition, the transparent cathode 14 is formed on the organic EL layer 13 and the banks 15.

In addition, a sixth contact hole (hole) 176 is formed at a position that overlaps with the anode 12 and the relay electrode 55, and penetrating through the interlayer insulating film 11 in the thickness direction. Furthermore, the anode 12 is electrically connected to the relay electrode 55 formed in the third metal layer 170, via the sixth contact hole 176. It should be noted that the relay electrode 55 shown in FIG. 7 is configured of a center region that fills the fifth contact hole 175 and a flat region running along the circumference of an upper part of the fifth contact hole 175. In addition, the anode 12 is electrically connected at the flat region of the relay electrode 55.

As shown in FIG. 8, in the pixel 100 having the above-described configuration, the gate line 21 is formed in the second metal layer 140 which is a lower layer than the passivation film 150. On the other hand, the source line 22 and the power line 23 are formed in the third metal layer 170 which is a different layer from the gate line 21. In addition, the gate line 21 and the source line 22 cross each other and the gate line 21 and the power line 23 cross each other, with the passivation film 150 and the conductive oxide film 160 interposed in between.

As in the above described configuration, providing the respective lines (gate line 21, source line 22, and power line 23) in a metal layer (second metal layer 140 and third metal layer 170) above the first metal layer 120 in which the gate electrodes 41 and 51 are formed allows the gate electrodes 41 and 51 and the respective lines to be formed from a material that is suitable to each one. Furthermore, compared to the gate insulating film 130, the thickness of the passivation film 150 can be set freely. With that, parasitic capacitance can be reduced by placing the respective lines in the second metal layer 140 and the third metal layer 170 which are adjacent in the stacking direction, with the passivation film 150 disposed between the second and third metal layers.

Next, the structure (the structure to the left of the break lines in FIG. 5 and FIG. 6) of terminal-parts 70 and 80 formed at the ends (periphery) of the thin-film transistor array device 20 shall be described with reference to FIG. 5 and FIG. 6.

The terminal-part (the part to the left of the break lines) 70 shown in FIG. 5 is formed at two places, namely, at both ends of the pixels 100 which continue in the row direction. A terminal 71 is formed in each of the terminal-parts 70 by covering the upper surface of the gate line 21 with the conductive oxide film 160. In addition, the terminal 71 is exposed to the outside through a hole 72 penetrating through the passivation film 150 in the thickness direction.

Specifically, the terminal-parts 70 are provided, one each, at both ends of the gate line 21 which connects, on a per row basis, the pixels 100 that are arranged in rows and columns, and function as connections which connect the gate line 21 and an external drive circuit, and input a signal from the external drive circuit to the gate line 21. Here, since the conductive oxide film 160 is disposed so as to cover the end of the gate line 21 which is exposed from the hole 72, it is possible to prevent the gate line 21 from coming into contact with moisture in the air and the like, and becoming oxidized.

In the same manner, the terminal-part (the part to the left of the break lines) 80 shown in FIG. 6 is formed at two places, namely, at both ends of the pixels 100 which continues in the column direction. Each of the terminal-parts 80 includes: a relay line 82 formed in the second metal layer 140; and holes 83 and 84 which penetrate through the passivation film 150 in the thickness direction. Furthermore, the upper surface of the relay line 82 is covered with the conductive oxide film 160, and its end (the end at the left in FIG. 6) functions as a terminal 81. The hole 83 is formed at a position that overlaps with one end of the relay line 82, and exposes the terminal 81. In the same manner, the hole 84 is formed at a position that overlaps with the other end of the relay line 82, and electrically connects the end of the source line 22 and the other end of the relay line 82.

Specifically, the terminal-parts 80 are provided, one each, at both ends of the source line 22 which connects, on a per column basis, the pixels 100 that are arranged in rows and columns, and function as connections which connect the source line 22 and an external drive circuit, and input a signal from the external drive circuit to the source line 22. Here, since the conductive oxide film 160 is disposed so as to cover the end of the relay line 82 which is exposed from the hole 83, it is possible to prevent the gate line 21 from coming into contact with moisture in the air and the like, and becoming oxidized.

Next, a method of manufacturing the thin-film transistor array device 20 according to Embodiment 1 shall be described with reference to FIG. 9A to 12C. It should be noted that FIG. 9A to FIG. 9F are diagrams showing the structure of the cross-section along V-V in FIG. 4 corresponding to the manufacturing processes (a) to (f). FIG. 10A to FIG. 10C are diagrams showing details of the manufacturing process from 9F to 9G. FIG. 11A to FIG. 11H are diagrams showing the structure of the cross-section along VII-VII in FIG. 4 corresponding to the manufacturing processes (a) to (f). FIG. 12A to FIG. 12C are diagrams showing details of the manufacturing process between FIG. 11G and FIG. 11H.

Figure 9A:
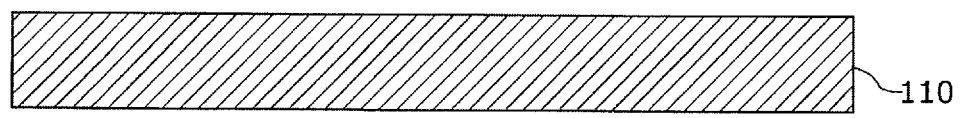
FIG. 9A is a diagram showing a structure of the cross-section along V-V in FIG. 4 corresponding to a manufacturing process (a) of the thin-film transistor array device according to Embodiment 1.
Figure 9B:
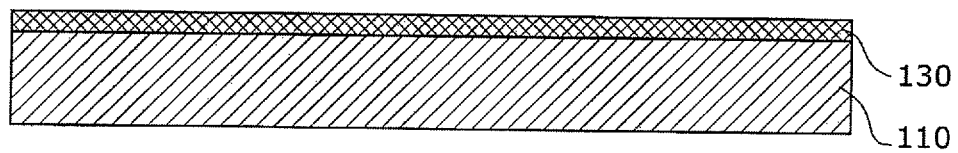
FIG. 9B is a diagram showing a structure of the cross-section along V-V in FIG. 4 corresponding to a manufacturing process (b) of the thin-film transistor array device according to the Embodiment 1.
Figure 10A:
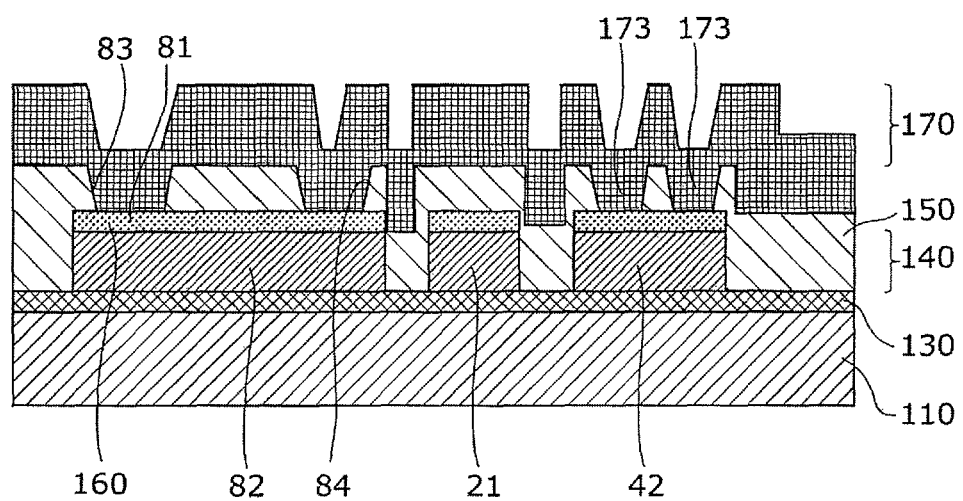
FIG. 10A is a diagram showing a structure of the cross-section along V-V in FIG. 4 corresponding to a part of a process of forming a terminal, a gate line, and a relay electrode.
Figure 10B:
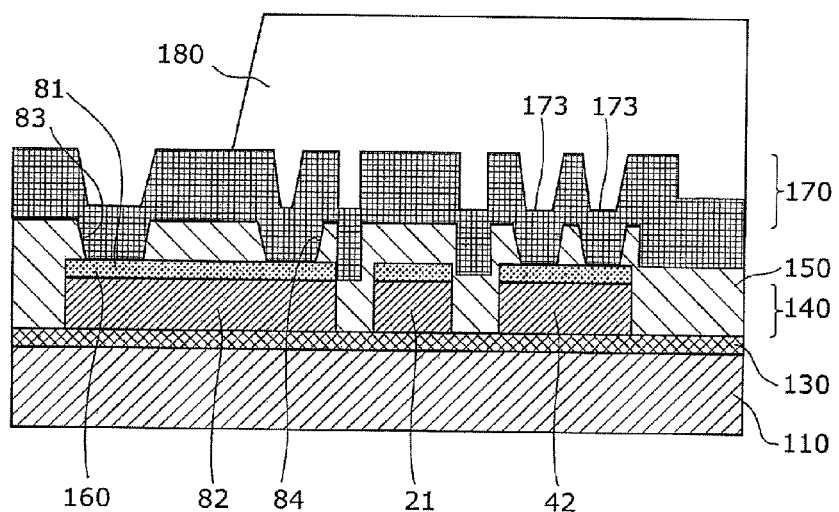
FIG. 10B is a diagram showing a structure of the cross-section along V-V in FIG. 4 corresponding to another part of the process of forming a terminal, a gate line, and a relay electrode.
Figure 10C:
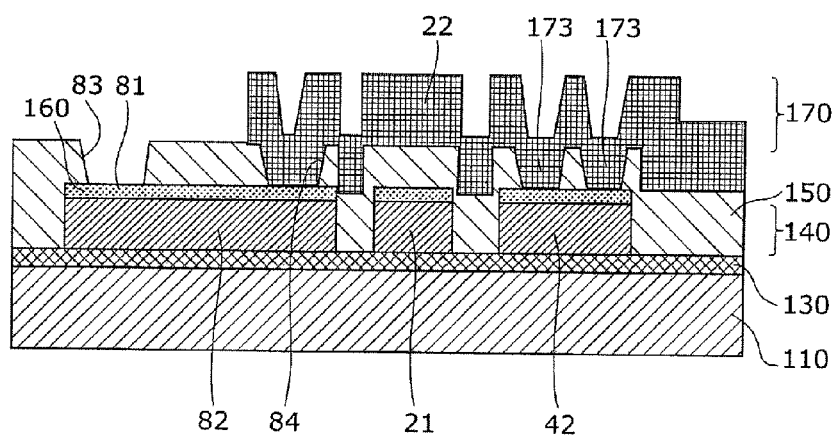
FIG. 10C is a diagram showing a structure of the cross-section along V-V in FIG. 4 corresponding to yet another part of the process of forming a terminal, a gate line, and a relay electrode.
Figure 11A:
FIG. 11A is a diagram showing a structure of the cross-section along VII-VII in FIG. 4 corresponding to the manufacturing process (a) of the thin-film transistor array device according to Embodiment 1.
Figure 12A:
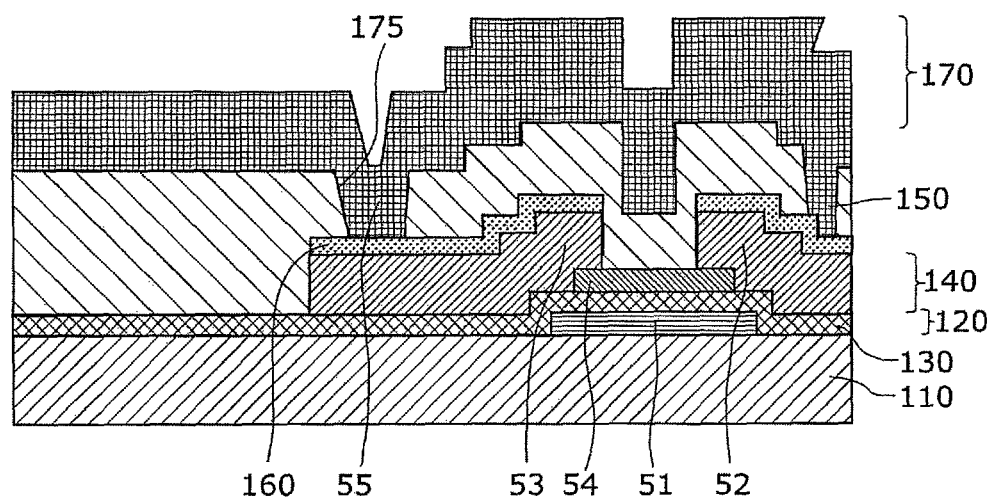
FIG. 12A is a diagram showing a structure of the cross-section along VII-VII in FIG. 4 corresponding to a part of the process of forming a terminal, a gate line, and a relay electrode.
Figure 12B:
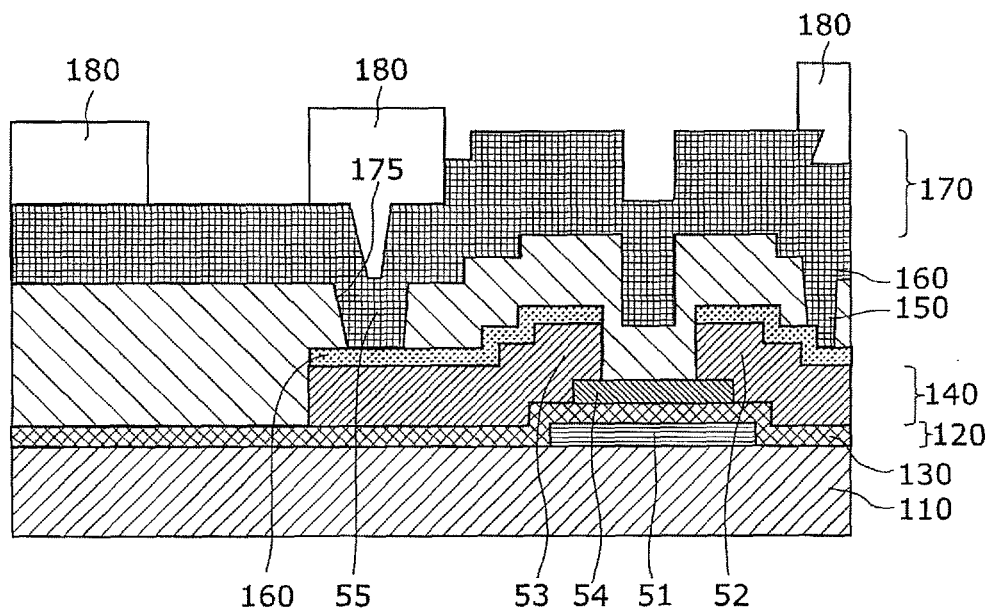
FIG. 12B is a diagram showing a structure of the cross-section along VII-VII in FIG. 4 corresponding to another part of the process of forming a terminal, a gate line, and a relay electrode.
Figure 12C:
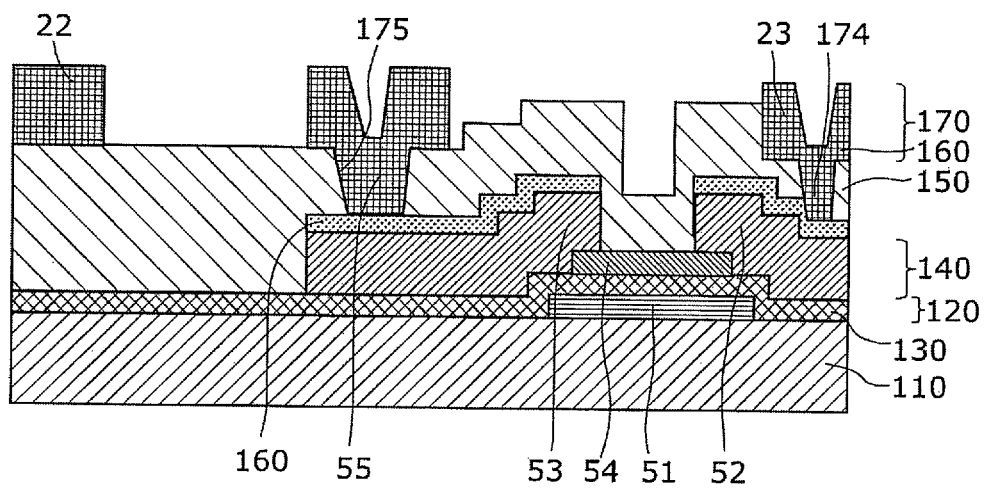
FIG. 12C is a diagram showing a structure of the cross-section along VII-VII in FIG. 4 corresponding to yet another part of the process of forming a terminal, a gate line, and a relay electrode.

First, as in manufacturing process (a) shown in FIG. 9A and FIG. 11A, the substrate 110 is prepared. An insulating material such as glass, quartz, and the like, are typically used for the substrate 110. In order to prevent the spread of impurities from the substrate 110, a silicon oxide film or a silicon nitride film not illustrated in the figures may be formed on the upper surface of the substrate 110. The film thickness is approximately 100 nm.

Figure 11B:
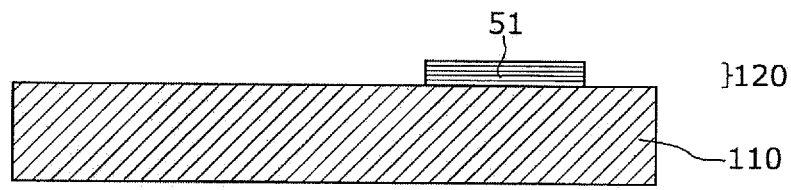
FIG. 11B is a diagram showing a structure of the cross-section along VII-VII in FIG. 4 corresponding to the manufacturing process (b) of the thin-film transistor array device according to Embodiment 1.
Figure 11C:
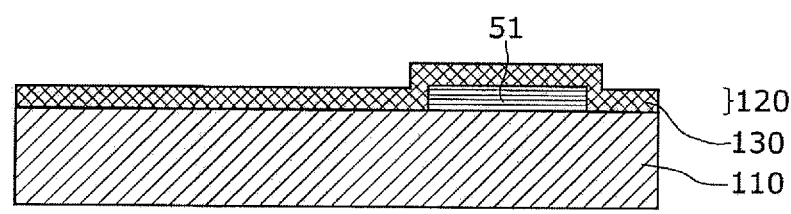
FIG. 11C is a diagram showing a structure of the cross-section along VII-VII in FIG. 4 corresponding to a part of the manufacturing process (c) of the thin-film transistor array device according to Embodiment 1.

Next, as in manufacturing process (b) shown in FIG. 11B, after the heat-resistant first metal layer 120 is formed on the substrate 110, patterning is performed by photolithography, etching, and the like, and the gate electrodes 41 and 51 are formed. Any one of Mo, W, Ta, Ti, and Ni, which are heat resistant, or an alloy of these is used as a material. Mo is used in Embodiment 1. A thickness of approximately 100 nm is preferable.

Next, as in manufacturing process (c) shown in FIG. 9B and FIG. 11C to FIG. 11E, the gate insulating film 130 is formed on the substrate 110 and the first metal layer 120, and a semiconductor layer is formed on the gate insulating film 130. It should be noted that the gate insulating film 130 and the semiconductor layer are formed successively by plasma CVD, and so on, without breaking the vacuum. A silicon oxide film, a silicon nitride film, or a composite film of these is formed as the gate insulating film 130. Thickness is approximately 200 nm. Furthermore, the semiconductor layer is an approximately 50 nm amorphous silicon film.

Figure 11D:
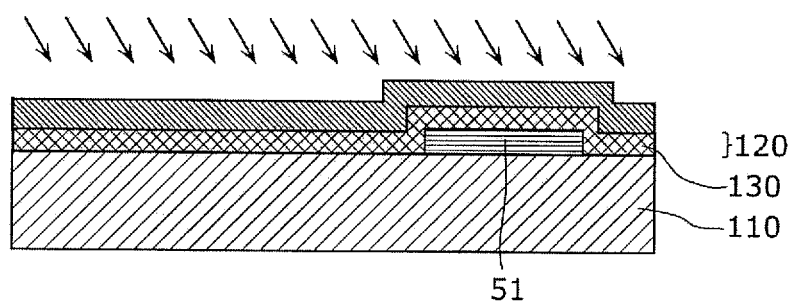
FIG. 11D is a diagram showing a structure of the cross-section along VII-VII in FIG. 4 corresponding to another part of the manufacturing process (c) of the thin-film transistor array device according to Embodiment 1.

Subsequently, for example, as indicated by the arrows in FIG. 11D, by irradiating an excimer laser, and the like, on the semiconductor layer, the semiconductor layer is reformed from an amorphous semiconductor layer to a polycrystalline semiconductor. As a crystallization method, for example, after performing dehydrogenation in a 400° C. to 500° C. furnace, crystallization is caused using an excimer laser, after which hydrogen plasma processing is performed in a vacuum over a few seconds to a few tens of seconds. More specifically, the amorphous semiconductor layer is crystallized by raising its temperature to within a predetermined temperature range, by irradiation with an excimer laser, and the like. Here, the predetermined temperature range is, for example, from 1100° C. to 1414° C. Furthermore, average crystal grain size within the polycrystalline semiconductor ranges from 20 nm to 60 nm.

Here, since the first metal layer 120 which forms the gate electrodes 41 and 51 is exposed to high temperature in the above-described process, it is necessary to form the first metal layer 120 from a metal having a melting point that is higher than the upper limit (1414° C.) of the aforementioned temperature range. On the other hand, the second metal layer 140 and the third metal layer 170 that are stacked in subsequent processes may be formed from metal having a lower melting point than the lower limit (1100° C.) of the aforementioned temperature range.

Figure 11E:
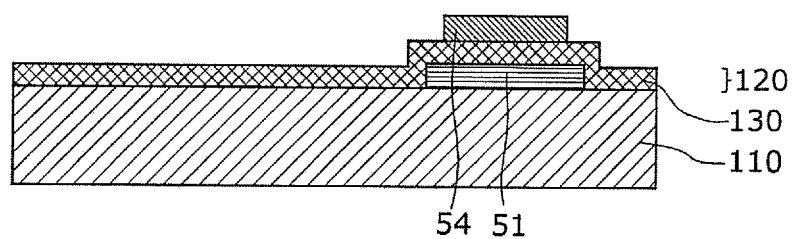
FIG. 11E is a diagram showing a structure of the cross-section along VII-VII in FIG. 4 corresponding to yet another part of the manufacturing process (c) of the thin-film transistor array device according to Embodiment 1.

Next, as shown in FIG. 11E, the semiconductor layer is formed into the island-shaped semiconductor films 44 and 54 using photolithography, etching, and so on. In addition, a second through-hole (not illustrated) is formed in the gate insulating film 130 likewise using photolithography, etching, and so on. The first through-hole 171a later becomes the first contact hole 171, and the third through-hole later becomes the third contact hole 173.

Figure 9C:
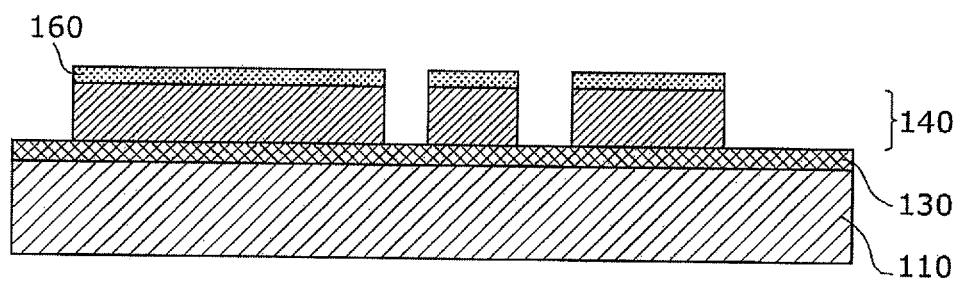
FIG. 9C is a diagram showing a structure of the cross-section along V-V in FIG. 4 corresponding to a manufacturing process (c) of the thin-film transistor array device according to the Embodiment 1.
Figure 11F:
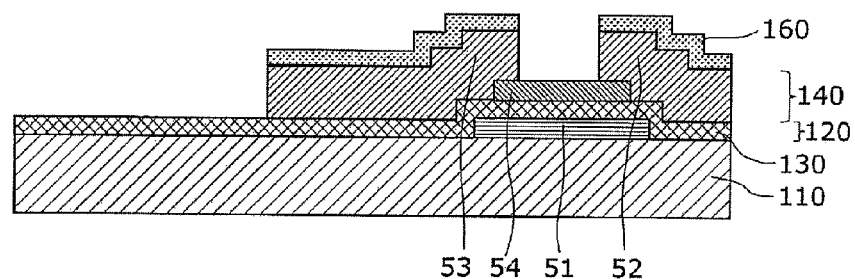
FIG. 11F is a diagram showing a structure of the cross-section along VII-VII in FIG. 4 corresponding to the manufacturing process (d) of the thin-film transistor array device according to Embodiment 1.

Subsequently, as in manufacturing process (d) shown in FIG. 9C and FIG. 11F, the second metal layer 140 and the conductive oxide film 160 are formed on the gate insulating film 130 and the semiconductor films 44 and 54, and then the gate line 21, the source electrodes 42 and 53, the drain electrodes 43 and 52, and the relay line 82 are formed by patterning. At this time, the material making up the second metal layer 140 is also filled into the first and second through-holes (not illustrated), thereby forming the first contact hole 171 and the second contact hole 172. With this process, the gate line 21 and the gate electrode 41 are electrically connected via the first contact hole 171. In the same manner, the gate electrode 51 and the drain electrode 43 are electrically connected via the second contact hole 172.

Any one of Al, Cu, and Ag, which are low-resistance metals, or an alloy of these is used as a material for the second metal layer 140. In Embodiment 1, Al is used and the thickness is approximately 300 nm.

Furthermore, the upper surfaces of the gate line 21, the source electrodes 42 and 53, the drain electrodes 43 and 52, and the relay line 82 formed here are covered with the conductive oxide film 160. In view of this, the surface of the second metal layer 140 that is in contact with the conductive oxide film 160 is formed from a metal including at least one of copper, molybdenum, titanium, or tungsten. For example, the second metal layer 140 may be of a multilayered structure in which 30 nm of Al is formed after forming 50 nm of Mo as a barrier metal. When lower resistance is required, there are cases where Cu is used instead of Al (in this case, a barrier metal is unnecessary). Furthermore, increasing the thickness can realize further lower resistance.

Furthermore, the material making up the conductive oxide film 160 is an oxide layer including indium and tin or an oxide film including indium and zinc. In addition, the material making up the third metal layer 170 described later may be of the same metal as the second metal layer 140 since low resistance is required.

Furthermore, typically, a low-resistance semiconductor layer which is not illustrated is formed between the source electrode 42 and the semiconductor film 44 and between the drain electrode 43 and the semiconductor film 44. An amorphous silicon layer that is doped with an N-type dopant such as phosphorous or an amorphous layer doped with a P-type dopant such as boron is typically used for this low-resistance semiconductor layer. Thickness is approximately 20 nm. A semiconductor layer of amorphous silicon and the like may be additionally formed between the crystallized semiconductor film 44 and the doped crystalline silicon layer. There are cases where these films are required in order to improve device characteristics. The same is done for the semiconductor film 54.

Figure 9D:
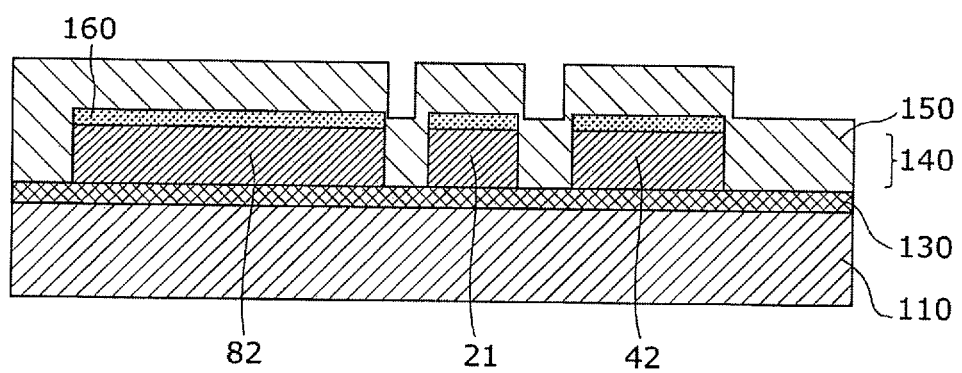
FIG. 9D is a diagram showing a structure of the cross-section along V-V in FIG. 4 corresponding to a manufacturing process (d) of the thin-film transistor array device according to the Embodiment 1.
Figure 9E:
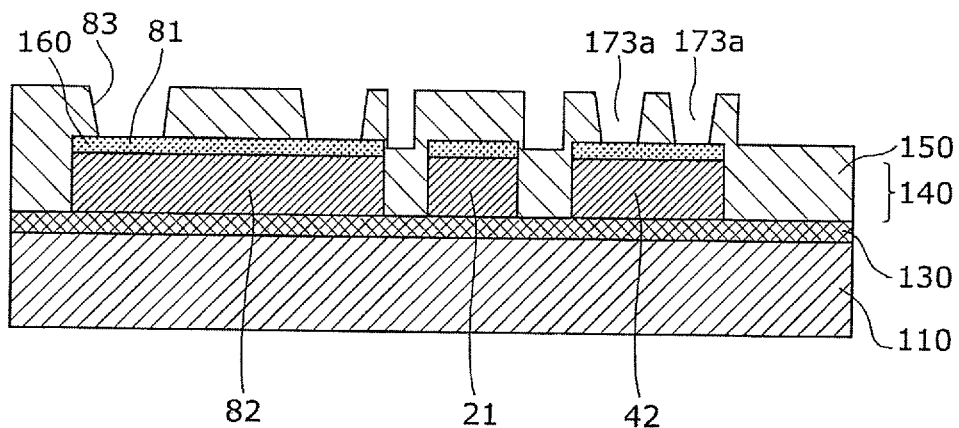
FIG. 9E is a diagram showing a structure of the cross-section along V-V in FIG. 4 corresponding to a part of a manufacturing process (e) of the thin-film transistor array device according to Embodiment 1.
Figure 11G:
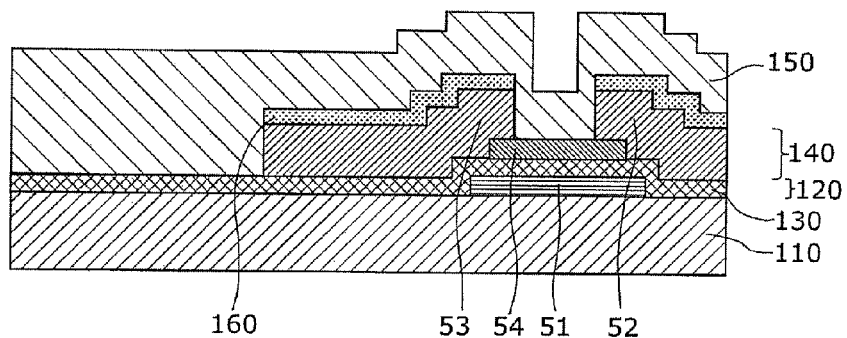
FIG. 11G is a diagram showing a structure of the cross-section along VII-VII in FIG. 4 corresponding to the manufacturing process (e) of the thin-film transistor array device according to the Embodiment 1.

Subsequently, as in manufacturing process (e) shown in FIG. 9D, FIG. 9E, and FIG. 11G, the passivation film 150, which comprises an oxide film (for example a silicon oxide film), a nitride film (for example a silicon nitride film), or a laminated film of such films, is formed on the gate insulating film 130, the semiconductor films 44 and 54, and the second metal layer 140 that is covered with the conductive oxide film 160. It should be noted that the passivation film 150 is not limited to an inorganic film such as the aforementioned oxide film or nitride film, and may be an organic film comprising an acrylic or amide-based photosensitive resin.

Furthermore, third through fifth through-holes 173a (the fourth and fifth through-holes are not illustrated) and the holes 72, 83, and 84 are formed in the passivation film 150 by photolithography, etching, and so on, and penetrate through the passivation film 150 in the thickness direction. The third through-hole 173a later becomes the third contact hole 173, the fourth through-hole later becomes the fourth contact hole 174, and the fifth through-hole later becomes the fifth contact hole 175.

Here, materials and the thickness of the gate insulating film 130 and the passivation film 150 are determined so that the per unit area capacitance formed in the passivation film 150 disposed between the second metal layer 140 and the third metal layer 170 is smaller than the per unit area capacitance formed in the gate insulating film 130 disposed between the first metal layer 120 and the second metal layer 140. More specifically, it is preferable that the per unit area capacitance formed in the passivation film 150 be below $1.5 \times 10^{-4}$ (F/m$^2$). Meanwhile, it is preferable that the per unit area capacitance formed in the passivation film 150 be equal to or greater than $1.5 \times 10^{-4}$ (F/m$^2$).

Figure 9F:
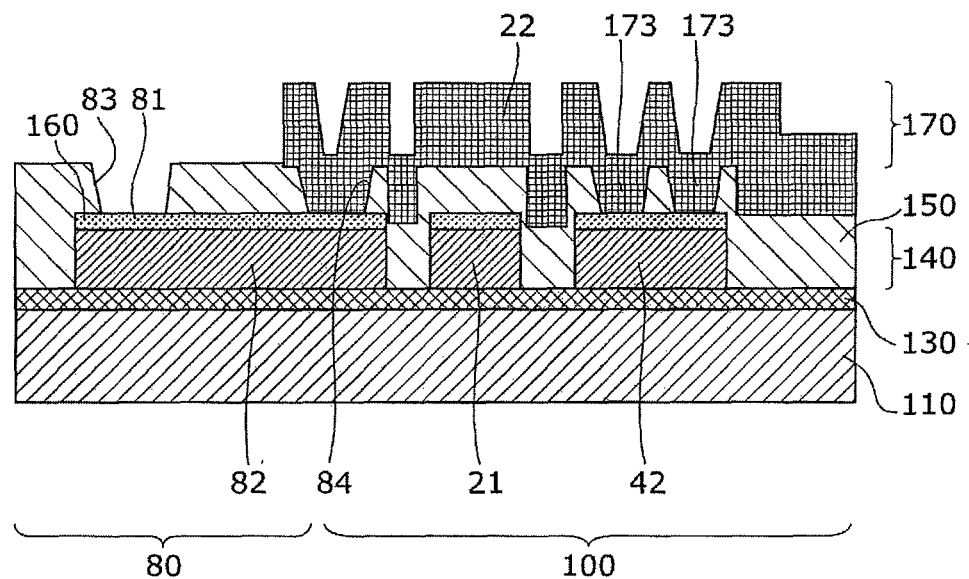
FIG. 9F is diagram showing a structure of the cross-section along V-V in FIG. 4 corresponding to another part of the manufacturing process (e) of the thin-film transistor array device according to Embodiment 1.
Figure 11H:
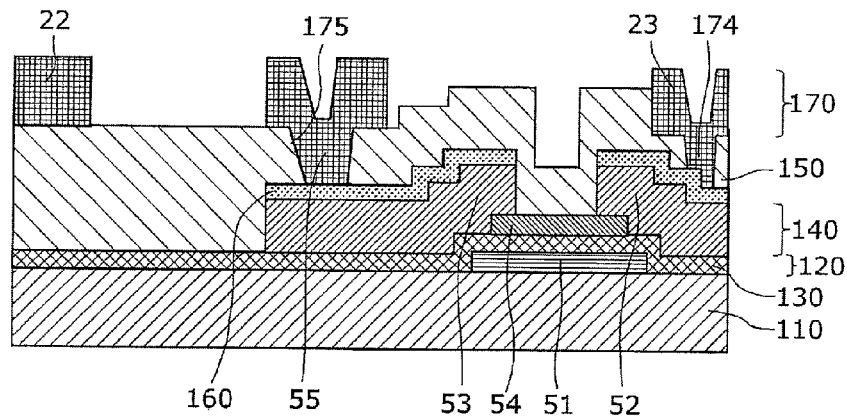
FIG. 11H is a diagram showing a structure of the cross-section along VII-VII in FIG. 4 corresponding to a manufacturing process (f) of the thin-film transistor array device according to Embodiment 1.

In addition, as in manufacturing process (f) shown in FIG. 9F and FIG. 11H, the third metal layer 170 is formed on the passivation film 150. Then, the third metal layer 170 is formed into the source line 22, the power line 23, and the relay electrode 55 by patterning. The process of forming the source line 22, the power line 23, and the relay electrode 55 shall be described later using FIG. 10A to FIG. 10C and FIG. 12A to FIG. 12C.

At this time, the material making up the third metal layer 170 is also filled into the third through fifth through-holes 173a (the fourth and fifth through holes not illustrated), thereby forming the third contact hole 173, the fourth contact hole 174, and the fifth contact hole 175. With this, the source line 22 and the source electrode 42 are electrically connected via the third contact hole 173, the power line 23 and the drain electrode 52 are electrically connected via the fourth contact hole 174, and the source electrode 53 and the relay electrode 55 are electrically connected via the fifth contact hole 175.

Next, the process of forming the source line 22, the power line 23, and the relay electrode 55 shall be described in detail with reference to FIG. 10A to FIG. 10C and FIG. 12A to FIG. 12C.

First, as shown in FIG. 10A and FIG. 12A, the third metal layer 170 is formed on the passivation film 150. In this process, the third metal layer 170 is formed on the entire surface of the pixel 100.

Next, as shown in FIG. 10B and FIG. 12B, a photosensitive resist film 180 is formed on the third metal layer 170. The photosensitive resist film 180 is formed at a position that overlaps the parts that are to become the source line 22, the power line 23, and the relay electrode 55 after processing. Meanwhile, the photosensitive resist film 180 is not formed on the rest of the regions, that is, the part from which the third metal layer 170 is to be eventually removed.

Next, as shown in FIG. 10C and FIG. 12C, the source line 22, the power line 23, and the relay electrode 55 are patterned by etching. Specifically, the third metal layer 170 remains in the position of the photosensitive resist film 180. Here the remaining third metal layer 170 becomes the source line 22, the power line 23, and the relay electrode 55. In other words, the source line 22, the power line 23, and the relay electrode 55 are formed from the same material. On the other hand, the third metal layer 170 is removed at a position in which the photosensitive resist film 180 is not formed.

Next, although illustration has been omitted, a method of manufacturing the organic EL display 10 according to Embodiment 1 shall be described. Specifically, a method of sequentially stacking the interlayer insulating film 11, the banks 15, the anode 12, the organic EL layer 13, and the transparent cathode 14 on the thin-film transistor array device 20 shall be described.

First, the interlayer insulating film 11 is formed on the third metal layer 170. Subsequently, a sixth through-hole (not illustrated) penetrating through the interlayer insulating film 11 is formed by photolithography, etching, and so on. The sixth through-hole later becomes the sixth contact hole 176.

Next, the banks 15 are formed at positions on the interlayer insulating film 11 that correspond to the boundaries of the respective pixels 100. In addition, the anode 12 is formed on the interlayer insulating film 11, inside the openings formed by the banks 15, for each of the pixels 100. At this time, the material making up the anode 12 is filled into the sixth through-hole, thereby forming the sixth contact hole 176. The anode 12 and the relay electrode 55 are electrically connected via the sixth contact hole 176.

The material of the anode 12 is, for example, any one of: a conductive metal such as molybdenum, aluminum, gold, silver, copper or an alloy of these; an organic conductive material such as PEDOT: PSS; zinc oxide or lead indium oxide. A film formed from any of these materials is created by vacuum deposition, RF sputtering, or printing, and an electrode pattern is formed.

The organic EL layer 13 is formed on the anode 12 and inside the opening formed by the banks 15, for each color (subpixel column) or each sub pixel. The organic EL layer 13 is configured by stacking the respective layers of a hole injection layer, a hole transport layer, a light-emitting layer, an electron transport layer, an electron injection layer, and so on. For example, it is possible to use copper phthalocyanine for the hole injection layer, α-NPD (Bis[N-(1-Naphthyl)-N-Phenyl]benzidine) for the hole transport layer, Alq$_3$ (tris (8-hydroxyquinoline) aluminum) for the light-emitting layer, an oxazole derivative for the electron transport layer, and Alq$_3$ for the electron injection layer. It should be noted that these materials are but one example and that other materials may be used.

The transparent cathode 14 is a permeable electrode that is continuously formed on the organic EL layer 13. The material of the transparent cathode 14 is, for example, ITO, SnO2, In2O3, ZnO, or a combination of these.

(Modifications)

Figure 13:
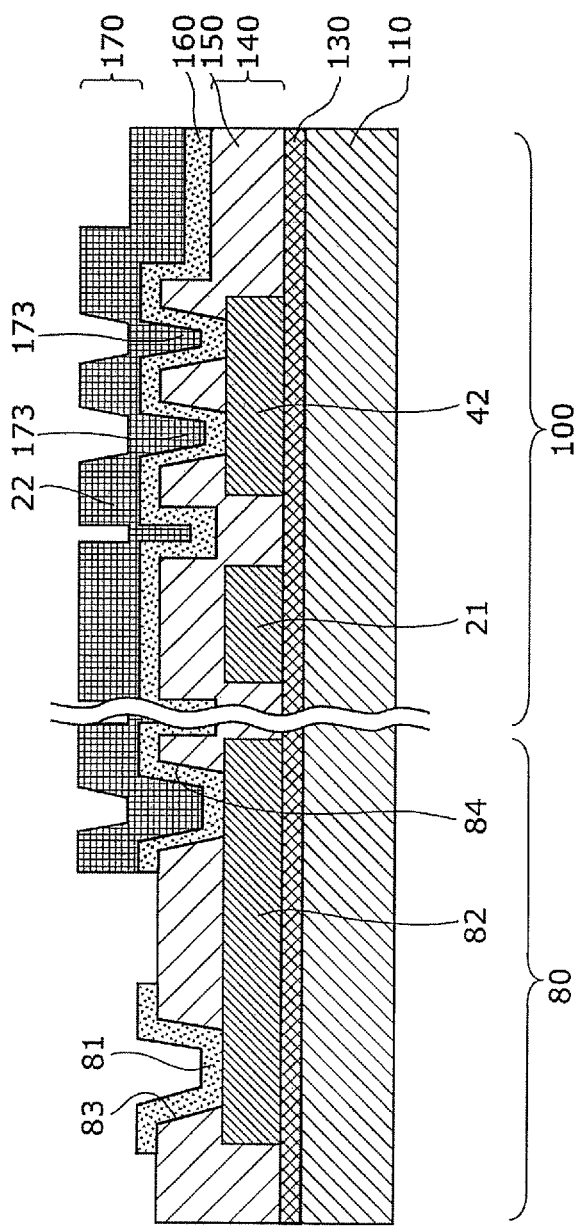
FIG. 13 is a diagram showing a cross-sectional structure corresponding to FIG. 6 of the thin-film transistor array device according to Embodiment 1.
Figure 14A:
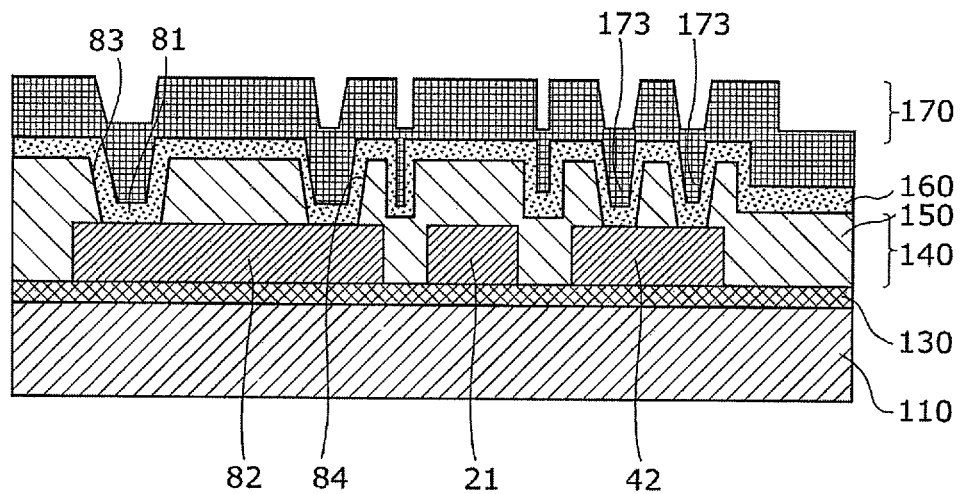
FIG. 14A is a diagram showing a part of a manufacturing process of the thin-film transistor array device shown in FIG. 13.
Figure 14B:
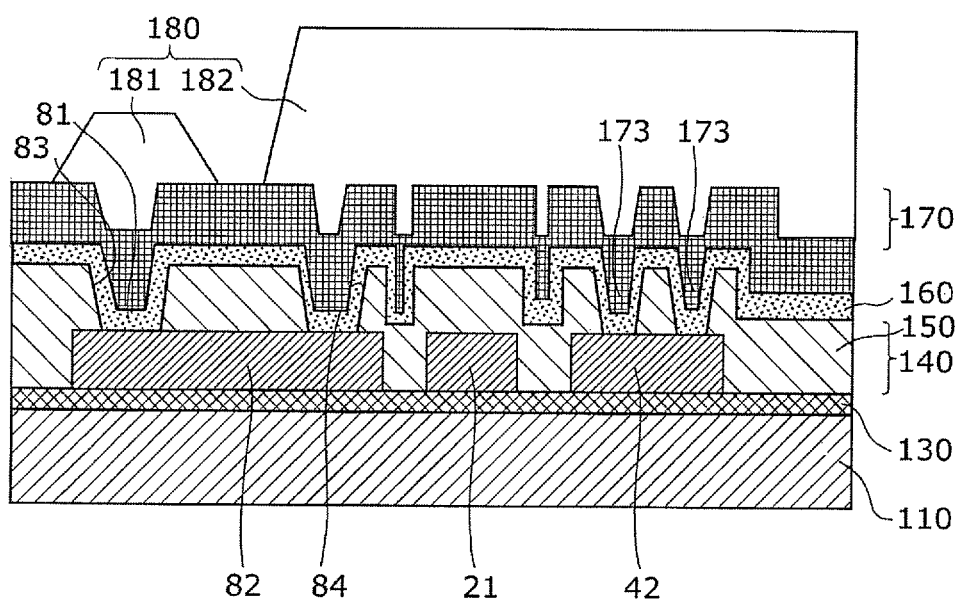
FIG. 14B is a diagram showing a part of the manufacturing process of the thin-film transistor array device shown in FIG. 13.

Next, a modification of the thin-film transistor array device 20 according to Embodiment 1 shall be described with reference to FIG. 13, FIG. 14A and FIG. 14B. FIG. 13 is a cross-sectional view of the thin-film transistor array device according to the modification, and is a diagram corresponding to FIG. 6. FIG. 14A and FIG. 14B are diagrams showing a manufacturing method of the thin-film transistor array device according to the modification, and are diagrams corresponding to FIG. 10A and FIG. 10B, respectively.

In the thin-film transistor array device shown in FIG. 13, the positional relationship between the passivation film 150 and the conductive oxide film 160 is different from that in FIG. 6. Specifically, in FIG. 13, the conductive oxide film 160 is stacked on the passivation film 150. However, as in FIG. 6, the terminal-part 80 is covered with the conductive oxide film 160. Furthermore, although illustration has been omitted, the conductive oxide film 160 is also interposed between the source electrode 53 and the relay electrode 55. In other words, even when the configuration shown in FIG. 13 is adopted, the same advantageous effect as that in FIG. 6 can be obtained.

In the case of manufacturing the thin-film transistor array device shown in FIG. 13, there is a method (half-tone process) in which the conductive oxide film 160 and the third metal layer 170 are simultaneously processed using a half-tone mask, as shown in FIG. 14A and FIG. 14B.

First, as shown in FIG. 14A, the conductive oxide film 160 and the third metal layer 170 are formed above the passivation film 150. In this process, the conductive oxide film 160 and the third metal layer 170 are formed on the entire surface of the pixel 100.

Next, as shown in FIG. 14B, a photosensitive resist film 180 is formed on the third metal layer 170. The photosensitive resist film 180 includes a relatively thin first photosensitive resist film 181 and a relatively thick second photosensitive resist film 182.

The first photosensitive resist film 181 is formed at a position that overlaps the parts that are to become the terminals 71 and 81 after processing (terminal 71 is not illustrated). On the other hand, the second photosensitive resist film 182 is formed at a position that overlaps the parts that are to become the source line 22, the power line 23, and the relay electrode 55 after processing (power line 23 and relay electrode 55 not illustrated). Meanwhile, the photosensitive resist film 180 is not formed on the rest of the regions, that is, the part from which the conductive oxide film 160 and the third metal layer 170 are to be eventually removed.

Subsequently, the terminals 71 and 81, the source line 22, the power line 23, and the relay electrode 55 are patterned on the multilayered structure shown in FIG. 14B, by etching. Specifically, in the position of the first photosensitive resist film 181, the third metal layer 170 is removed, and only the conductive oxide film 160 remains. Here, the remaining conductive oxide film 160 becomes the terminals 71 and 81. On the other hand, in the position of the second photosensitive resist film 182, conductive oxide film 160 and the third metal layer 170 remain. Here the remaining conductive oxide film 160 and third metal layer 170 become the source line 22, the power line 23, and the relay electrode 55. In other words, the source line 22, the power line 23, and the relay electrode 55 are formed from the same material.

In this manner, when manufacturing the thin-film transistor array device according to the modification, it is necessary to use a complicated method such as the half-tone process. On the other hand, when the conductive oxide film 160 and the third metal layer 170 are to be processed separately, the number of manufacturing steps further increases. This due to the co-existence of a region in which the conductive oxide film 160 and the third metal layer 170 are stacked, as in the pixel 100 shown in FIG. 13, and a region composed of only the conductive oxide film 160, as in the terminal-part 80 shown in FIG. 13.

In contrast, in the thin-film transistor array device 20 according to Embodiment 1, the second metal layer 140 and the conductive oxide film 160 are stacked in all of the regions. Stated differently, the conductive oxide film 160 always remains in a region in which the second metal layer 140 remains. Stated differently, at all times, the conductive oxide film 160 also remains in a region in which the second metal layer 140 remains. As such, simple manufacturing is possible even without using the half-tone process, and the like, described in FIG. 14A and FIG. 14B.

Specifically, comparing Embodiment 1 and the modification, it can be seen that although the advantageous effect that can be obtained by stacking the conductive oxide film 160 is common, manufacturing is significantly easier with Embodiment 1.

Figure 15:
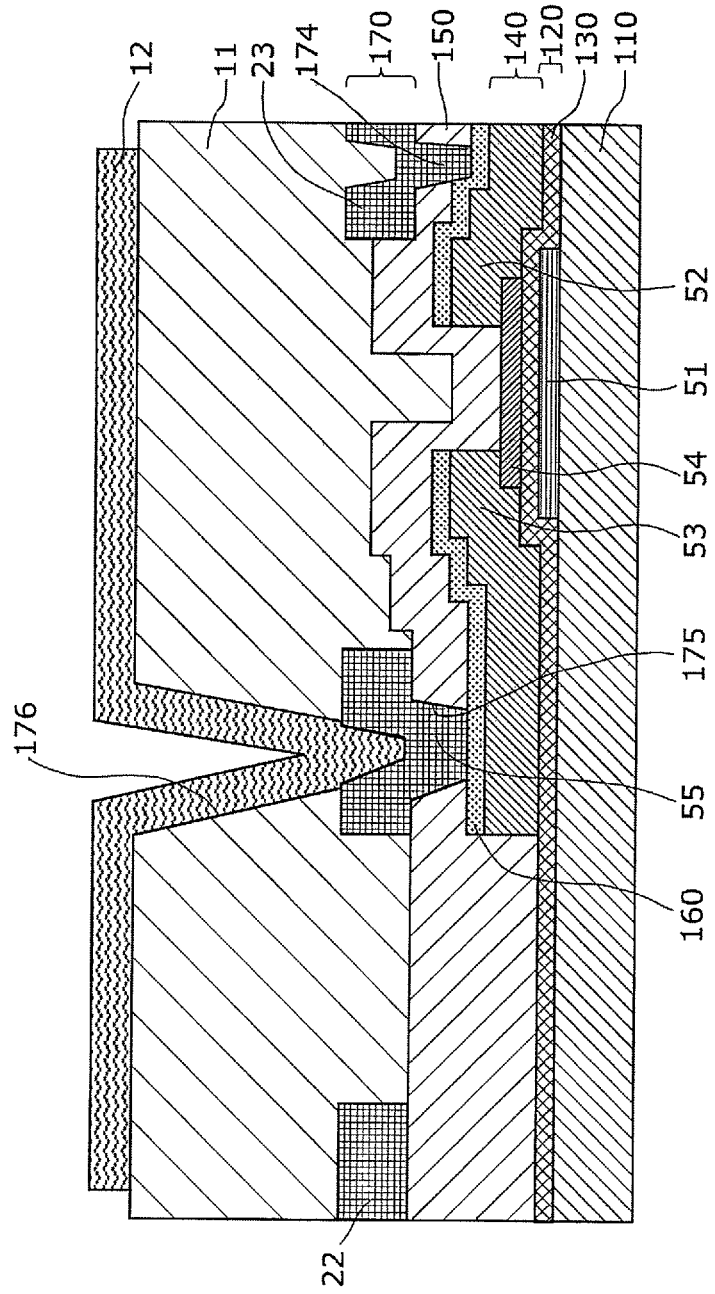
FIG. 15 is a diagram showing a modification of FIG. 7.
Figure 16:
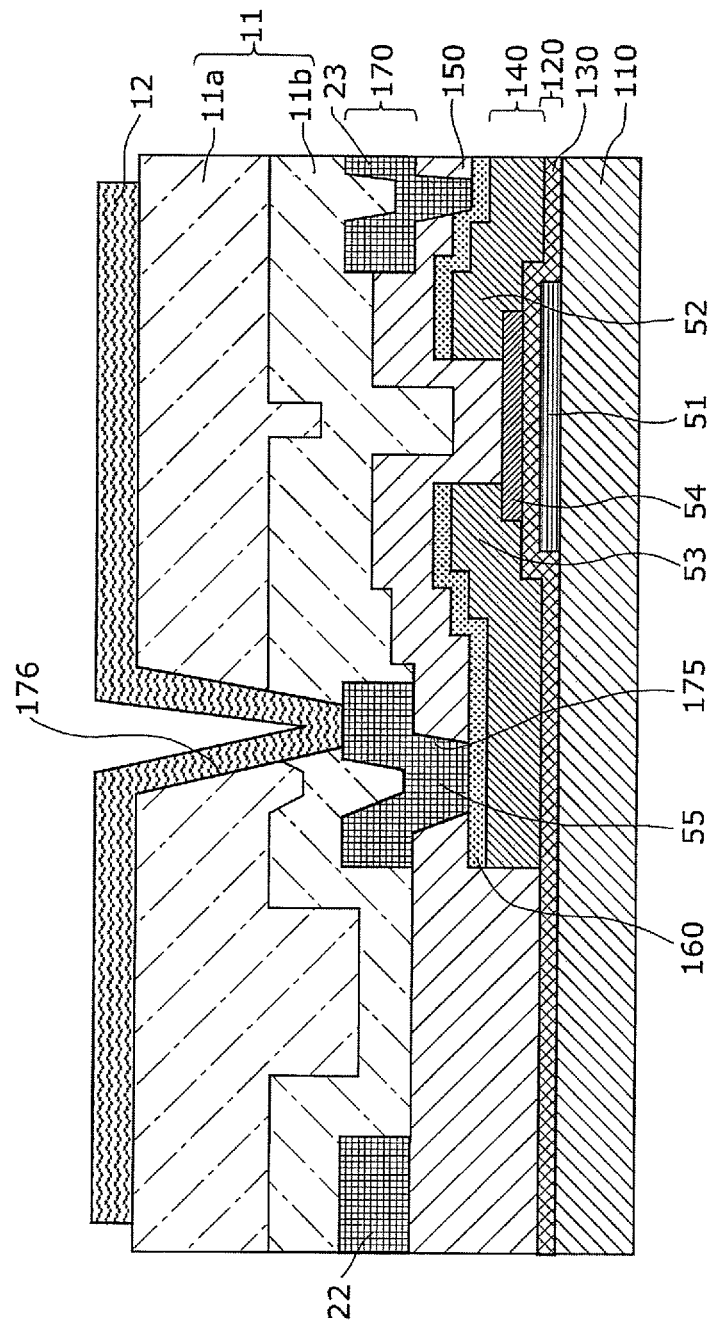
FIG. 16 is a diagram showing another modification of FIG. 7.

Next, a modification of FIG. 7 shall be described with reference to FIG. 15 to FIG. 17. FIG. 15 shows an example in which the anode 12 is electrically connected to the center region of the relay electrode 55. Furthermore, FIG. 16 shows an example in which the interlayer insulating film 11 includes two layers composed of an organic film 11a and an inorganic film 11b. Here, the organic film 11a is disposed on the side of the interlayer film 11 that is in contact with the anode 12 (upper layer), and the inorganic film 11b is disposed on the side that is in contact with the source line 22, the power line 23, and the relay electrode 55 (lower layer).

Figure 17:
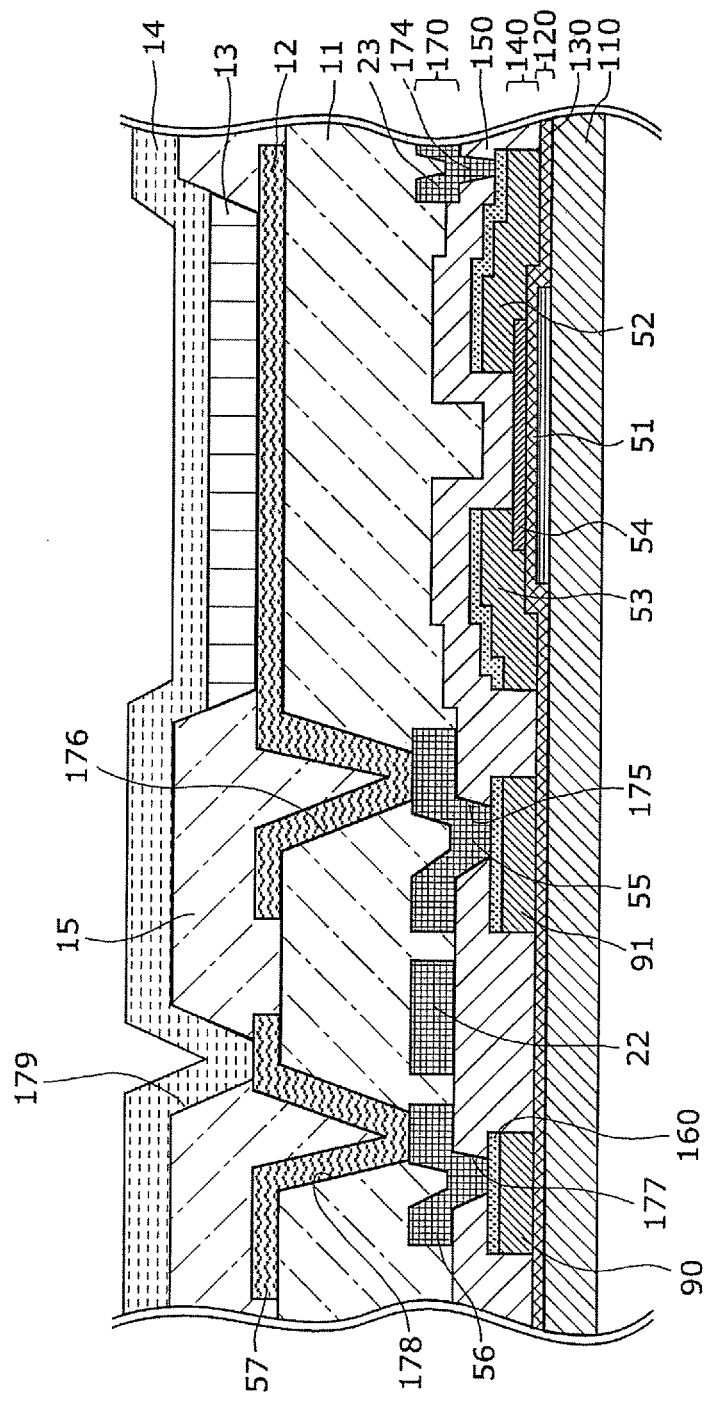
FIG. 17 is a diagram showing yet another modification of FIG. 7.

In addition, the thin-film transistor array device shown in FIG. 17 includes, in addition to the configuration in FIG. 7, a second relay electrode 56, a third relay electrode 57, an auxiliary line 90, and an auxiliary electrode 91. Furthermore, the organic EL layer 13, the transparent cathode 14, and the bank 15 are shown in FIG. 17 to clarify the positional relationships.

The auxiliary line 90 is formed in the second metal layer 140. Furthermore, auxiliary lines 90 are arranged in columns running parallel to the source lines 22, and the respective auxiliary lines 90 are connected at both ends. In addition, the upper surface of the auxiliary line 90 is covered with the conductive oxide film 160.

The second relay electrode 56 is formed in the third metal layer 170 for each pixel. In addition, the second relay electrode 56 is electrically connected to the auxiliary line 90 via a seventh contact hole 177 penetrating through the passivation film 150 in the thickness direction.

The third relay electrode 57 is formed for each pixel, in the same layer as the anode 12 and using the same material as the anode 12. In addition, the third relay electrode 57 is electrically connected to the second relay electrode 56 via an eighth contact hole 178 penetrating through the interlayer insulating film 11 in the thickness direction.

In addition, the transparent cathode 14 is electrically connected to the third relay electrode 57 via a ninth contact hole 179 penetrating through the bank 15 in the thickness direction. Specifically, the second relay electrode 56 and the third relay electrode 57 serve as relays between the auxiliary line 90 and the transparent cathode 14. With this, the connection resistance of the transparent cathode 14 to the auxiliary line 90 can be reduced over a long period of time.

It should be noted that, in the example in FIG. 17, the relay electrode 55 (first relay electrode) is not directly connected to the source electrode 53, and is connected to the auxiliary electrode 91. The auxiliary electrode 91 is formed in the second metal layer 140 for each pixel. Furthermore, the upper surface of the auxiliary electrode 91 is covered with the conductive oxide film 160. In addition, the auxiliary electrode 91 is electrically connected to the relay electrode 55 and is electrically connected to the source electrode 53 at a cross-section different from that in FIG. 17. However, the connection destination of the auxiliary electrode 91 may be the drain electrode 52.

In this manner, the relay electrode provided in the second metal layer 140 is not limited to the relay electrode 55 which directly or indirectly connects the anode 12 and the source electrode 53 or the drain electrode 52, and the second relay electrode 56 which directly or indirectly connects the transparent cathode 14 and the auxiliary line 90 may be provided. Specifically, it is sufficient that the relay electrode formed in the second metal layer 140 be a relay electrode that connects (serves as a relay between) a first conductive member formed in the second metal layer 140 (the source electrode 53 or the auxiliary line 90, in the example in FIG. 17) and a second conductive member formed above the interlayer insulating film 11 (the anode 12 or the transparent cathode 14, in the example in FIG. 17).

It should be noted that one or both of the second relay electrode 56 and the third relay electrode 57 can be a line running in the row direction at the forward-end and deep-end of FIG. 17 for example. With this, the second relay electrode 56 and the third relay electrode 57, combined with the auxiliary lines 90 arranged in columns, can function as auxiliary lines running two-dimensionally. This results in a more suitable form for realizing, in an ultra-large display panel, the reduction of power consumption through reduced resistance of power lines and the reduction of crosstalk during window pattern display.

Embodiment 2

Next, the thin-film transistor array device 20 according to Embodiment 2 of the present invention shall be described. It should be noted that between Embodiment 1 and Embodiment 2, the positional relationship between the gate line 21, the source line 22, and the power line 23 are mainly different. Specifically, in Embodiment 1, the gate line 21 is disposed in the second metal layer 140, and the source line 22 and the power line 23 are disposed in the third metal layer 170. In contrast, in Embodiment 2, the source line 22 and the power line 23 are disposed in the second metal layer 140, and the gate line 21 is disposed in the third metal layer 170. In view of this, in the subsequent description, the same numerical references are assigned to constituent elements that are in common with Embodiment 1.

Figure 18:
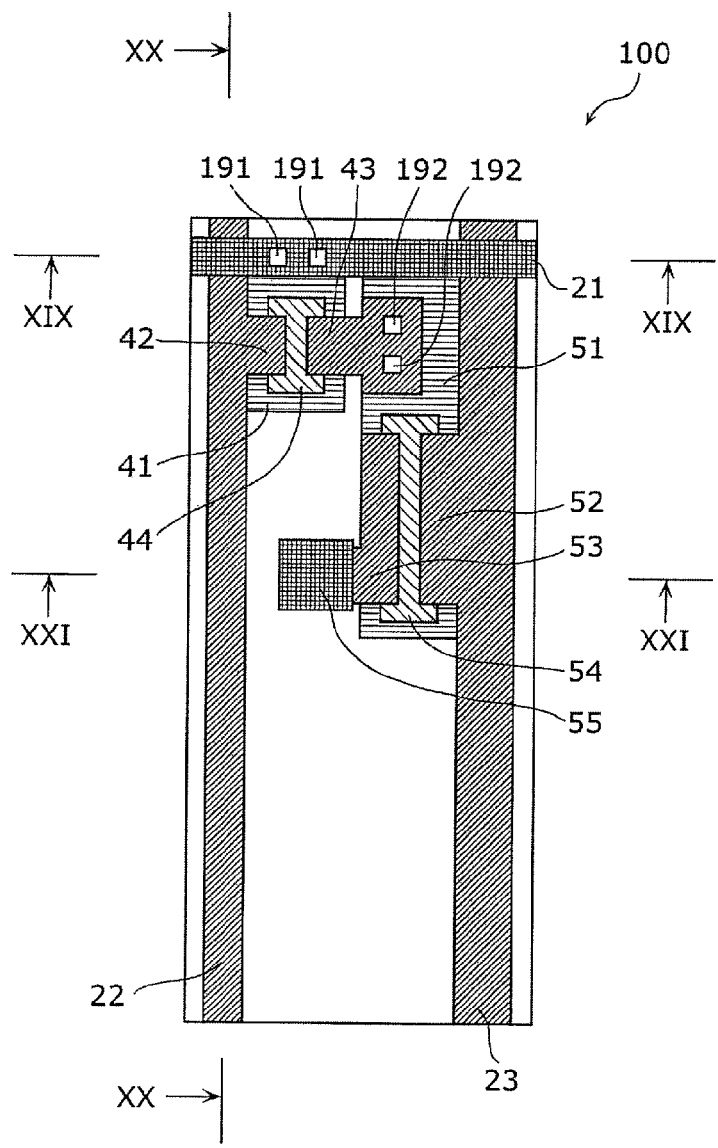
FIG. 18 is a front view showing a configuration of a pixel according to Embodiment 2.
Figure 19:
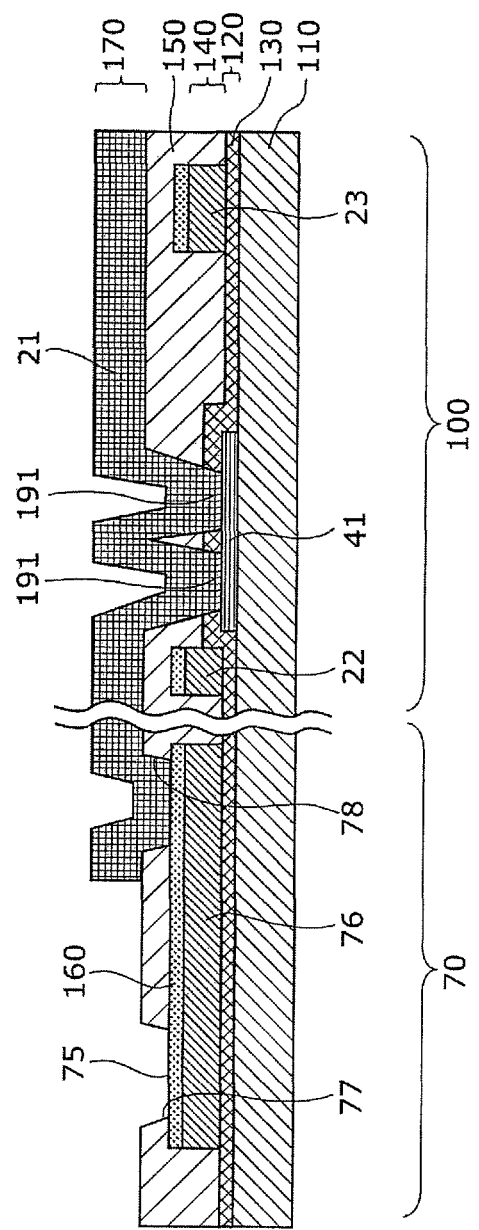
FIG. 19 is a cross-sectional view along XIX-XIX in FIG. 18.
Figure 20:
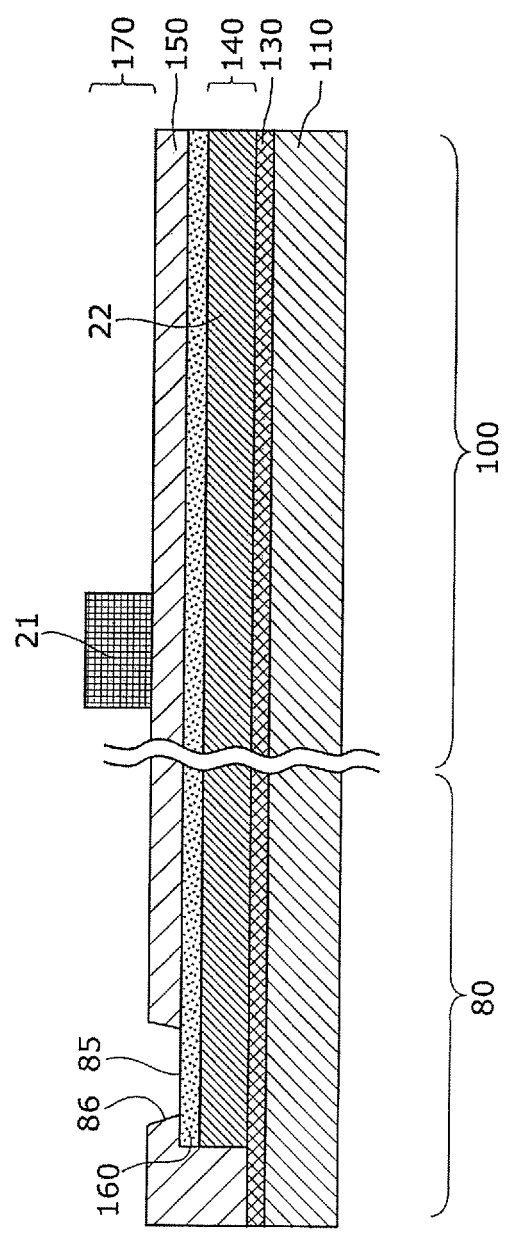
FIG. 20 is a cross-sectional view along XX-XX in FIG. 18.
Figure 21:
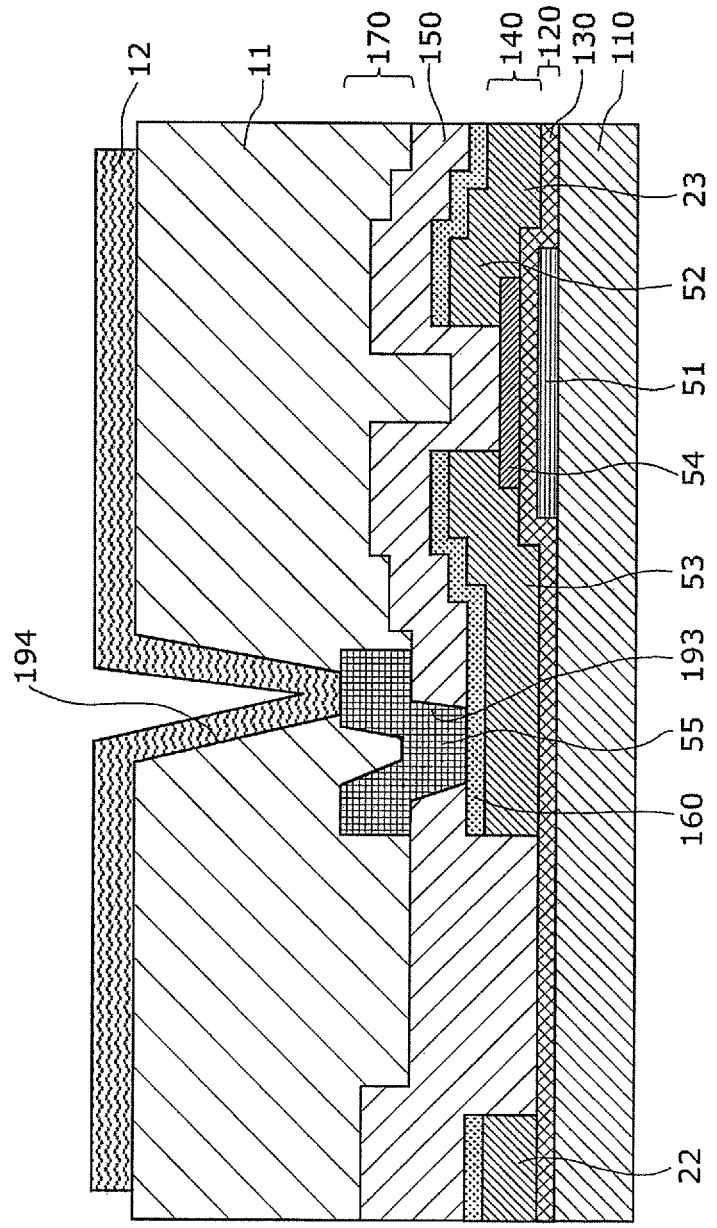
FIG. 21 is a cross-sectional view along XXI-XXI in FIG. 18.
Figure 22:
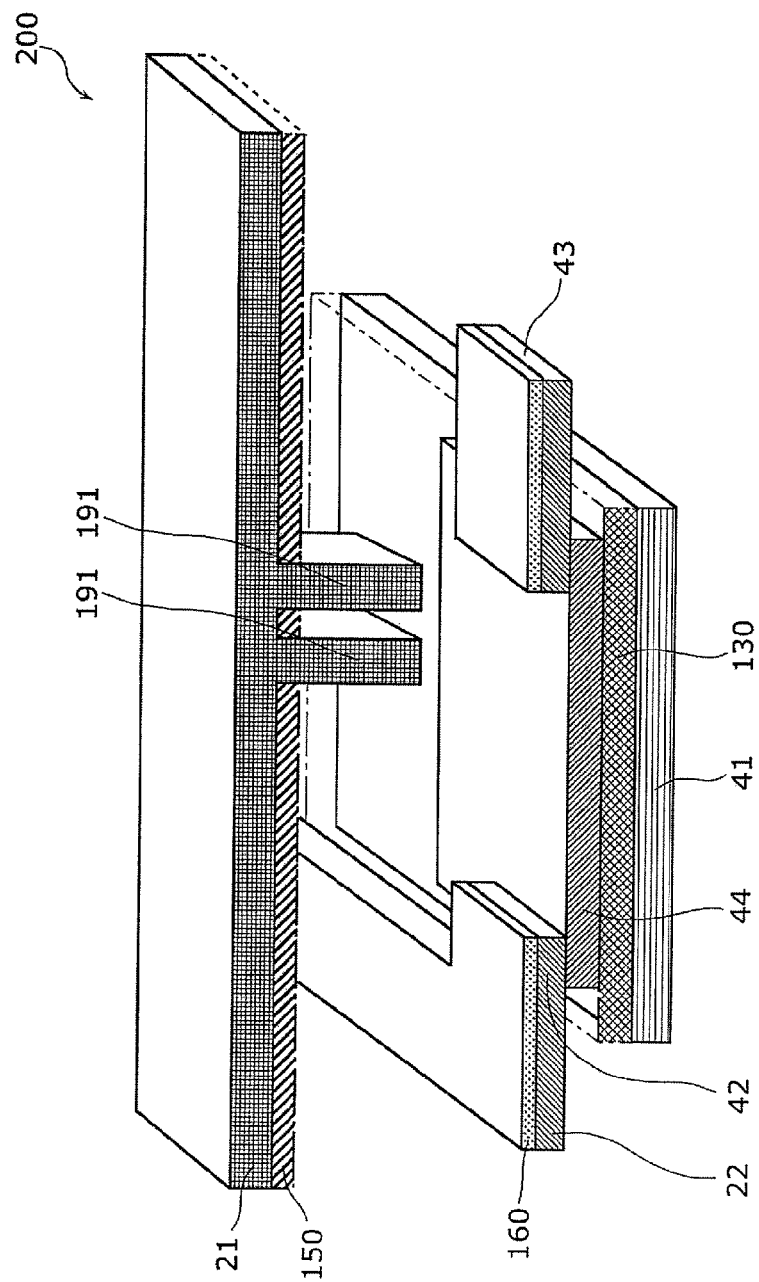
FIG. 22 is a perspective view of main parts as seen from the cross-section along XIX-XIX in FIG. 18.

The structure (the structure to the right of the break lines in FIG. 19 and FIG. 20) of the pixels 100 included in the thin-film transistor array device 20 shall be described with reference to FIG. 18 to FIG. 22. It should be noted that FIG. 18 is a front view showing the configuration of a pixel 100. FIG. 19 is a cross-sectional view along XIX-XIX in FIG. 18. FIG. 20 is a cross-sectional view along XX-XX in FIG. 18. FIG. 21 is a cross-sectional view along XXI-XXI in FIG. 18. FIG. 22 is a perspective view of main parts as seen from the cross-section along XIX-XIX in FIG. 18. It should be noted that the interlayer insulating film 11 and the anode 12 are also illustrated in FIG. 21.

As shown in FIG. 18 to FIG. 21, the pixel 100 is a multi-layered structure including the substrate 110, the first metal layer (conductive layer) 120, the gate insulating film 130, the semiconductor films 44 and 54, the second metal layer (conductive layer) 140, the conductive oxide film (Indium Tin Oxide: ITO) 160, the passivation film 150, and the third metal layer (conductive layer) 170.

The gate electrode 41 of the first transistor 40 and the gate electrode 51 of the second transistor 50 are formed in the first metal layer 120 which is stacked on the substrate 110. Furthermore, the gate insulating film 130 is formed on the substrate 110 and the first metal layer 120 so as to cover the gate electrodes 41 and 51.

The semiconductor film 44 is disposed inside a region which is on the gate insulating film 130 (between the gate insulating film 130 and the second metal layer 140) and overlaps with the gate electrode 41. In the same manner, the semiconductor film 54 is disposed inside a region which is on the gate insulating film 130 (between the gate insulating film 130 and the second metal layer 140) and overlaps with the gate electrode 51. It should be noted that "overlaps" in the present Specification refers to a positional relationship in which one lies on top of the other as seen from the vertical direction.

The source line 22, the power line 23, the source electrode 42 and the drain electrode 43 of the first transistor 40, and the drain electrode 52 and the source electrode 53 of the second transistor 50 are formed in the second metal layer 140 which is stacked on the gate insulating film 130 and the semiconductor films 44 and 54. Specifically, the first transistor 40 and the second transistor 50 are bottom-gate transistors in which the gate electrodes 41 and 51 are formed in a layer lower than that of the source electrodes 42 and 53 and the drain electrodes 43 and 52, respectively.

More specifically, the source electrode 42 and the drain electrode 43 are formed at opposing positions, and each overlaps with a part of the semiconductor film 44. Furthermore, the source electrode 42 runs from the source line 22 formed in the same layer. In the same manner, the drain electrode 52 and the source electrode 53 are formed at opposing positions, and each overlaps with a part of the semiconductor film 54. Furthermore, the drain electrode 52 runs from the power line 23 formed in the same layer.

Furthermore, second contact holes (holes) 192 are formed in the gate insulating film 130, penetrating in the thickness direction at positions that overlap with the drain electrode 43 and the gate electrode 51. In addition, the drain electrode 43 is electrically connected to the gate electrode 51 formed in the first metal layer 120, via the second contact holes 192.

Furthermore, the conductive oxide film 160 is formed on the gate insulating film 130 and the second metal layer 140 so as to cover the source electrodes 42 and 53 and the drain electrodes 43 and 52. In other words, the conductive oxide film 160 is formed to interpose between (i) the passivation film 150 and (ii) the first transistor 40 and second transistor 50. Furthermore, the conductive oxide film 160 is selectively formed at positions overlapping with the source electrodes 42 and 53, the drain electrodes 43 and 52, and so on (that is, the respective constituent elements of the second metal layer 140).

The passivation film 150 is stacked on the conductive oxide film 160. In addition, the third metal layer 170 is stacked on the passivation film 150. The gate line 21 and the relay electrode 55 are formed in the third metal layer 170 which is stacked on the passivation film 150.

Furthermore, first contact holes (holes) 191 are formed in the gate insulating film 130 and the passivation film 150, penetrating in the thickness direction at positions that overlap with the gate line 21 and the gate electrode 41. In addition, the gate line 21 is electrically connected to the gate electrode 41 formed in the first metal layer 120, via the first contact holes 191.

In the same manner, a third contact hole (hole) 193 is formed in the passivation film 150, penetrating in the thickness direction at a position that overlaps with the source electrode 53 of the second transistor 50 and the relay electrode 55. In addition, the relay electrode 55 is electrically connected to the source electrode 53 formed in the second metal layer 140, via the third contact hole 193. It should be noted that the source electrode 53 and the relay electrode 55 are not in direct contact, and that the conductive oxide film 160 is interposed in between.

In addition, the interlayer insulating film 11 is formed on the passivation film 150 and the third metal layer 170 so as to cover the gate line 21 and the relay electrode 55. The banks 15 are formed on the interlayer insulating film 11 in the boundaries with the adjacent pixels 100. Moreover, the anode 12 which is formed on a per pixel 100 basis and the organic EL layer 13 which is formed on a per color (sub pixel column) basis or subpixel basis are formed in the opening formed by the banks 15. In addition, the transparent cathode 14 is formed on the organic EL layer 13 and the banks 15.

In addition, a fourth contact hole (hole) 194 is formed at a position that overlaps with the anode 12 and the relay electrode 55, and penetrating through the interlayer insulating film 11 in the thickness direction. In addition, the anode 12 is electrically connected to the relay electrode 55 formed in the third metal layer 170, via the fourth contact hole 194. It should be noted that the relay electrode 55 shown in FIG. 7 is configured of a center region that fills the third contact hole 193 and a flat region running along the circumference of an upper part of the third contact hole 193. In addition, the anode 12 is electrically connected at the flat region of the relay electrode 55.

As shown in FIG. 22, in the pixel 100 having the above-described configuration, the source line 22 and the power line 23 are formed in the second metal layer 140 which is the same layer as the source electrodes 42 and 53 and the drain electrodes 43 and 52. On the other hand, the gate line 21 is formed in the third metal layer 170 which is a different layer from the source line 22 and the power line 23. In addition, the gate line 21 and the source line 22 cross each other and the gate line 21 and the power line 23 cross each other, with the passivation film 150 and the conductive oxide film 160 interposed in between.

As in the above described configuration, providing the respective lines (gate line 21, source line 22, and power line 23) in a metal layer (second metal layer 140 and third metal layer 170) above the first metal layer 120 in which the gate electrodes 41 and 51 are formed allows the gate electrodes 41 and 51 and the respective lines to be formed from a material that is suitable to each one. Furthermore, compared to the gate insulating film 130, the thickness of the passivation film 150 can be set freely. With that, parasitic capacitance can be reduced by placing the respective lines in the second metal layer 140 and the third metal layer 170 which are adjacent in the stacking direction, with the passivation film 150 disposed between the second and third metal layers.

Next, the structure (the structure to the left of the break lines in FIG. 19 and FIG. 20) of terminal-parts 70 and 80 formed at the ends (periphery) of the thin-film transistor array device 20 shall be described with reference to FIG. 19 and FIG. 20.

The terminal-part (the part to the left of the break lines) 70 shown in FIG. 19 is formed at two places, namely, at both ends of the pixels 100 which continue in the row direction. Each of the terminal-parts 70 includes: a terminal 75 formed from the same material as the conductive oxide film 160; a relay line 76 formed in the second metal layer 140; and holes 77 and 78 which penetrate through the passivation film 150 in the thickness direction. The hole 77 is formed at a position that overlaps with one end of the relay line 76, and exposes the terminal 75 to the outside. In the same manner, the hole 78 is formed at a position that overlaps with the other end of the relay line 76, and electrically connects the end of the source line 22 and the other end of the relay line 76.

Specifically, the terminal-parts 70 are provided, one each, at both ends of the gate line 21 which connects, on a per row basis, the pixels 100 that are arranged in rows and columns, and function as connections which connect the gate line 21 and an external drive circuit, and input a signal from the external drive circuit to the gate line 21. Here, since the terminal 75 is disposed so as to cover one end of the relay line 76 that is exposed from the hole 77, it is possible to prevent the relay line 76 from coming into contact with moisture in air, and the like, and becoming oxidized.

In the same manner, the terminal-part (the part to the left of the break lines) 80 shown in FIG. 20 is formed at two places, namely, at both ends of the pixels 100 which continues in the column direction. A terminal 85 is formed in each of the terminal-parts 80 by covering the upper surface of the source line 22 with the conductive oxide film 160. In addition, the terminal 85 is exposed to the outside through a hole 86 penetrating through the passivation film 150 in the thickness direction.

Specifically, the terminal-parts 80 are provided, one each, at both ends of the source line 22 which connects, on a per column basis, the pixels 100 that are arranged in rows and columns, and function as connections which connect the source line 22 and an external drive circuit, and input a signal from the external drive circuit to the source line 22. Here, since the terminal 85 is disposed so as to cover the end of the source line 22 which is exposed from the hole 86, it is possible to prevent the source line 22 from coming into contact with moisture in the air and the like, and becoming oxidized.

Next, a method of manufacturing the thin-film transistor array device 20 according to Embodiment 2 shall be described with reference to FIG. 23A to 26C. It should be noted that FIG. 23A to FIG. 23G are diagrams showing a structure of the cross-section along XIX-XIX in FIG. 18 corresponding to manufacturing processes (a) to (f). FIG. 24A to FIG. 24C are diagrams showing details of the manufacturing process between FIG. 23F and FIG. 23G. FIG. 25A to FIG. 25H are diagrams showing a structure of the cross-section along XXI-XXI in FIG. 18 corresponding to manufacturing processes (a) to (f). FIG. 26A to FIG. 26C are diagrams showing details of the manufacturing process between FIG. 25G and FIG. 25H.

Figure 23A:
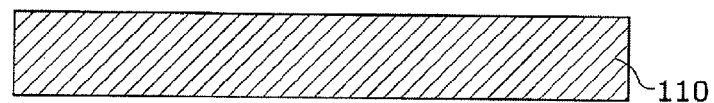
FIG. 23A is a diagram showing a structure of the cross-section along XIX-XIX in FIG. 18 corresponding to a manufacturing process (a) of the thin-film transistor array device according to Embodiment 2.
Figure 24A:
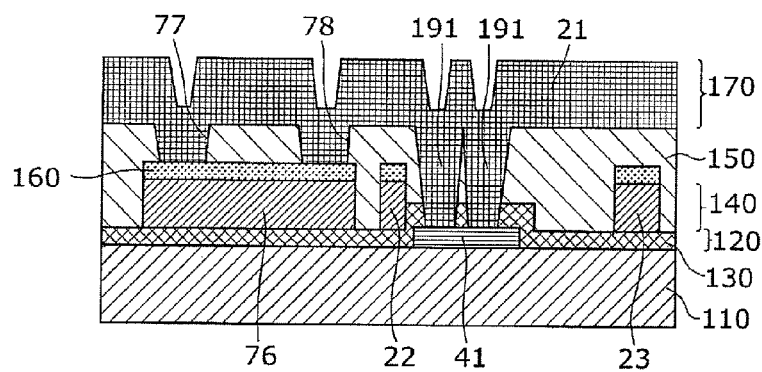
FIG. 24A is a diagram showing a structure of the cross-section along XIX-XIX in FIG. 18 corresponding to a part of a process of forming a terminal, a gate line, and a relay electrode.
Figure 24B:
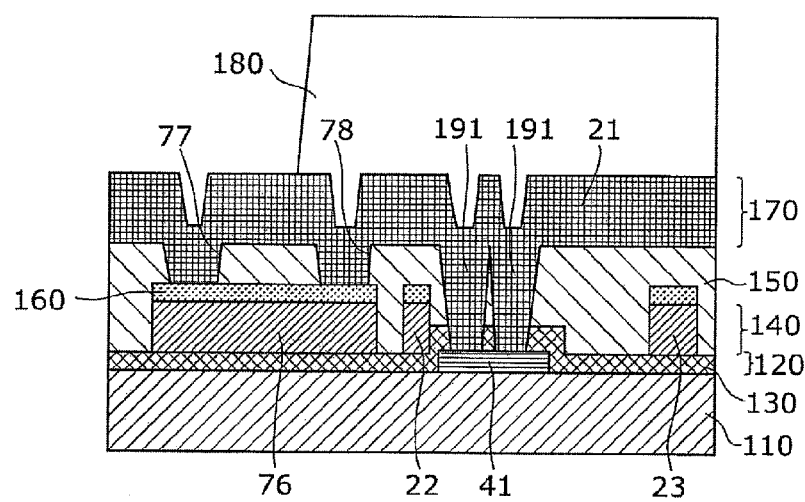
FIG. 24B is a diagram showing a structure of the cross-section along XIX-XIX in FIG. 18 corresponding to another part of the process of forming a terminal, a gate line, and a relay electrode.
Figure 24C:
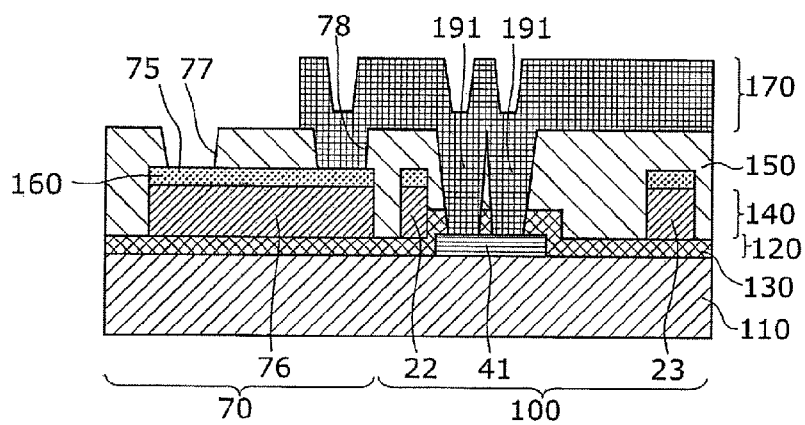
FIG. 24C is a diagram showing a structure of the cross-section along XIX-XIX in FIG. 18 corresponding to yet another part of the process of forming a terminal, a gate line, and a relay electrode.
Figure 25A:
FIG. 25A is a diagram showing a structure of the cross-section along XXI-XXI in FIG. 18 corresponding to the manufacturing process (a) of the thin-film transistor array device according to Embodiment 2.
Figure 26A:
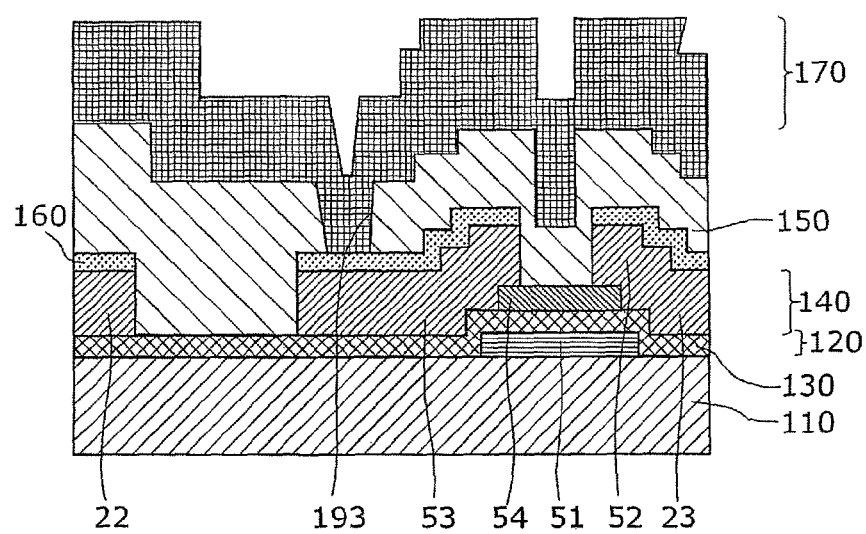
FIG. 26A is a diagram showing a structure of the cross-section along XXI-XXI in FIG. 18 corresponding to a part of the process of forming a terminal, a gate line, and a relay electrode.
Figure 26B:
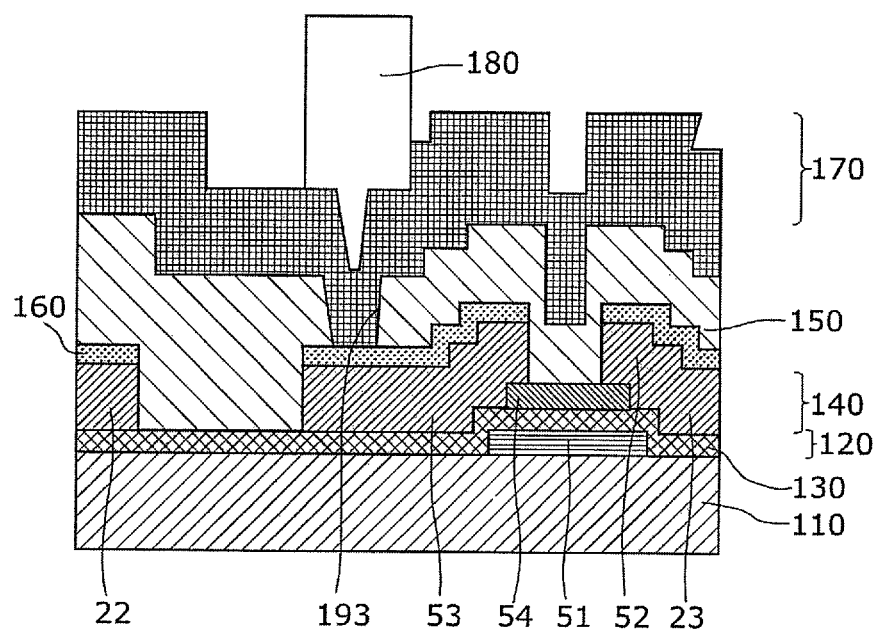
FIG. 26B is a diagram showing a structure of the cross-section along XXI-XXI in FIG. 18 corresponding to another part of the process of forming a terminal, a gate line, and a relay electrode.
Figure 26C:
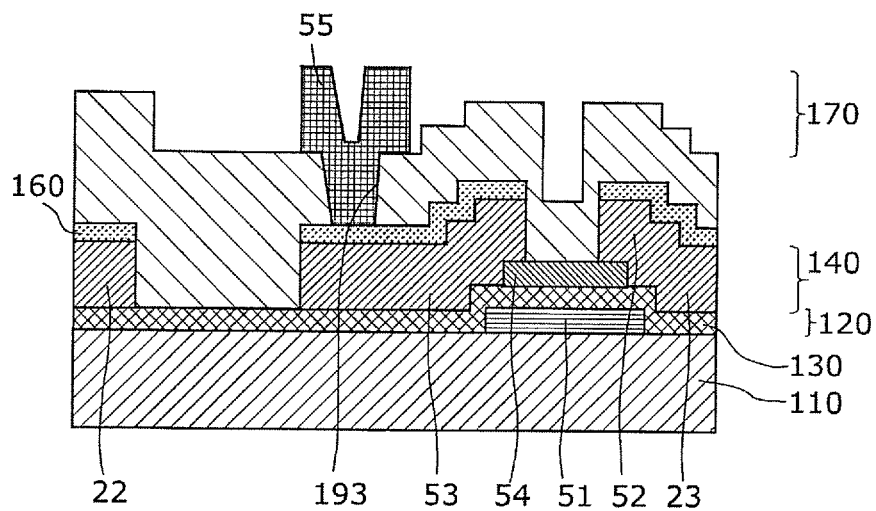
FIG. 26C is a diagram showing a structure of the cross-section along XXI-XXI in FIG. 18 corresponding to yet another part of the process of forming a terminal, a gate line, and a relay electrode.

First, as in manufacturing process (a) shown in FIG. 23A and FIG. 25A, the substrate 110 is prepared. An insulating material such as glass, quartz, and the like, are typically used for the substrate 110. In order to prevent the spread of impurities from the substrate 110, a silicon oxide film or a silicon nitride film not illustrated in the figures may be formed on the upper surface of the substrate 110. The film thickness is approximately 100 nm.

Figure 23B:
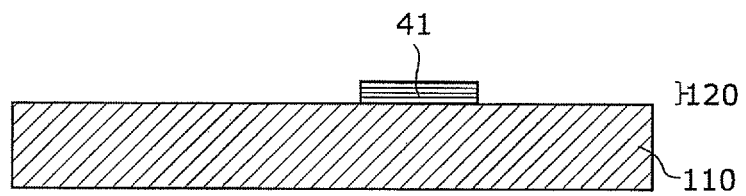
FIG. 23B is a diagram showing a structure of the cross-section along XIX-XIX in FIG. 18 corresponding to a manufacturing process (b) of the thin-film transistor array device according to Embodiment 2.
Figure 23C:
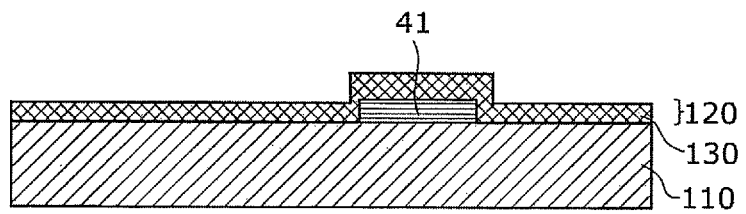
FIG. 23C is a diagram showing a structure of the cross-section along XIX-XIX in FIG. 18 corresponding to a manufacturing process (c) of the thin-film transistor array device according to Embodiment 2.
Figure 25B:
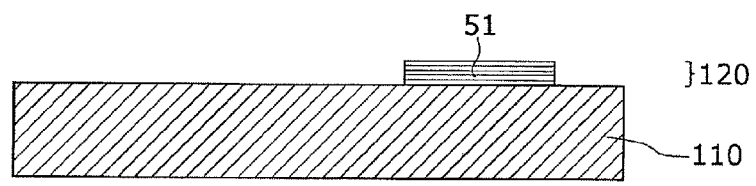
FIG. 25B is a diagram showing a structure of the cross-section along XXI-XXI in FIG. 18 corresponding to the manufacturing process (b) of the thin-film transistor array device according to Embodiment 2.
Figure 25C:
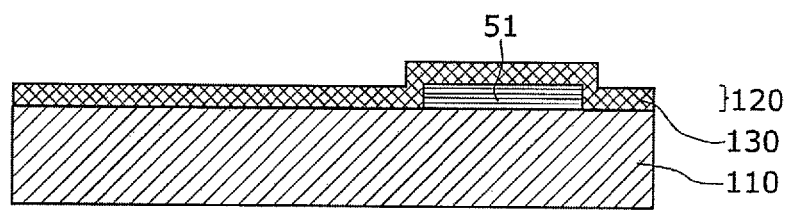
FIG. 25C is a diagram showing a structure of the cross-section along XXI-XXI in FIG. 18 corresponding to a part of the manufacturing process (c) of the thin-film transistor array device according to Embodiment 2.

Next, as in manufacturing process (b) shown in FIG. 23B and FIG. 25B, after the heat-resistant first metal layer 120 is formed on the substrate 110, patterning is performed by photolithography, etching, and the like, and the gate electrodes 41 and 51 are formed. Any one of Mo, W, Ta, Ti, and Ni, which are heat resistant, or an alloy of these is used as a material. Mo is used in Embodiment 2. A thickness of approximately 100 nm is preferable.

Next, as in manufacturing process (c) shown in FIG. 23C and FIG. 25C to FIG. 25E, the gate insulating film 130 is formed on the substrate 110 and the first metal layer 120, and a semiconductor layer is formed on the gate insulating film 130. It should be noted that the gate insulating film 130 and the semiconductor layer are formed successively by plasma CVD, and so on, without breaking the vacuum. A silicon oxide film, a silicon nitride film, or a composite film of these is formed as the gate insulating film 130. Thickness is approximately 200 nm. Furthermore, the semiconductor layer is an approximately 50 nm amorphous silicon film.

Figure 25D:
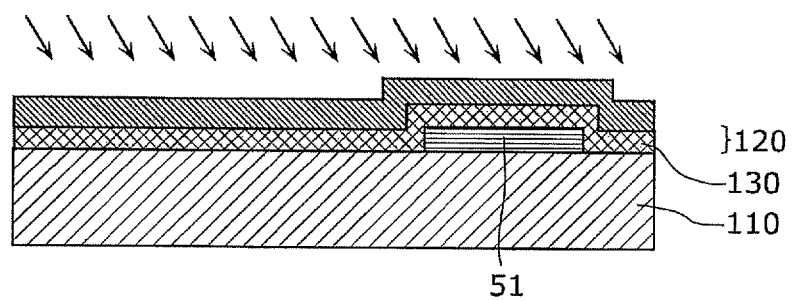
FIG. 25D is a diagram showing a structure of the cross-section along XXI-XXI in FIG. 18 corresponding to another part of the manufacturing process (c) of the thin-film transistor array device according to Embodiment 2.

Subsequently, for example, as indicated by the arrows in FIG. 25D, by irradiating an excimer laser, and the like, on the semiconductor layer, the semiconductor layer is reformed from an amorphous semiconductor layer to a polycrystalline semiconductor layer. As a crystallization method, for example, after performing dehydrogenation in a 400° C. to 500° C. furnace, crystallization is caused using an excimer laser, after which hydrogen plasma processing is performed in a vacuum over a few seconds to a few tens of seconds. More specifically, the amorphous semiconductor layer is crystallized by raising its temperature to within a predetermined temperature range, by irradiation with an excimer laser, and the like. Here, the predetermined temperature range is, for example, from 1100° C. to 1414° C.

Furthermore, average crystal grain size within the polycrystalline semiconductor ranges from 20 nm to 60 nm.

Here, since the first metal layer 120 which forms the gate electrodes 41 and 51 is exposed to high temperature in the above-described process, it is necessary to form the first metal layer 120 from a metal having a melting point that is higher than the upper limit (1414° C.) of the aforementioned temperature range. On the other hand, the second metal layer 140 and the third metal layer 170 that are stacked in subsequent processes may be formed from metal having a lower melting point than the lower limit (1100° C.) of the aforementioned temperature range.

Figure 25E:
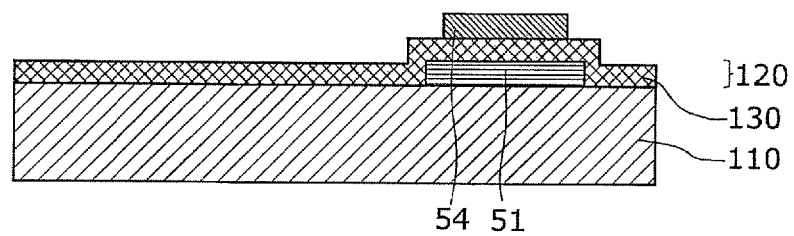
FIG. 25E is a diagram showing a structure of the cross-section along XXI-XXI in FIG. 18 corresponding to yet another part of the manufacturing process (c) of the thin-film transistor array device according to Embodiment 2.

Next, as shown in FIG. 25E, the semiconductor layer is formed into the island-shaped semiconductor films 44 and 54 using photolithography, etching, and so on. In addition, a second through-hole (not illustrated) is formed in the gate insulating film 130 likewise using photolithography, etching, and so on. The second through-hole later becomes the second contact hole 192.

Figure 23D:
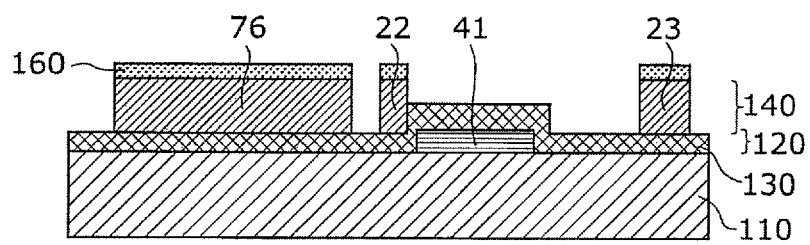
FIG. 23D is a diagram showing a structure of the cross-section along XIX-XIX in FIG. 18 corresponding to a manufacturing process (d) of the thin-film transistor array device according to Embodiment 2.
Figure 25F:
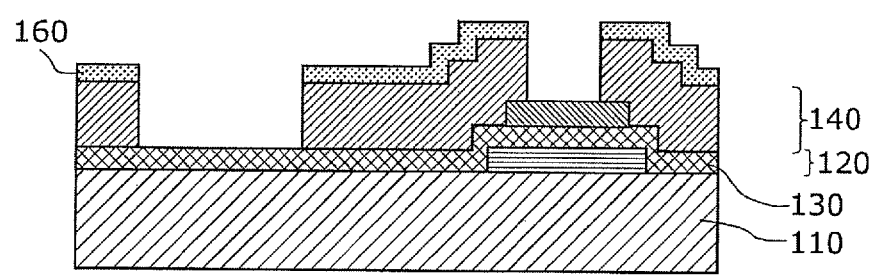
FIG. 25F is a diagram showing a structure of the cross-section along XXI-XXI in FIG. 18 corresponding to the manufacturing process (d) of the thin-film transistor array device according to Embodiment 2.

Subsequently, as in manufacturing process (d) shown in FIG. 23D and FIG. 25F, the second metal layer 140 and the conductive oxide film 160 are formed on the gate insulating film 130 and the semiconductor films 44 and 54, and then the source line 22, the power line 23, the source electrodes 42 and 53, the drain electrodes 43 and 52, and the relay line 76 are formed by patterning. At this time, the material making up the second metal layer 140 is also filled into the second through-hole (not illustrated), thereby forming the second contact hole 192. With this process, the gate electrode 51 and the drain electrode 43 are electrically connected via the second contact hole 192.

Any one of Al, Cu, and Ag, which are low-resistance metals, or an alloy of these is used as a material for the second metal layer 140. In Embodiment 2, Al is used and the thickness is approximately 300 nm.

Furthermore, the upper surfaces of the source line 22, the power line 23, the source electrodes 42 and 53, the drain electrodes 43 and 52, and the relay line 76 formed here are covered with the conductive oxide film 160. In view of this, the surface of the second metal layer 140 that is in contact with the conductive oxide film 160 is formed from a metal including at least one of copper, molybdenum, titanium, or tungsten. For example, the second metal layer 140 may be of a multilayered structure in which 30 nm of Al is formed after forming 50 nm of Mo as a barrier metal. When lower resistance is required, there are cases where Cu is used instead of Al (in this case, a barrier metal is unnecessary). Furthermore, increasing the thickness can realize further lower resistance.

Furthermore, the material making up the conductive oxide film 160 is an oxide layer including indium and tin or an oxide film including indium and zinc. In addition, the material making up the third metal layer 170 described later may be of the same metal as the second metal layer 140 since low resistance is required.

Furthermore, typically, a low-resistance semiconductor layer which is not illustrated is formed between the source electrode 42 and the semiconductor film 44 and between the drain electrode 43 and the semiconductor film 44. An amorphous silicon layer that is doped with an N-type dopant such as phosphorous or an amorphous layer doped with a P-type dopant such as boron is typically used for this low-resistance semiconductor layer. Thickness is approximately 20 nm. A semiconductor layer of amorphous silicon and the like may be additionally formed between the crystallized semiconductor film 44 and the doped crystalline silicon layer. There are cases where these films are required in order to improve device characteristics. The same is done for the semiconductor film 54.

Figure 23E:
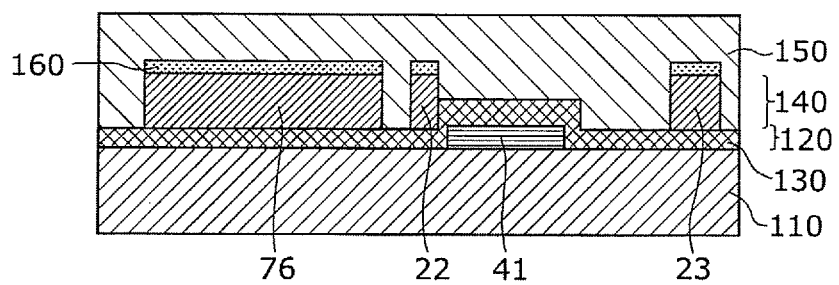
FIG. 23E is a diagram showing a structure of the cross-section along XIX-XIX in FIG. 18 corresponding to a part of a manufacturing process (e) of the thin-film transistor array device according to Embodiment 2.
Figure 23F:
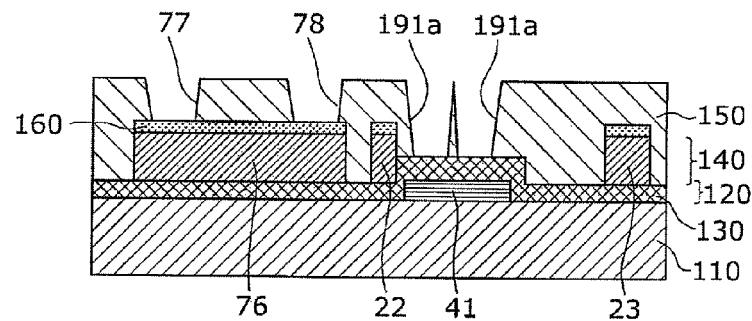
FIG. 23F is a diagram showing a structure of the cross-section along XIX-XIX in FIG. 18 corresponding to another part of the manufacturing process (e) of the thin-film transistor array device according to Embodiment 2.
Figure 25G:
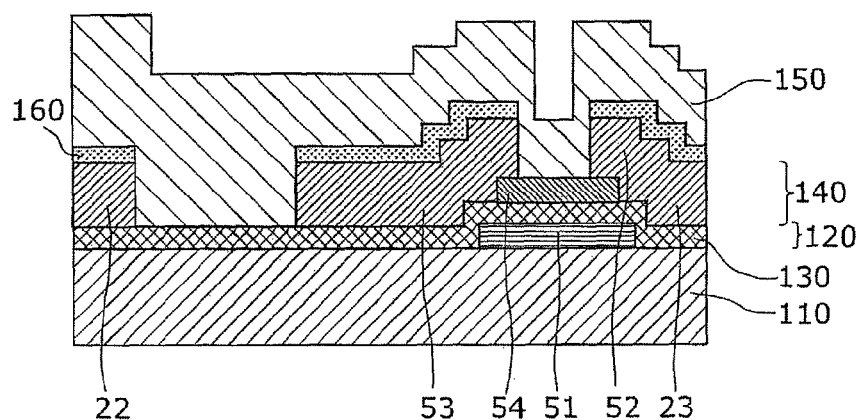
FIG. 25G is a diagram showing a structure of the cross-section along XXI-XXI in FIG. 18 corresponding to the manufacturing process (e) of the thin-film transistor array device according to Embodiment 2.

Subsequently, as in manufacturing process (e) shown in FIG. 23E, FIG. 23F, and FIG. 25G, the passivation film 150, which comprises an oxide film (for example a silicon oxide film), a nitride film (for example a silicon nitride film), or a laminated film of such films, is formed on the gate insulating film 130, the semiconductor films 44 and 54, and the second metal layer 140 that is covered with the conductive oxide film 160. Furthermore, the following holes are formed in the passivation film 150 by photolithography, etching, and so on: a first through-hole 191a which successively penetrates through the gate insulation layer 130 and the passivation film 150; the third through-hole (not illustrated), and the holes 77, 78, 86 which penetrate through the passivation film 150 in the thickness direction The first through-hole 191a later becomes the first contact hole 191, and the third through-hole later becomes the third contact hole 193. It should be noted that the passivation film 150 is not limited to an inorganic film such as the aforementioned oxide film or nitride film, and may be an organic film comprising an acrylic or amide-based photosensitive resin.

Here, materials and the thickness of the gate insulating film 130 and the passivation film 150 are determined so that the per unit area capacitance formed in the passivation film 150 disposed between the second metal layer 140 and the third metal layer 170 is smaller than the per unit area capacitance formed in the gate insulating film 130 disposed between the first metal layer 120 and the second metal layer 140. More specifically, it is preferable that the per unit area capacitance formed in the passivation film 150 be below $1.5 \times 10^{-4}$ (F/m$^2$). Meanwhile, it is preferable that the per unit area capacitance formed in the passivation film 150 be equal to or greater than $1.5 \times 10^{-4}$ (F/m$^2$).

Figure 23G:
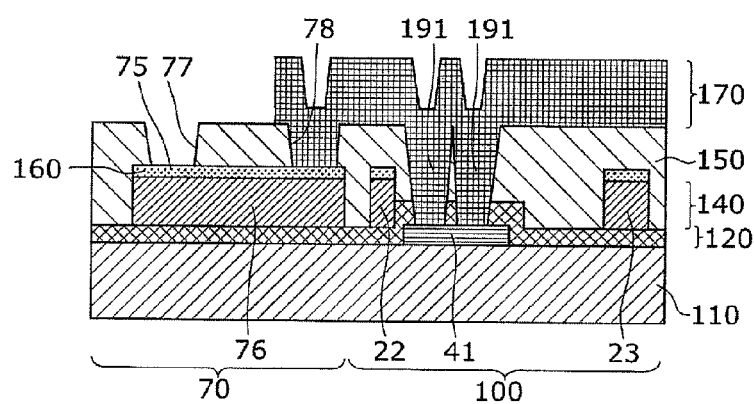
FIG. 23G is a diagram showing a structure of the cross-section along XIX-XIX in FIG. 18 corresponding to a manufacturing process (f) of the thin-film transistor array device according to Embodiment 2.
Figure 25H:
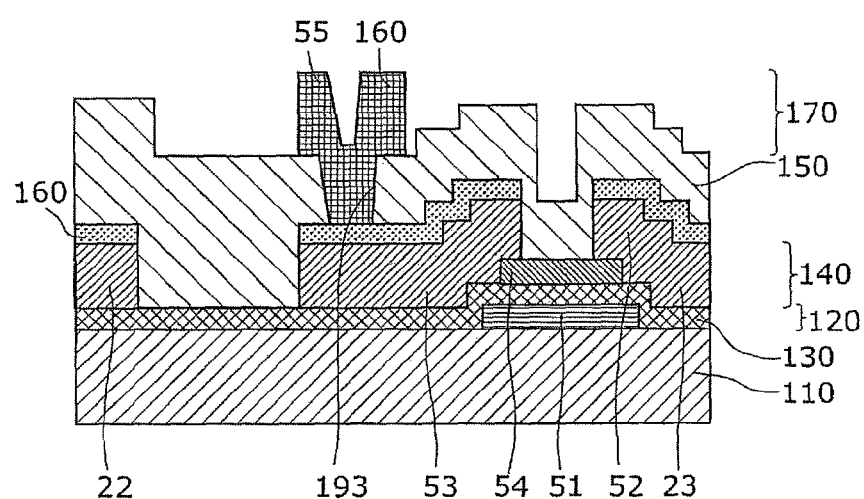
FIG. 25H is a diagram showing a structure of the cross-section along XXI-XXI in FIG. 18 corresponding to the manufacturing process (f) of the thin-film transistor array device according to Embodiment 2.

In addition, as in manufacturing process (f) shown in FIG. 23G and FIG. 25H, the third metal layer 170 is formed on the passivation film 150. Then, the third metal layer 170 is formed into the gate line 21 and the relay electrode 55 by patterning. The process of forming the gate line 21 and the relay electrode 55 shall be described later using FIG. 24A to FIG. 24C and FIG. 26A to FIG. 26C.

At this time, the material making up the third metal layer 170 is also filled into the first and third through-holes (not illustrated), thereby forming the first contact hole 191 and the third contact hole 193. With this, the gate line 21 and the gate electrode 41 are electrically connected via the first contact hole 191, and the source electrode 53 and the relay electrode 55 are electrically connected via the third contact hole 193.

Next, the process of forming the gate line 21 and the relay electrode 55 shall be described in detail with reference to FIG. 24A to FIG. 24C and FIG. 26A to FIG. 26C.

First, as shown in FIG. 24A and FIG. 26A, the third metal layer 170 is formed on the passivation film 150. In this process, the third metal layer 170 is formed on the entire surface of the pixel 100.

Next, as shown in FIG. 24B and FIG. 26B, the photosensitive resist film 180 is formed on the third metal layer 170. The photosensitive resist film 180 is formed at a position that overlaps the parts that are to become the gate line 21 and the relay electrode 55 after processing. Meanwhile, the photosensitive resist film 180 is not formed on the rest of the regions, that is, the part from which the third metal layer 170 is to be eventually removed.

Next, as shown in FIG. 24C and FIG. 26C, the gate line 21 and the relay electrode 55 are patterned by etching. Specifically, the third metal layer 170 remains in the position of the photosensitive resist film 180. Here the remaining third metal layer 170 becomes the gate line 21 and the relay electrode 55. In other words, the gate line 21 and the relay electrode 55 are formed from the same material. On the other hand, the third metal layer 170 is removed at a position in which the photosensitive resist film 180 is not formed.

Next, although illustration has been omitted, a method of manufacturing the organic EL display 10 according to Embodiment 2 shall be described. Specifically, a method of sequentially stacking the interlayer insulating film 11, the banks 15, the anode 12, the organic EL layer 13, and the transparent cathode 14 on the thin-film transistor array device 20 shall be described.

First, the interlayer insulating film 11 is formed on the third metal layer 170. Subsequently, a fourth through-hole (not illustrated) penetrating through the interlayer insulating film 11 is formed by photolithography, etching, and so on. The fourth through-hole later becomes the fourth contact hole 194.

Next, the banks 15 are formed at positions on the interlayer insulating film 11 that correspond to the boundaries of the respective pixels 100. In addition, the anode 12 is formed on the interlayer insulating film 11, inside the openings formed by the banks 15, for each of the pixels 100. At this time, the material making up the anode 12 is filled into the fourth through-hole, thereby forming the fourth contact hole 194. The anode 12 and the relay electrode 55 are electrically connected via the fourth contact hole 194.

The material of the anode 12 is, for example, any one of: a conductive metal such as molybdenum, aluminum, gold, silver, copper or an alloy of these; an organic conductive material such as PEDOT: PSS; zinc oxide or lead indium oxide. A film formed from any of these materials is created by vacuum deposition, RF sputtering, or printing, and an electrode pattern is formed.

The organic EL layer 13 is formed on the anode 12 and inside the opening formed by the banks 15, for each color (subpixel column) or each sub pixel. The organic EL layer 13 is configured by stacking the respective layers of a hole injection layer, a hole transport layer, a light-emitting layer, an electron transport layer, an electron injection layer, and so on. For example, it is possible to use copper phthalocyanine for the hole injection layer, a-NPD (Bis[N-(1-Naphthyl)-N-Phenyl]benzidine) for the hole transport layer, Alq3 (tris (8-hydroxyquinoline) aluminum) for the light-emitting layer, an oxazole derivative for the electron transport layer, and Alq3 for the electron injection layer. It should be noted that these materials are but one example and that other materials may be used.

The transparent cathode 14 is a permeable electrode that is continuously formed on the organic EL layer 13. The material of the transparent cathode 14 is, for example, ITO, SnO2, In2O3, ZnO, or a combination of these.

(Modifications)

Figure 27:
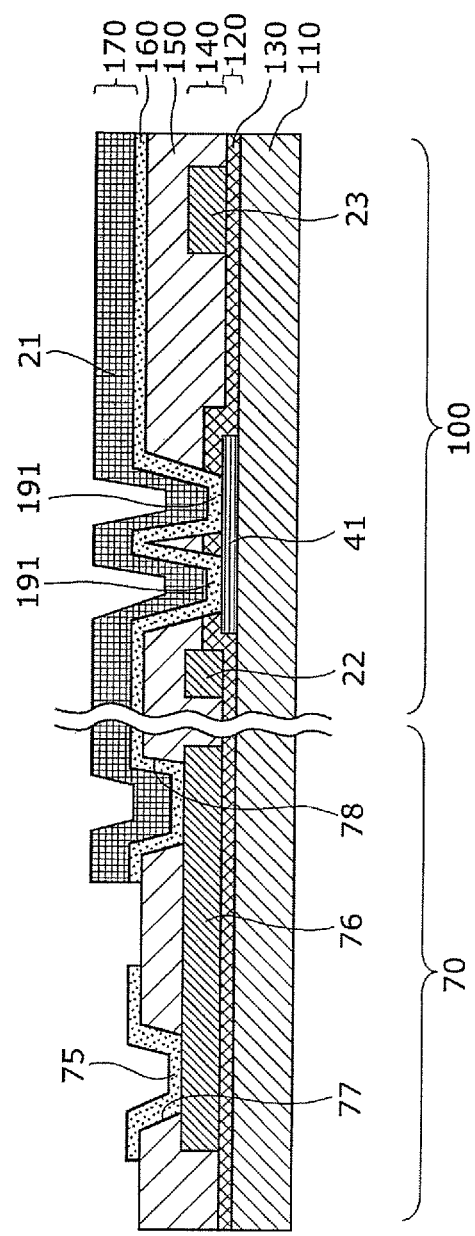
FIG. 27 is a diagram showing a cross-sectional structure corresponding to FIG. 19 of the thin-film transistor array device according to Embodiment 2.
Figure 28A:
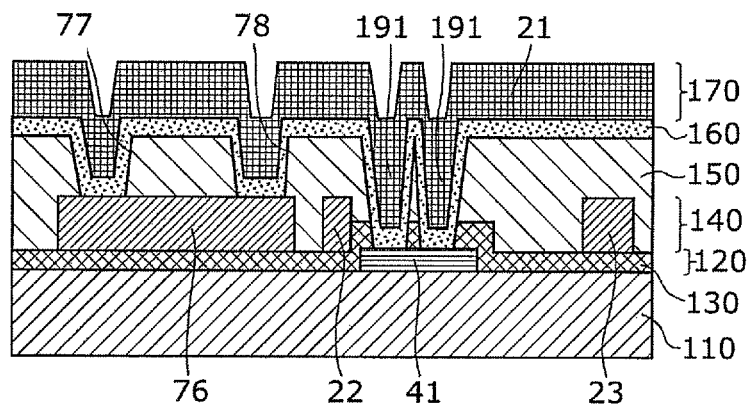
FIG. 28A is a diagram showing a part of a manufacturing process of the thin-film transistor array device shown in FIG. 27.
Figure 28B:
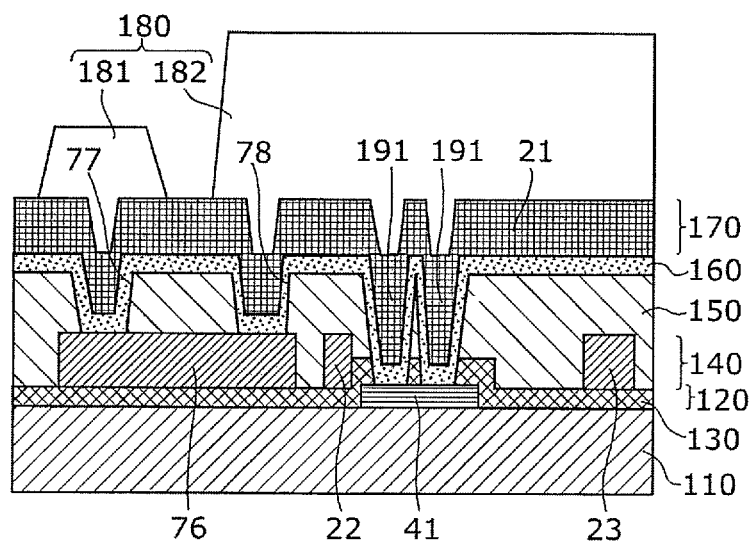
FIG. 28B is a diagram showing a part of the manufacturing process of the thin-film transistor array device shown in FIG. 27.

Next, a modification of the thin-film transistor array device 20 according to Embodiment 2 shall be described with reference to FIG. 27, FIG. 28A, and FIG. 28B. FIG. 27 is a cross-sectional view of the thin-film transistor array device according to the modification, and is a diagram corresponding to FIG. 19. FIG. 28A and FIG. 28B are diagrams showing a manufacturing process of the thin-film transistor array device according to the modification, and are diagrams corresponding to FIG. 24A and FIG. 24B, respectively.

In the thin-film transistor array device shown in FIG. 27, the positional relationship between the passivation film 150 and the conductive oxide film 160 is different from that in FIG. 19. Specifically, in FIG. 27, the conductive oxide film 160 is stacked on the passivation film 150. However, as in FIG. 19, the terminal-part 80 is covered with the conductive oxide film 160. Furthermore, although illustration has been omitted, the conductive oxide film 160 is also interposed between the source electrode 53 and the relay electrode 55. In other words, even when the configuration shown in FIG. 27 is adopted, the same advantageous effect as that in FIG. 19 can be obtained.

In the case of manufacturing the thin-film transistor array device shown in FIG. 27, there is a method (half-tone process) in which the conductive oxide film 160 and the third metal layer 170 are simultaneously processed using a half-tone mask, as shown in FIG. 28A and FIG. 28B.

First, as shown in FIG. 28A, the conductive oxide film 160 and the third metal layer 170 are formed above the passivation film 150. In this process, the conductive oxide film 160 and the third metal layer 170 are formed on the entire surface of the pixel 100.

Next, as shown in FIG. 28B, the photosensitive resist film 180 is formed on the third metal layer 170. The photosensitive resist film 180 includes a relatively thin first photosensitive resist film 181 and a relatively thick second photosensitive resist film 182.

The first photosensitive resist film 181 is formed at a position that overlaps the parts that are to become the terminals 75 and 85 after processing (terminal 85 is not illustrated). On the other hand, the second photosensitive resist film 182 is formed at a position that overlaps the parts that are to become the gate line 21 and the relay electrode 55 after processing (relay electrode 55 is not illustrated). Meanwhile, the photosensitive resist film 180 is not formed on the rest of the regions, that is, the part from which the conductive oxide film 160 and the third metal layer 170 are to be eventually removed.

Subsequently, the terminals 75 and 85, the gate line 21, and the relay electrode 55 are patterned on the multilayered structure shown in FIG. 28B, by etching. Specifically, in the position of the first photosensitive resist film 181, the third metal layer 170 is removed, and only the conductive oxide film 160 remains. Here, the remaining conductive oxide film 160 becomes the terminals 75 and 85. On the other hand, in the position of the second photosensitive resist film 182, conductive oxide film 160 and the third metal layer 170 remain. Here the remaining conductive oxide film 160 and third metal layer 170 become the gate line 21 and the relay electrode 55. In other words, the gate line 21 and the relay electrode 55 are formed from the same material.

In this manner, when manufacturing the thin-film transistor array device according to the modification, it is necessary to use a complicated method such as the half-tone process. On the other hand, when the conductive oxide film 160 and the third metal layer 170 are to be processed separately, the number of manufacturing steps further increases. This due to the co-existence of a region in which the conductive oxide film 160 and the third metal layer 170 are stacked, as in the pixel 100 shown in FIG. 27, and a region composed of only the conductive oxide film 160, as in the terminal-part 80 shown in FIG. 27.

In contrast, in the thin-film transistor array device 20 according to Embodiment 2, the second metal layer 140 and the conductive oxide film 160 are stacked in all of the regions. Stated differently, the conductive oxide film 160 always remains in a region in which the second metal layer 140 remains. Stated differently, at all times, the conductive oxide film 160 also remains in a region in which the second metal layer 140 remains. As such, simple manufacturing is possible even without using the half-tone process, and the like, described in FIG. 28A and FIG. 28B.

Specifically, comparing Embodiment 2 and the modification, it can be seen that although the advantageous effect that can be obtained by stacking the conductive oxide film 160 is common, manufacturing is significantly easier with Embodiment 2.

Figure 29:
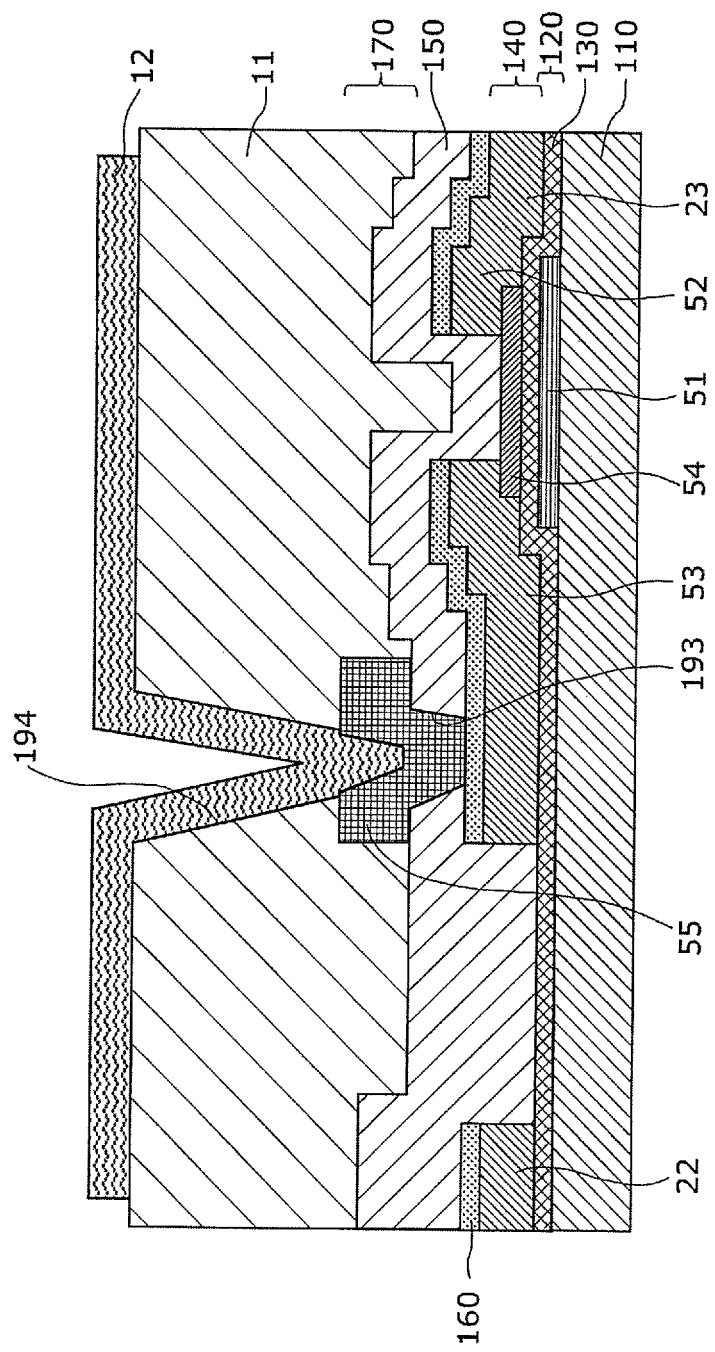
FIG. 29 is a diagram showing a modification of FIG. 21.
Figure 30:
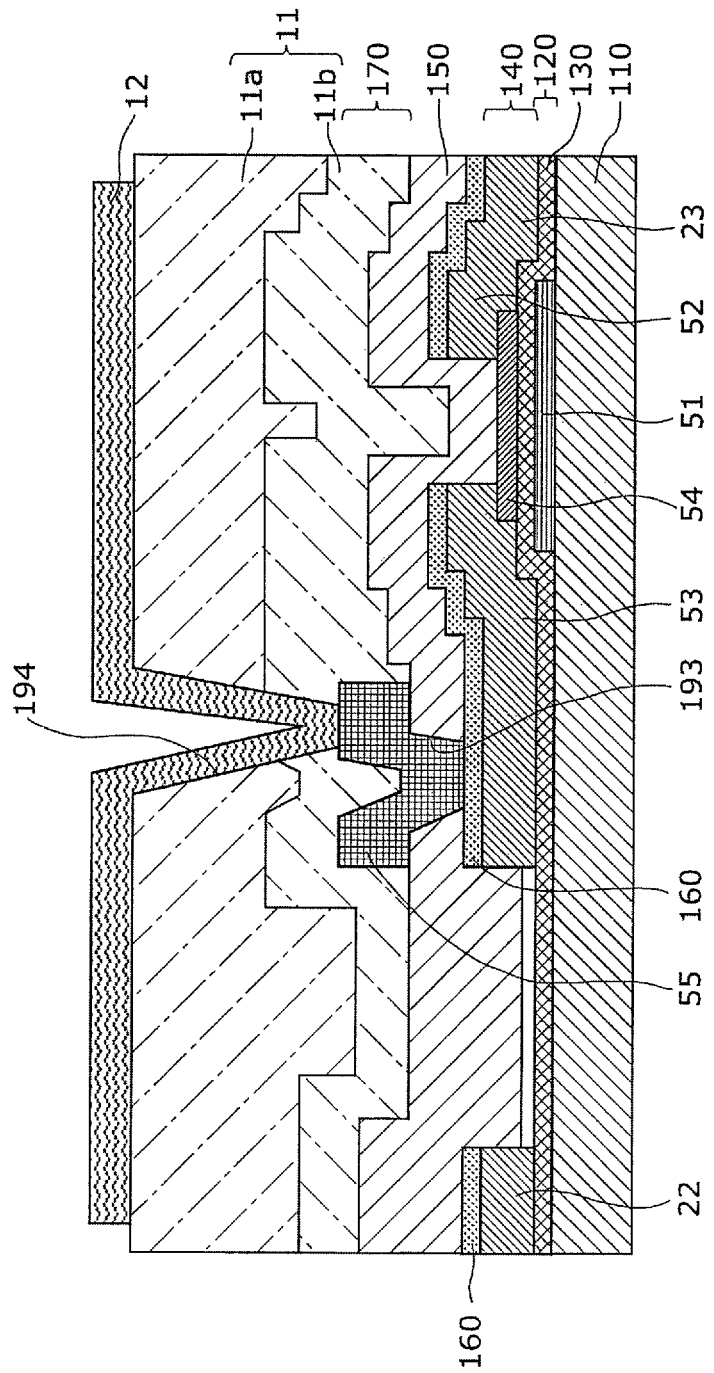
FIG. 30 is a diagram showing another modification of FIG. 21.

Next, a modification of FIG. 27 shall be described with reference to FIG. 29 to FIG. 31. FIG. 29 shows an example in which the anode 12 is electrically connected to the center region of the relay electrode 55. Furthermore, FIG. 30 shows an example in which the interlayer insulating film 11 includes two layers composed of the organic film 11a and the inorganic film 11b. Here, the organic film 11a is disposed on the side of the interlayer film 11 that is in contact with the anode 12 (upper layer), and the inorganic film 11b is disposed on the side that is in contact with the gate line 21 and the relay electrode 55 (lower layer).

Figure 31:
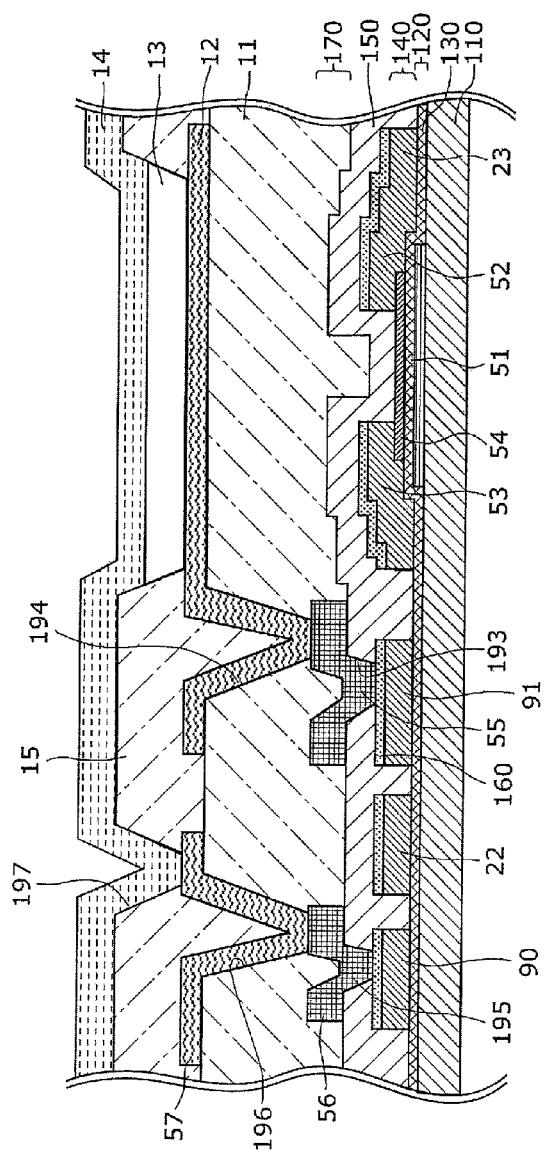
FIG. 31 is a diagram showing yet another modification of FIG. 21.
Figure 32:
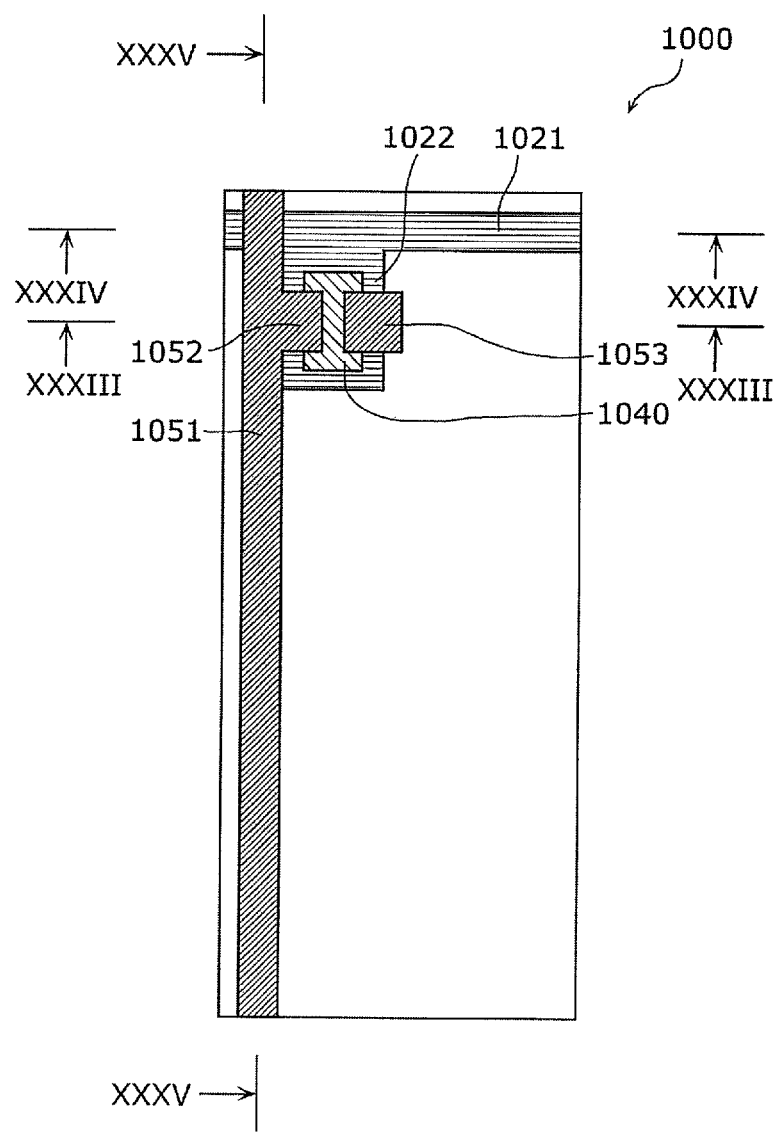
FIG. 32 is a front view showing a configuration of a conventional pixel.
Figure 33:
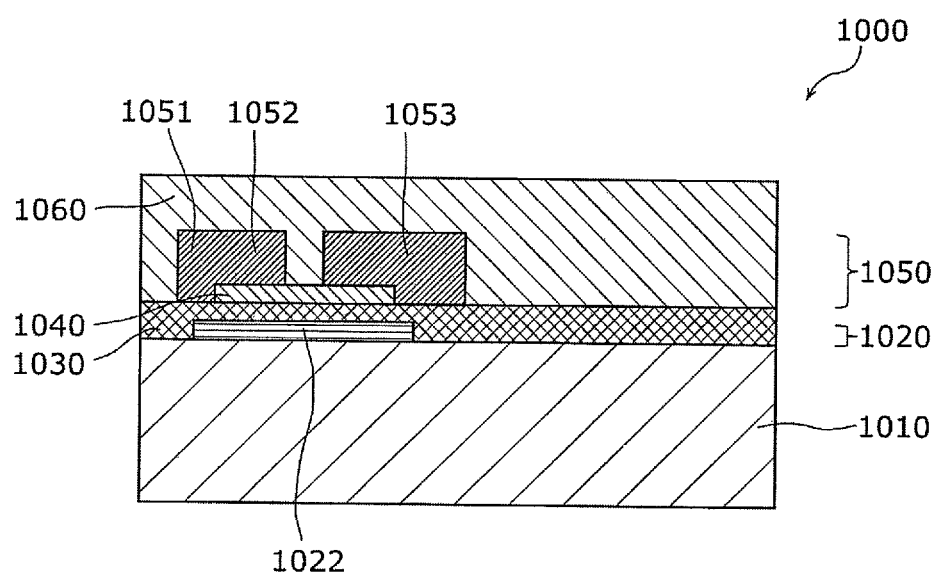
FIG. 33 is a cross-sectional view along XXXIII-XXXIII in FIG. 32.
Figure 34:
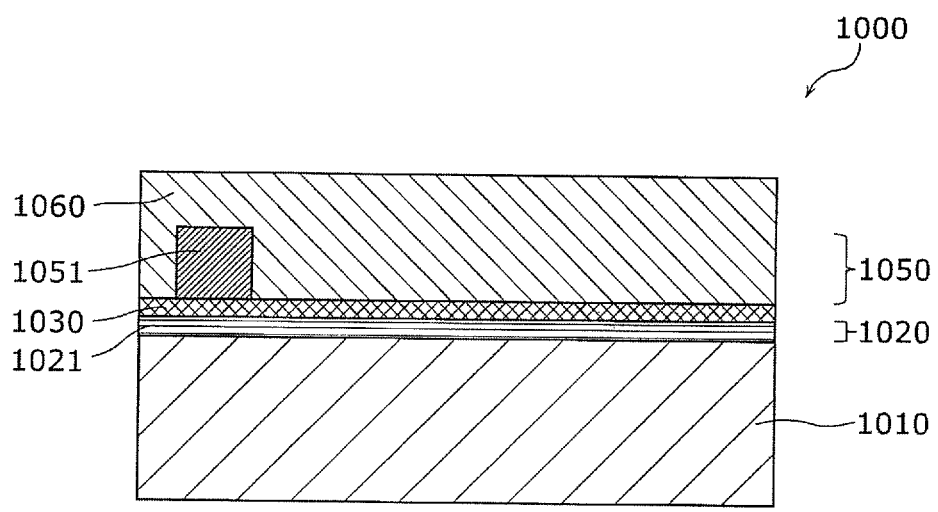
FIG. 34 is a cross-sectional view along XXXIV-XXXIV in FIG. 32.
Figure 35:
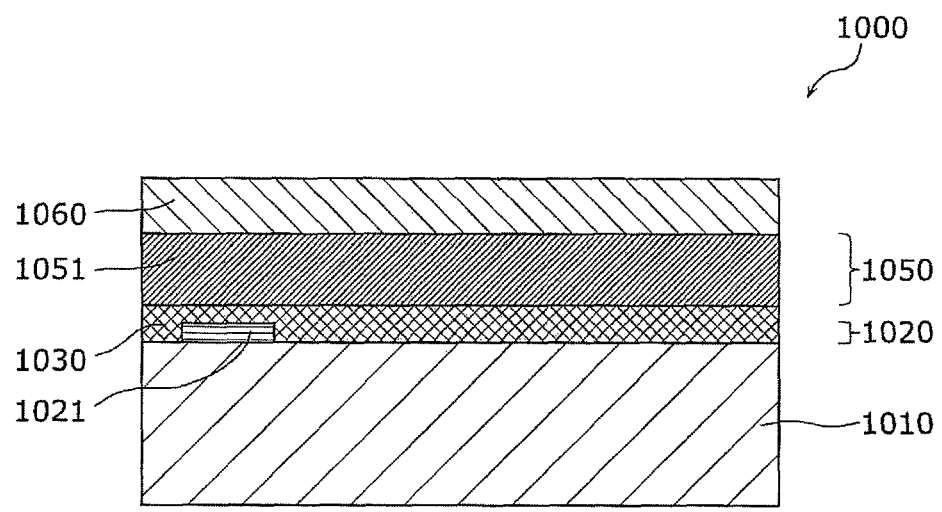
FIG. 35 is a cross-sectional view along XXXV-XXXV in FIG. 32.
Figure 36:
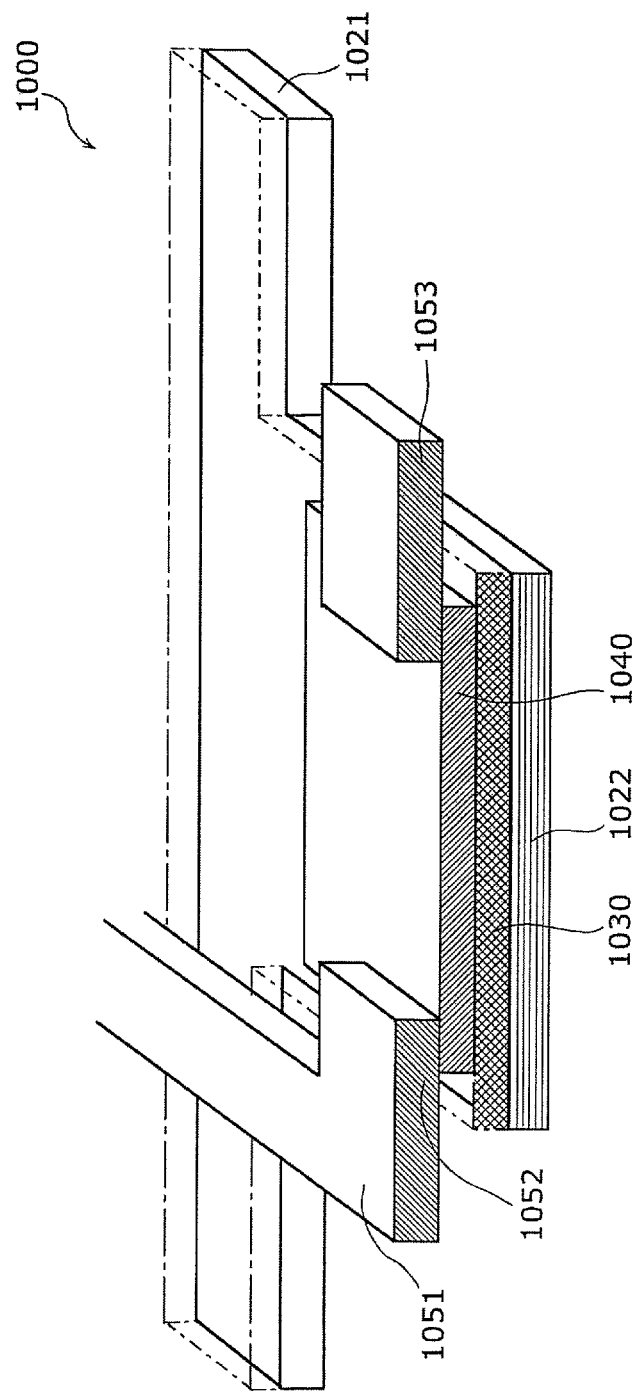
FIG. 36 is perspective view of main parts as seen from the cross-section along XXXIII-XXXIII in FIG. 32.

In addition, the thin-film transistor array device shown in FIG. 31 includes, in addition to the configuration in FIG. 21, the second relay electrode 56, the third relay electrode 57, the auxiliary line 90, and the auxiliary electrode 91. Furthermore, the organic EL layer 13, the transparent cathode 14, and the bank 15 are shown in FIG. 31 to clarify the positional relationships.

Each of the auxiliary lines 90 is formed in the second metal layer 140. Furthermore, the auxiliary lines 90 are arranged in columns running parallel to the source lines 22, and the respective auxiliary lines 90 are connected at both ends of the device. In addition, the upper surface of the auxiliary line 90 is covered with the conductive oxide film 160.

The second relay electrode 56 is formed in the third metal layer 170 for each pixel. In addition, the second relay electrode 56 is electrically connected to the auxiliary line 90 via a fifth contact hole 195 penetrating through the passivation film 150 in the thickness direction.

The third relay electrode 57 is formed for each pixel, in the same layer as the anode 12 and using the same material as the anode 12. In addition, the third relay electrode 57 is electrically connected to the second relay electrode 56 via a sixth contact hole 196 penetrating through the interlayer insulating film 11 in the thickness direction.

In addition, the transparent cathode 14 is electrically connected to the third relay electrode 57 via a seventh contact hole 197 penetrating through the bank 15 in the thickness direction. Specifically, the second relay electrode 56 and the third relay electrode 57 serve as relays between the auxiliary line 90 and the transparent cathode 14. With this, the connection resistance of the transparent cathode 14 to the auxiliary line 90 can be reduced over a long period of time.

It should be noted that, in the example in FIG. 31, the relay electrode 55 (first relay electrode) is not directly connected to the source electrode 53, and is connected to the auxiliary electrode 91. The auxiliary electrode 91 is formed in the second metal layer 140 for each pixel. Furthermore, the upper surface of the auxiliary electrode 91 is covered with the conductive oxide film 160. In addition, the auxiliary electrode 91 is electrically connected to the relay electrode 55 and is electrically connected to the source electrode 53 at a cross-section different from that in FIG. 31. However, the connection destination of the auxiliary electrode 91 may be the drain electrode 52.

In this manner, the relay electrode provided in the second metal layer 140 is not limited to the relay electrode 55 which directly or indirectly connects the anode 12 and the source electrode 53 or the drain electrode 52, and the second relay electrode 56 which directly or indirectly connects the transparent cathode 14 and the auxiliary line 90 may be provided. Specifically, it is sufficient that the relay electrode formed in the second metal layer 140 be a relay electrode that connects (serves as a relay between) a first conductive member formed in the second metal layer 140 (the source electrode 53 or the auxiliary line 90, in the example in FIG. 31) and a second conductive member formed above the interlayer insulating film 11 (the anode 12 or the transparent cathode 14, in the example in FIG. 31).

It should be noted that one or both of the second relay electrode 56 and the third relay electrode 57 can be a line running in the row direction at the forward-end and deep-end of FIG. 31 for example. With this, the second relay electrode 56 and the third relay electrode 57, combined with the auxiliary lines 90 arranged in columns, can function as auxiliary lines running two-dimensionally. This results in a more suitable form for realizing, in an ultra-large display panel, the reduction of power consumption through reduced resistance of power lines and the reduction of crosstalk during window pattern display.

It should be noted that although the Embodiments 1 and 2 show the case where two TFTs are included in the pixel 100, the applicable range of the present invention is not limited to such case. The same configuration can be applied in the case where a pixel 100 includes plural (three or more) TFTs in order to compensate for TFT variation within the pixel 100.

Furthermore, although a pixel configuration for driving the organic EL element is shown in Embodiments 1 and 2, the present invention is not limited to such configuration. The present invention can be applied to all thin-film transistor array devices 20 configured using a TFT, such as liquid crystals, inorganic ELs, and so on.

Furthermore, a EL display device equipped with the organic EL display panel in Embodiments 1 and 2 is capable of displaying images with high picture quality, without image signal deterioration. In other words, the present invention can be applied to an EL display device.

Furthermore, Embodiment 1 shows an example in which, among the first metal layer 120, the second metal layer 140, and the third metal layer 170 which are adjacent to each other in the stacking direction, the gate electrodes 41 and 51 are formed in the first metal layer 120, the gate line 21 (first line) is formed in the second metal layer 140, and the source line 22 and the power line 23 (second line) are formed in the third metal layer 170. Furthermore, Embodiment 2 shows an example in which, among the first metal layer 120, the second metal layer 140, and the third metal layer 170 which are adjacent to each other in the stacking direction, the gate electrodes 41 and 51 are formed in the first metal layer 120, the source line 22 and the power line 23 (first line) are formed in the second metal layer 140, and the gate line 21 (second line) is formed in the third metal layer 170. However, the applicable range of the present invention is not limited to such cases. Specifically, even when a metal layer is further formed between the first metal layer 120 and the second metal layer 140 and between the second metal layer 140 and the third metal layer 170, the advantageous effect of the present invention can be obtained as long as the gate line 21, the source line 22, and the power line 23 are disposed on a metal layer that is above the gate electrodes 41 and 51.

Furthermore, although the Embodiments 1 and 2 show examples of bottom-gate thin-film transistors, the applicable range of the present invention is not limited to such case. In other words, the present invention can be also applied to top-gate thin-film transistors.

Furthermore, although Embodiments 1 and 2 show examples of the top-emission organic EL display 10, the applicable range of the present invention is not limited to such case. For example, it is also acceptable to have a bottom-emission organic EL display in which the upper electrode is a reflecting electrode, and the lower electrode is a transparent electrode (a transparent conductive film such as ITO).

Furthermore, the relay electrode 55 shown in FIG. 7, FIG. 15 to FIG. 17, FIG. 21, FIG. 29 to FIG. 31, and so on, may be formed on an entire surface below the anode 12. Specifically, the relay electrode 55 may be disposed between the interlayer insulating film 11 and the anode 12 so that the interlayer insulating film 11 and the anode 12 do not come into direct contact. With this, it is possible to prevent the oxidation, corrosion, and so on, of the anode 12 due to the oxygen, moisture, and so on, from the interlayer insulation film 11 which is formed from resin. By adopting the above-described configuration, it is possible to prevent deterioration of reflectance and increase of electrical resistance of the anode 12 caused by oxidation, corrosion, and so on, in the case where the anode is formed from Al for example. As a result, a display panel having an even longer operating life can be realized.

Although the embodiments of the present invention are described with reference to the Drawings, the present invention is not limited to the illustrated embodiments. Various adjustments and modifications may be added to the illustrated embodiments within a scope that is the same as that of the present invention or within an equivalent scope.

INDUSTRIAL APPLICABILITY

The image display device use thin-film transistor array device according to the present invention is useful as a driving backplane used in an organic EL display device, a liquid crystal display device, and so on.

What is claimed is:

1. A thin-film transistor array device that is stacked with an electroluminescence layer, with an interlayer insulating film interposed between the electroluminescence layer and the thin-film transistor array device, the thin-film transistor array device comprising:
   a substrate;
   a first line above the substrate;
   a second line crossing the first line;
   a first transistor above the substrate and including a gate electrode, a first electrode, and a second electrode;
   a second transistor above the substrate;
   a passivation film between the interlayer insulating film and both the first transistor and the second transistor;
   a conductive oxide film below the passivation film; and
   a relay electrode above the passivation film, the relay electrode being a relay between a first conductive material in a same layer as the first electrode and a second conductive material in the electroluminescence layer, the relay electrode being electrically connected to the first conductive material via a first hole in the passivation film,
   wherein the first transistor and the second transistor are bottom-gate transistors,
   the first line is below the passivation film and electrically connected to one of the gate electrode and the first electrode, the first line being in the same layer as the first electrode,
   the second line is above the passivation film and electrically connected to an other of the gate electrode and the first electrode, the second line being in a different layer than the first electrode,
   a terminal to which an external signal is input is in a periphery of the substrate and in the same layer as the first electrode, the external signal being for driving one of the first line and the second line,
   the conductive oxide film covers an upper surface of the terminal and is between the relay electrode and the first conductive material at least at a bottom of the first hole, the conductive oxide film electrically connecting the relay electrode and the first conductive material, and
   the relay electrode is in a same layer as the second line above the passivation film and comprises a same material as the second line.

2. The thin-film transistor array device according to claim 1,
   wherein the first line is electrically connected to the gate electrode, and
   the second line is electrically connected to the first electrode.

3. The thin-film transistor array device according to claim 1,
wherein the first line is electrically connected to the first electrode, and
the second line is electrically connected to the gate electrode.

4. The thin-film transistor array device according to claim 1,
wherein the second conductive material is a metal primarily comprising aluminum.

5. The thin-film transistor array device according to claim 1,
wherein the relay electrode includes a surface that is in contact with the conductive oxide film and comprises a metal that includes at least one of copper, molybdenum, titanium, and tungsten.

6. The thin-film transistor array device according to claim 1,
wherein the relay electrode includes a multilayered structure.

7. The thin-film transistor array device according to claim 1,
wherein the interlayer insulating film includes an organic film layer and an inorganic film layer, and
the inorganic film layer covers the second line and the relay electrode.

8. The thin-film transistor array device according to claim 1,
wherein the first transistor and the second transistor each include a crystalline semiconductor layer, and
the gate electrode of the first transistor and a second gate electrode of the second transistor comprise a first metal having higher heat-resistance than a second metal of the one of the first line and the second line that is electrically connected to the gate electrode of the first transistor.

9. The thin-film transistor array device according to claim 8,
wherein the first metal includes one of molybdenum, tungsten, titanium, tantalum, and nickel.

10. The thin-film transistor array device according to claim 1,
wherein the conductive oxide film comprises indium and one of tin and zinc.

11. An electroluminescence display panel, comprising:
an upper electrode;
a lower electrode;
an electroluminescence layer including an electroluminescence light-emitting element that includes a light-emitting function layer between the upper electrode and the lower electrode;
a thin-film transistor array device for controlling the electroluminescence light-emitting element; and
an interlayer insulating film between the electroluminescence layer and the thin-film transistor array device,
wherein the thin-film transistor array device includes:
a substrate;
a first line above the substrate;
a second line crossing the first line;
a first transistor above the substrate and including a gate electrode, a first electrode, and a second electrode;
a second transistor above the substrate;
a passivation film between the interlayer insulating film and both the first transistor and the second transistor;
a conductive oxide film below the passivation film; and
a relay electrode above the passivation film, the relay electrode being a relay between a first conductive material in a same layer as the first electrode and a second conductive material in the electroluminescence layer, the relay electrode being electrically connected to the first conductive material via a first hole in the passivation film,
wherein the first transistor and the second transistor are bottom-gate transistors,
the first line is below the passivation film and electrically connected to one of the gate electrode and the first electrode, the first line being in the same layer as the first electrode,
the second line is above the passivation film and electrically connected to an other of the gate electrode and the first electrode, the second line being in a different layer than the first electrode,
a terminal to which an external signal is input is in a periphery of the substrate and in the same layer as the first electrode, the external signal being for driving one of the first line and the second line,
the conductive oxide film covers an end part of an upper surface of the terminal and is between the relay electrode and the first conductive material at least at a bottom of the first hole, the conductive oxide film electrically connecting the relay electrode and the first conductive material, and
the relay electrode is in a same layer as the second line above the passivation film and comprises a same material as the second line.

12. The electroluminescence display panel according to claim 11,
wherein the second conductive material is a metal primarily comprising aluminum.

13. The electroluminescence display panel according to claim 11,
wherein the second conductive material and the relay electrode are connected in a flat region extending along a circumference of an upper part of a second hole in the interlayer insulating film.

14. An electroluminescence display device comprising the electroluminescence display panel according to claim 11.

15. A method of manufacturing a thin-film transistor array device, the thin-film transistor array device being stacked with an electroluminescence layer, with an interlayer insulating film interposed between the electroluminescence layer and the thin-film transistor array device, the method comprising:
preparing a substrate;
forming a first line above the substrate;
forming a first transistor and a second transistor above the substrate, the first transistor including a gate electrode, a first electrode, and a second electrode;
forming a conductive oxide film above the first transistor and the second transistor;
forming a passivation film above the conductive oxide film; and
forming a second line and a relay electrode above the passivation film, the second line crossing the first line, the relay electrode being a relay between a first conductive material in a same layer as the first electrode and a second conductive material in the electroluminescence layer, the relay electrode being electrically connected to the first conductive material via a first hole in the passivation film,
wherein the first transistor and the second transistor are bottom-gate transistors, the first line is below the passivation film and electrically connected to one of the gate electrode and the first electrode, the first line being in the same layer as the first electrode, the second line is above the passivation film and electrically connected to an other of the gate electrode and the first electrode, the second line being in a different layer than the first electrode, the conductive oxide film is formed to cover an upper surface of a terminal in the same layer as the first electrode, an external signal being input to the terminal, the external signal being for driving one of the first line and the second line, the passivation film is formed to expose the upper surface of the terminal that is covered by the conductive oxide film is exposed through an opening in the passivation film, the conductive oxide film is between the relay electrode and the first conductive material at least at a bottom of the first hole to electrically connect the relay electrode and the first conductive material, and the relay electrode is formed in a same layer as the second line above the passivation film and comprises a same material as the second line.

16. The method of manufacturing a thin-film transistor array device according to claim 15,
wherein the second conductive material is a metal primarily comprising aluminum.

17. The method of manufacturing a thin-film transistor array device according to claim 15,
wherein the relay electrode includes a surface that is in contact with the conductive oxide film and comprises a metal that includes at least one of copper, molybdenum, titanium, and tungsten.

18. The method of manufacturing a thin-film transistor array device according to claim 15,
wherein the first transistor and the second transistor each include a crystalline semiconductor layer, and
the gate electrode of the first transistor and a second gate electrode of the second transistor comprise a first metal having higher heat-resistance than a second metal used for the one of the first line and the second line that is electrically connected to the gate electrode of the first transistor.

19. The method of manufacturing a thin-film transistor array device according to claim 15,
wherein the conductive oxide film comprises indium and one of tin and zinc.

20. A method of manufacturing an electroluminescence display panel, comprising:
preparing a substrate;
forming a first line above the substrate;
forming a first transistor and a second transistor above the substrate, the first transistor including a gate electrode, a first electrode, and a second electrode;
forming a conductive oxide film above the first transistor and the second transistor;
forming a passivation film above the conductive oxide film;
forming a second line and a relay electrode above the passivation film, the second line crossing the first line, the relay electrode being electrically connected to the first conductive material, provided in a same layer as the first electrode, via a first hole in the passivation film;
forming an interlayer insulating film above the passivation film;
forming a lower electrode above the interlayer insulating film;
forming a light-emitting function layer above the lower electrode; and
forming an upper electrode above the light-emitting function layer,
wherein the relay electrode is a relay between the first conductive material and a second conductive material formed above the interlayer insulation film,
the first transistor and the second transistor are bottom-gate transistors,
the first line is below the passivation film and electrically connected to one of the gate electrode and the first electrode, the first line being in the same layer as the first electrode,
the second line is above the passivation film and electrically connected to an other of the gate electrode and the first electrode, the second line being in a different layer than the first electrode,
the conductive oxide film is formed to cover an upper surface of a terminal in the same layer as the first electrode, an external signal being input to the terminal, the external signal being for driving one of the first line and the second line,
the passivation film is formed to expose the upper surface of the terminal that is covered by the conductive oxide film is exposed through an opening in the passivation film,
the conductive oxide film is between the relay electrode and the first conductive material at least at a bottom of the first hole to electrically connect the relay electrode and the first conductive material, and
the relay electrode is formed in a same layer as the second line above the passivation film and comprises a same material as the second line.

* * * * *